United States Patent
Tran et al.

(10) Patent No.: US 6,992,937 B2
(45) Date of Patent: Jan. 31, 2006

(54) COLUMN REDUNDANCY FOR DIGITAL MULTILEVEL NONVOLATILE MEMORY

(75) Inventors: Hieu Van Tran, San Jose, CA (US); Sakhawat M. Khan, Los Altos, CA (US); William John Saiki, Mountain View, CA (US); George J. Korsh, Redwood City, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 86 days.

(21) Appl. No.: 10/628,979

(22) Filed: Jul. 28, 2003

(65) Prior Publication Data

US 2005/0024956 A1  Feb. 3, 2005

(51) Int. Cl.
    *G11C 11/00*   (2006.01)
(52) U.S. Cl. ............... 365/200; 365/201; 365/230.06; 365/189.08; 365/191
(58) Field of Classification Search ............... 365/200, 365/201, 230.06, 189.08, 191
See application file for complete search history.

(56) References Cited

U.S. PATENT DOCUMENTS

| | | | | |
|---|---|---|---|---|
| 4,406,013 A | * | 9/1983 | Reese et al. | 377/29 |
| 4,885,720 A | * | 12/1989 | Miller et al. | 365/200 |
| 4,914,632 A | * | 4/1990 | Fujishima et al. | 365/200 |
| 5,268,866 A | * | 12/1993 | Feng et al. | 365/200 |
| 5,623,448 A | * | 4/1997 | Koelling | 365/200 |
| 5,673,227 A | * | 9/1997 | Engles et al. | 365/200 |
| 5,764,587 A | * | 6/1998 | Buettner et al. | 365/230.06 |
| 5,774,396 A | * | 6/1998 | Lee et al. | 365/185.09 |
| 6,002,620 A | * | 12/1999 | Tran et al. | 365/200 |
| 6,201,744 B1 | * | 3/2001 | Takahashi | 365/200 |
| 6,282,145 B1 | | 8/2001 | Tran et al. | |
| 6,314,030 B1 | * | 11/2001 | Keeth | 365/200 |
| 6,442,084 B2 | * | 8/2002 | Keeth | 365/200 |
| 6,536,002 B1 | * | 3/2003 | Kim | 714/710 |

* cited by examiner

*Primary Examiner*—Viet Q. Nguyen
(74) *Attorney, Agent, or Firm*—DLA Piper Rudnick Gray Cary US LLP

(57) ABSTRACT

A digital multilevel bit memory array system comprises regular memory arrays and redundant memory arrays. A regular y-driver corresponds to each memory array to read or write contents to a multilevel bit memory cell and compare the read cell content to reference voltage levels to determine the data stored in the corresponding memory cell. Likewise, similar functions are performed by the redundant y-driver circuit for the redundant memory array. During the verification of the contents of the memory cell, if the read voltage is outside a certain margin requirement for a level of the reference voltage, a signal is generated in real time so that data from the bad y-driver is not output and data from the redundant y-driver corresponding to the redundant memory array is read out. The memory array system may also include a fractional multilevel redundancy.

53 Claims, 29 Drawing Sheets

COLUMN REDUNDANCY FOR DIGITAL MULTILEVEL NONVOLATILE MEMORY

BACKGROUND OF THE INVENTION

The present invention relates to a memory having column redundancy, and more particularly a digital multilevel nonvolatile memory having column or segmented column redundancy.

Memory devices frequently use redundant columns for replacing columns of memory cells that are defective in order to improve manufacturing yield. The selection of the redundant columns is typically done in a test mode at the manufacturing facility. The memory cells are tested and if a column or portion of column is defective, a fuse is set to disable selection of the defective column and enable the redundant column.

SUMMARY OF THE INVENTION

In one aspect of the invention, a memory comprises a first memory array that includes a plurality of memory cells arranged in columns and a redundant memory array that includes a plurality of redundant memory cells. Each of a plurality of y-drivers is coupled to a corresponding column of memory cells to read contents of selected memory cells in the column. A validation circuit tests a voltage level of stored data in the memory cells. Each of a plurality of redundant y-drivers is coupled to a corresponding column of redundant memory cells to read contents of redundant memory cells in the column. A comparison circuit generates a selection signal to enable the redundant memory array and a disable signal to disable a portion of the first memory array in the event of a failure of the testing of the voltage level. The memory may include fractional multilevel redundancy.

DETAILED DESCRIPTION

Figure 1:
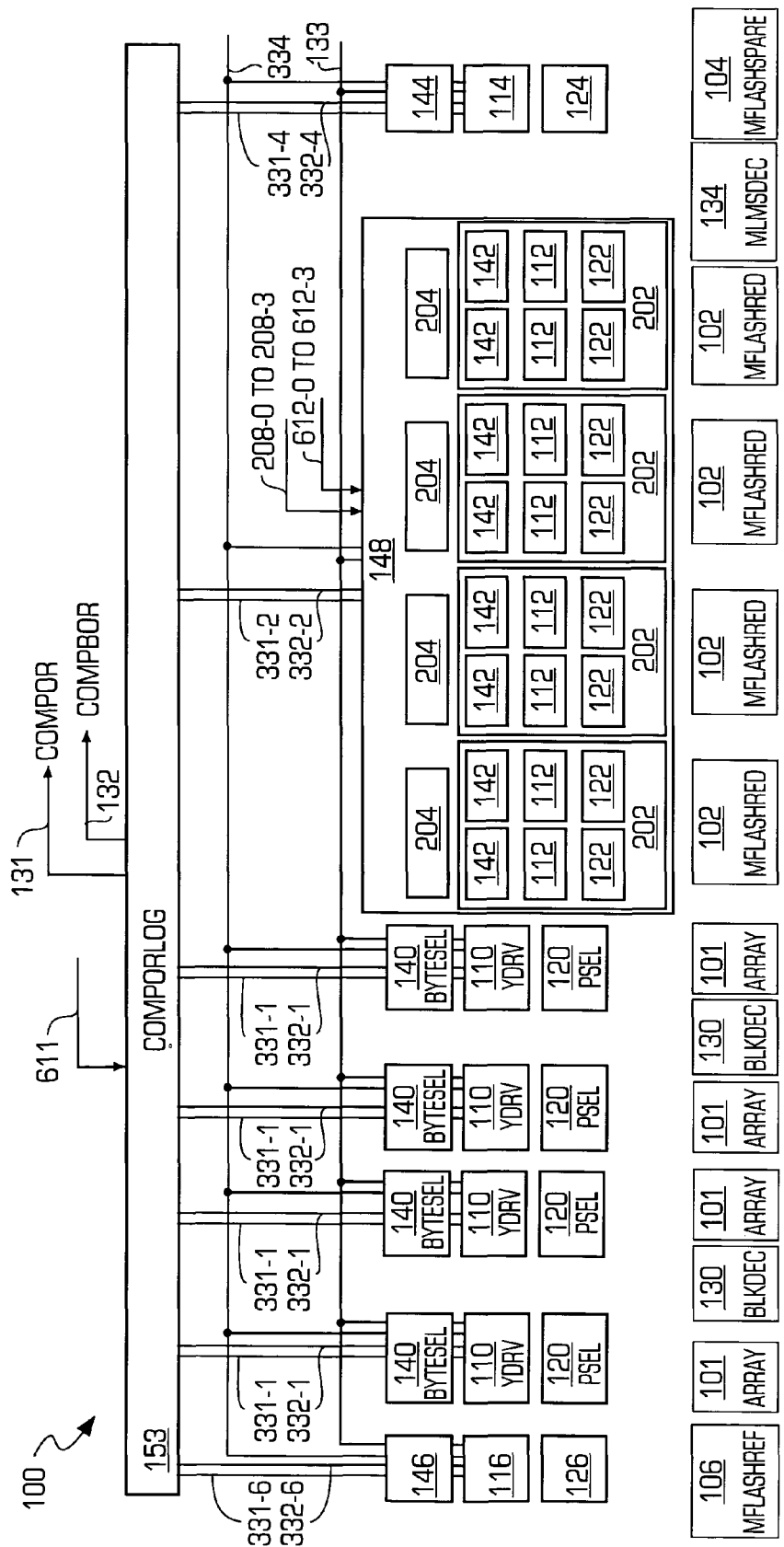
FIG. 1 is a block diagram illustrating a digital multilevel bit memory array system having a redundancy system according to the present invention.
Figure 1A:
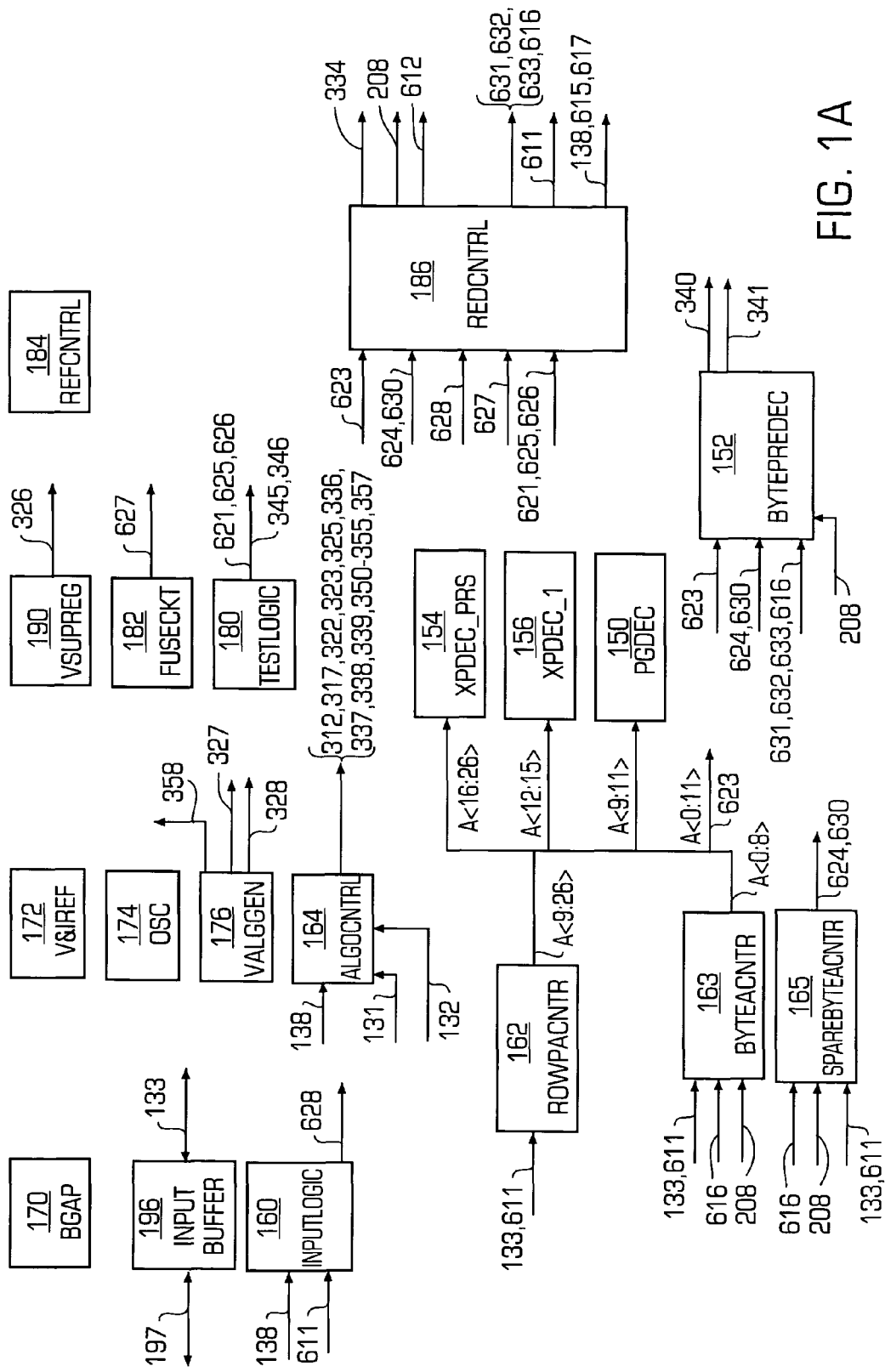
FIG. 1A is a block diagram illustrating circuits of the digital multilevel bit memory array system of FIG. 1.

FIG. 1 is a block diagram illustrating a digital multilevel bit memory array system 100 having a redundancy system. FIG. 1A is a block diagram illustrating control circuits of the digital multilevel bit memory array system 100. For clarity, some signal lines of the memory array system 100 are not shown in FIGS. 1 and 1A, but are shown in other Figures.

For the purpose of illustration, a gigabit nonvolatile multilevel memory system is described. In one embodiment, the memory array includes a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

The digital multilevel bit memory array system 100 includes a plurality of regular memory arrays 101, a plurality of redundant memory arrays (MFLASHRED) 102, a spare array (MFLASHSPARE) 104, and a reference array (MFLASHREF) 106. The system 100 includes a total of, for example for one giga bits, 256 million nonvolatile memory cells for a 4-bit digital multilevel memory cell technology or 128 million nonvolatile memory cells for a 8-bit digital multilevel memory cell technology. An N-bit digital multilevel cell is defined as a memory cell capable of storing $2^N$ levels.

In one embodiment, the memory array system 100 stores one gigabits of digital data with 4-bit multilevel cells, and the regular memory arrays 101 are equivalently organized as 8,192 columns and 32,768 rows. Addresses A<12:26> are used to select a row, and addresses A<0:11> are used to select two columns for one byte. A page is defined as a group of 512 bytes corresponding to 1,024 columns or cells on a selected row. A page is selected by the A<9:11> address. A row is defined here as including 8 pages. A byte within a selected page is selected by the address A<0:8>. Further, for each page of 512 regular data bytes, there are 16 spare bytes that are selected by the address A<0:3>, which are enabled by other control signals to access the spare array and not the regular array as is normally the case. Other organizations are possible such as a page including 1024 bytes or a row including 16 or 32 pages.

The reference array (MFLASHREF) 106 is used for a reference system of reference voltage levels to verify the contents of the regular memory array 101.

The redundancy array (MFLASHRED) 102 is used to increase production yield by replacing bad portions of the regular memory array 101. The use of page mode operation (described in more detail below) and serial style address input improve the memory system described herein for media type data storage applications. Such memory applications typically use separate controller chips to manage the data storage in many ways similar to the chips used for rotating media data storage but with better system mechanical robustness and lower power consumption. The controller chip can typically work around defects that are page oriented. For instance, if an entire row of memory is defective, the controller chip can store the addresses of the 8 bad sequential pages that make up that bad row and prevent them from ever being used. The bad addresses are "mapped out" of the usable address space. One bad row out of 32,768 total rows represents a small amount of memory loss that is easily worked around. The bad page addresses can be supplied to the controller; as a separate data file during system manufacture, determined by interrogating the memory chip during system power up, or determined on the fly by system behavior in the field. Random single cell defects can be repaired in the same way at the system hierarchy by mapping out bad bytes, pages or rows. However, column related defects have much greater impact and are harder to work around. For instance, one bad column spans all 32768 rows and would map out 32768 bad bytes out of (8×512×32768) total bytes or 1/4096th of the memory. That is 8 times worse than a row defect in terms of memory loss and uses complicated (slower) algorithmic address generation instead of simple look-up tables for the controller to handle the address mapping. Thus, on memory chip column redundancy is very desirable. The redundancy array 102 accomplishes the desired column redundancy as described below. For the purpose of illustration, the redundancy array 102 includes 4 subarrays, but other numbers of subarrays may be used.

The spare array (MFLASHSPARE) 104 can be used for extra data overhead storage such as for error correction and/or memory management (e.g., status of a selected block of memory being erased or programmed, number of erase and program cycles used by a selected block, or number of bad bits in a selected block). In another embodiment, the digital multilevel bit memory array system 100 does not include the spare array 104.

The digital multilevel bit memory array system 100 further includes a plurality of y-driver circuits 110, a plurality of redundant y-driver circuits (RYDRV) 112, a spare y-driver circuit (SYDRV) 114, and a reference y-driver (REFYDRV) circuit 116.

The y-driver circuit (YDRV) 110 controls bit lines (also known as columns, not shown in FIG. 1) during write, read, and erase operations. Each y-driver (YDRV) 110 controls one bitline at a time. A y-driver circuit 300 (shown in FIG. 3) comprises a pair of y-drivers (YDRV) 110 that are used to control a pair of columns. Time multiplexing may be used so that each y-driver 110 controls multiple bit lines during each write, read, and erase operation. The y-driver circuits (YDRV) 110 are used for parallel multilevel page writing and reading to speed up the data rate during write to and read from the regular memory array 101. In one embodiment, for a 512-byte page with 4-bit multilevel cells, there are a total of 1024 y-drivers 110 or a total of 512 y-drivers 300. A y-driver 300 is used for one byte of data; hence within a page, byte addressing is referred to interchangeably as y-driver addressing.

The reference y-driver circuit (REFYDRV) 116 is used for the reference array (MFLASHREF) 106. In one embodiment, for a 4-bit multilevel cell, there are a total of 15 or 16 reference y-drivers 116. The function of the reference y-driver 116 is similar to that of the y-driver circuit 110 with many functions possibly not used such as those associated with data latches (described in more detail below in conjunction with FIG. 4).

The redundant y-driver circuit (RYDRV) 112 is used for the redundant array (MFLASHRED) 102. The function of redundant y-driver circuit (RYDRV) 112 is similar to that of the y-driver circuit (YRDRV) 110. In one embodiment, for redundancy described herein, there are a total of eight redundant y-drivers 112 to fix up to eight "bad" columns (4 bytes) at a time during write, read, and erase operation. The reason is as follows. Due to page mode operation, all y-drivers including all the redundant y-drivers 112 operate at the same time on a selected page (unless time multiplexing is used), and because there are eight redundant y-drivers, only eight possible redundant columns can be used at a time (per selected page). Because two columns are used to access one byte, this is equivalent to fixing up to 4 bad bytes per page. Because an address match operation using the byte and page addresses is true (described in detail below) for the redundancy to operate, up to 4 bad bytes per page can be repaired. Thus, the most redundancy that is applied per page is up to 8 columns or 4 bytes, whichever limitation occurs first. If, for example, defects are random single cell type and are located on separate bytes, then 4 bytes per page are the more likely occurring redundancy limitation. In that case, only 4 single cell defects on the same page are fixed unless other defective cells happen to be on one of the other 4 columns in the same 4 bytes. Note that although only 4 defective cells were fixed, 8 redundant columns replace 8 columns per page in the combined arrays 101 and 104. Because row addresses are not used in the address matching operation, if a certain byte in a selected page on a selected row is bad, the system 100 considers that same byte and page address as bad for all other rows as well. The amount of random single cell type defects repairable for the entire chip is thus limited to 4×8=32 defects in this example. If some randomly defective cells are located on the same column or on columns addressed by the same byte, the total number repairable increases. More than 8 columns may be fixed at a time by increasing the number of redundant y-drivers at expense of more circuits for additional redundant y-drivers, additional redundant array (coupled to additional redundant y-drivers) and additional fuses associated with additional redundant columns). The trade-off is additional area versus increased yield due to additional redundancy. The redundancy is described in more detail below in conjunction with FIGS. 2, 3, and 6.

The spare y-driver circuit (SYDRV) 114 includes a plurality of single spare y-drivers (SYDRV) 114 used for the spare array (MFLASHSPARE) 104. The function of the spare y-driver circuit (SYDRV) 114 is similar to the function of the y-driver circuit (YDRV) 110. In one embodiment, for a 512-byte page with 4-bit multilevel cells with 16 spare bytes, there are a total of 32 spare y-drivers 114.

The digital multilevel bit memory array system 100 further includes a plurality of page select (PSEL) circuits 120, a redundant page select circuit 122, a spare page select circuit 124, a reference page select circuit 126, a plurality of block decoders (BLKDEC) 130, a multilevel memory precision spare decoder (MLMSDEC) 134, a byte select circuit (BYTESEL) 140, a plurality of redundant byte select circuits 142, a spare byte select circuit 144, and a reference byte select circuit 146, and as shown in FIG. 1A, also includes a page address decoder (PGDEC) 150, a byte address predecoder (BYTEPREDEC) 152, an address pre-decoding circuit (XPDEC_PRS) 154, and an address pre-decoding circuit (XPDEC_1) 156. The digital multilevel bit memory array system 100 further includes a redundant driver circuit 148 (FIG. 1) that comprises the redundant y-driver circuits 202 and redundant compare-OR selection circuits 204. The redundant y-driver circuit 202 comprises the redundant y-driver circuit 112, the redundant page select circuit 122 and the redundant byte select circuit 142. The redundant driver circuit 148 is described below in conjunction with FIG. 2.

The page select circuit (PSEL) 120 selects one bit line 319 (see FIG. 3) out of multiple bitlines 343 (see FIG. 3) for each single y-driver (YDRV) 110. In one embodiment, the number of multiple bitlines 343 connected to a single y-driver (YDRV) 110 is equal to the number of pages. The corresponding select circuits for the reference array 106, the redundant memory array 102, and the spare memory array 104 are the reference page select circuit 126, the redundant page select circuit 122, and the spare page select circuit 124, respectively.

The byte select circuit (BYTESEL) 140 enables one byte data in or one byte data out of a pair of the y-driver circuits (YDRV) 110 at a time, which is described below in conjunction with FIG. 3. The corresponding byte select circuits for the reference array 106, the redundant memory array 102, and the spare memory array 104 are the reference byte select circuit 146, the redundant byte select circuit 142, and the spare byte select circuit 144, respectively.

The block decoder (BLKDEC) 130 selects a row or a block of rows in the arrays 101 and 102 based on the signals from the row page address counter 162 (described below) and provides precise multilevel bias values over temperature, process, and power supply used for consistent multilevel memory operation for the regular memory array 101 and the redundant memory array 102. The multilevel memory precision spare decoder (MLMSDEC) 134 selects a spare row or block of spare rows in the spare array 104 and provides precise multilevel bias values over temperature, process corners, and power supply used for consistent multilevel memory operation for the spare array 104. The intersection of a row and column selects a cell in the memory array. The intersection of a row and two columns selects a byte in the memory array.

The digital multilevel bit memory array system 100 further comprises a compare-OR logic (COMPORLOG) circuit 153 that outputs a compare-OR (COMPOR) 131 signal and an inverted compare-OR (COMPBOR) 132 signal. The y-driver circuit 110 generates a compare-OR (COMPOR) signal 331-1 (also see FIG. 3) or an inverted compare-OR (COMPBOR) signal 332-1 (also see FIG. 3) to set a margin of the upper and lower ends of a memory cell operating voltage range. A margin defines the desired difference in voltage or current between a memory cell output and a reference value. During a read, a write or an erase operation, all the y-drivers operate simultaneously and independently of one another in page mode operation. The compare-OR (COMPOR) 131 and the inverted compare-OR (COMPBOR) 132 signals indicate to the system whether all the y-drivers have successfully accomplished the read, write or erase operation. The redundant y-driver circuit 112, the spare y-driver circuit 114, and the reference y-driver 116 generate a compare-OR (COMPOR) signal 331-2, 331-4, and 331-6, respectively, or an inverted compare-OR (COMPBOR) signal 332-2, 332-4, and 332-6, respectively, in a manner similar to the y-driver circuit 110. (It should be noted that the circuit of FIG. 3 corresponds to the y-driver circuit 110, but functions similar to the y-driver circuits 112, 114, and 116. The signals 331 and 332 are shown without dash number in FIG. 3.) The compare-OR logic circuit 153 generates the compare-OR signal 131 in response to the compare-OR (COMPOR) signals 331-1, 331-2, 331-4, and 331-6. The compare-OR logic circuit 153 generates the inverted compare-OR (COMPBOR) signal 132 in response to the inverted compare-OR (COMPBOR) signals 332-1, 332-2, 332-4, and 332-6.

An input/output bus 133 is coupled to the y-driver circuits 110, 112, 114 and 116 to provide data in and data out of the corresponding arrays 101, 102, 104 and 106. The input/output bus 133 is coupled to the input data (IN) 310 and the output data (DOUT) 311, which are described below in conjunction with FIG. 3.

The address pre-decoding circuit (XPDEC_PRS) 154 decodes addresses. In one embodiment, the addresses are A<16:26> to select a block of memory array with one block comprising 16 rows. The outputs of the address pre-decoding circuit (XPDEC_PRS) 154 are coupled to the block decoder (BLKDEC) 130 and the spare decoder (MLMSDEC) 134. The address pre-decoding circuit (XPDEC_1) 156 decodes addresses. In one embodiment, the addresses are addresses A<12:15> to select one row out of sixteen within a selected block. The outputs of address pre-decoding circuit 156 also couple to the block decoder (BLKDEC) 130 and the spare decoder (MLMSDEC) 134.

The page address decoder (PGDEC) 150 decodes page addresses, such as A<9:11>, to select a page, e.g., P<0:7>, and provides its outputs to the page select circuits 120, 122, 124, and 126. The byte address predecoder (BYTEPREDEC) 152 decodes byte addresses, such as A<0:8>, and provides its outputs to the byte select circuit (BYTESEL) 140 to select a byte. The byte predecoder 152 also decodes spare byte address, such as A<0:3> and AEXT, and provides its outputs to the spare byte select circuit 144 to select a spare byte. A spare byte address control signal AEXT is used together with A<0:3> to decode addresses for the spare array 104 instead of the regular array 101. A redundancy controller 186 provides control signals to the redundant byte select 142 to select a redundant byte as described below in conjunction with FIGS. 3 and 6.

The digital multilevel bit memory array system 100 further includes a row page address counter (ROWPACNTR) 162, a byte address counter (BYTEACNTR) 163, and a spare byte address counter (SPAREBYTEACNTR) 165. The row page address counter (ROWPACNTR) 162 provides addresses, such as A<9:11>, to the page decoder (PGDEC) 150. The byte address counter (BYTECNTR) 163 provides byte addresses (e.g., A<0:8>) to the byte pre-decoder 152. The byte spare address counter (SPAREBYTECNTR) 165 also provides spare byte addresses, such as AEXT, to the byte pre-decoder 152. The row page address counter 162 also provides addresses, such as A<12:26>, to the address pre-decoding circuit 154 and the address pre-decoding circuit 156 for row address selection. The inputs of the address counters 162, 163, and 165 are coupled to the output of the input interface logic circuit (INPUTLOGIC) 160.

The digital multilevel bit memory array system 100 further includes an input interface logic circuit (INPUTLOGIC) 160, an algorithm controller (ALGOCNTRL) 164, a voltage and current bias generator (V&IREF) 172, a precision oscillator (OSC) 174, a voltage algorithm controller (VALGGEN) 176, a test logic circuit (TESTLOGIC) 180, a fuse circuit (FUSECKT) 182, a reference control circuit (REFCNTRL) 184, a redundancy controller (REDCNTRL) 186, voltage supply and regulator (VSUPREG) 190, and an input buffer 196.

The input interface logic circuit (INPUTLOGIC) 160 provides an external interface to external systems, such as an external system microcontroller. Typical external interface for memory operations are read, write, erase, status read, identification (ID) read, ready busy status, reset, and other general purpose tasks. A serial interface can be used for the input interface to reduce pin counts for a high-density chip due to a large number of addresses. Control signals (not shown) couple the input interface logic circuit (INPUTLOGIC) 160 to the external system microcontroller. The input interface logic circuit (INPUTLOGIC) 160 includes a status register that indicates the status of the memory chip operation such as pass or fail in program or erase, ready or busy, write protected or unprotected, cell margin good or bad, restore or no restore, and the like.

The algorithm controller (ALGOCNTRL) 164 is used to handshake the input commands from the input logic circuit (INPUTLOGIC) 160 and to execute the multilevel erase, programming and sensing algorithms used for multilevel nonvolatile operation. The algorithm controller (ALGOCNTRL) 164 is also used to algorithmically control the precise bias and timing conditions used for multilevel precision programming. The (COMPOR) 131 and (COMPBOR) 132 signals generated from the (COMPORLOG) circuit 153 are coupled as inputs to the algorithm controller (ALGOCNTRL) 164.

The test logic circuit (TESTLOGIC) 180 tests various electrical features of the digital circuits, analog circuits, memory circuits, high voltage circuits, and memory array. The inputs of the test logic circuit (TESTLOGIC) 180 are coupled from the outputs of the input interface logic circuit (INPUTLOGIC) 160. The test logic circuit (TESTLOGIC) 180 also provides timing speed-up in production testing such as in faster write/read and mass modes. The test logic circuit (TESTLOGIC) 180 also provides screening tests associated with memory technology such as various disturb and reliability tests. The test logic circuit (TESTLOGIC) 180 also allows an off-chip memory tester to directly take over the control of various on-chip logic and circuit bias circuits to provide various external voltages and currents and external timing. This feature permits, for example, screening with external voltage and external timing or permits accelerated production testing with fast external timing.

The fuse circuit (FUSECKT) 182 is a set of nonvolatile memory cells configured at the external system hierarchy, at the tester, at the user, or on chip on-the-fly to achieve various settings. These settings can include precision bias values, precision on-chip oscillator frequency, programmable logic features such as write-lockout feature for portions of an array, redundancy fuses, multilevel erase, program and read algorithm parameters, or chip performance parameters such as write or read speed and accuracy.

The reference control circuit (REFCNTRL) 184 is used to provide precision reference levels for precision voltage values used for multilevel programming and sensing. The redundancy controller (REDCNTRL) 186 provides redundancy control logic and is described below in conjunction with FIGS. 6–22.

The voltage algorithm controller (VALGGEN) 176 provides various specifically shaped voltage signals of amplitude and duration used for multilevel nonvolatile operation and to provide precise voltage values with tight tolerance, used for precision multilevel programming, erasing, and sensing. A bandgap voltage generator (BGAP) 170 provides a precise voltage value over process, temperature, and supply for multilevel programming and sensing.

The voltage and current bias generator (V&IREF) 172 is a programmable bias generator. The bias values are programmable by the settings of control signals from the fuse circuit (FUSECKT) 182 and also by various metal options. The oscillator (OSC) 174 is used to provide accurate timing for multilevel programming and sensing.

The input buffer 196 provides buffers for input/output with the memory array system 100. The input buffer 196 buffers an input/output line 197 coupled to an external circuit or system and the input/output bus 133, which couples to the arrays 101, 102, 104, and 106 through the y-drivers 110, 112, 114, and 116, respectively. As noted above, the input/output bus 133 is coupled to the output data 311 and the input data 310 of the y-driver (see FIGS. 1, 2, and 3). In one embodiment, the input buffer 196 includes TTL input buffers or CMOS input buffers. In one embodiment, the input buffer 196 includes an output buffer with slew rate control or an output buffer with value feedback control.

The voltage supply and regulator (VSUPREG) 190 provides regulated voltage values above or below the external power supply used for erase, program, read, and production tests. In one embodiment, the voltage supply and regulator (VSUPREG) 190 includes a charge pump.

An overview of the system operation with redundancy is described. The system 100 is capable of parallel operation, e.g., the system 100 operates on multiple bytes, hence cells, at the same times for data in loading, erase, program, and read. In some parallel operations, a page of bytes are operated on simultaneously using addresses A<9:11> to select one page out of eight pages in a selected row in a page mode operation. The system is also capable of byte operation using single byte data in loading, program, and read. In this case, byte addressing is used, e.g., addresses A<0:8>, to select a byte out of 512 bytes in a selected page. The system 100 is also capable of row or block (sector) operation such as in multiple page erase. In this case row or block addressing is used, e.g., addresses A<12:26> to select a row or A<16:26> to select a block of 16 rows. The system 100 communicates with an external controller typically with a byte by byte (serial) protocol. Further details of the system operation using redundancy are described below.

An erase operation may be done to erase all selected multilevel cells by removing the charge on selected memory cells according to the operating requirements of the non-volatile memory technology used. The erase operation begins with an erase command coupled to the input logic 160. After the erase command is validated by the input logic 160, addresses, such as A<12:26> for row erase or A<16:26> for block erase, appearing on the input/output bus 133 are then latched in the address counter 162. An internal erase-then-verify operation is then executed by the algorithm controller 164 to remove the charge on the memory cells in the selected row. The verification operation with a compare-OR and/or inverted compare-OR is done to monitor if all or any cells fail the erase operation or operate with an insufficient margin. The compare-OR and inverted compare-OR function are monitored separately for the regular arrays 101, the reference array 106, the spare array 104, and the redundant arrays 102. Appropriate flags are set by the algorithm controller 164 to indicate the result of the erase operation. The handling of redundancy in erasing and verification (including the compare-OR and/or inverted compare-OR function, which will be sometimes referred to simply as the compare-OR function) is described in more detail below. The erase operation is described in more detail below in conjunction with FIGS. 6 and 25.

Figure 8:
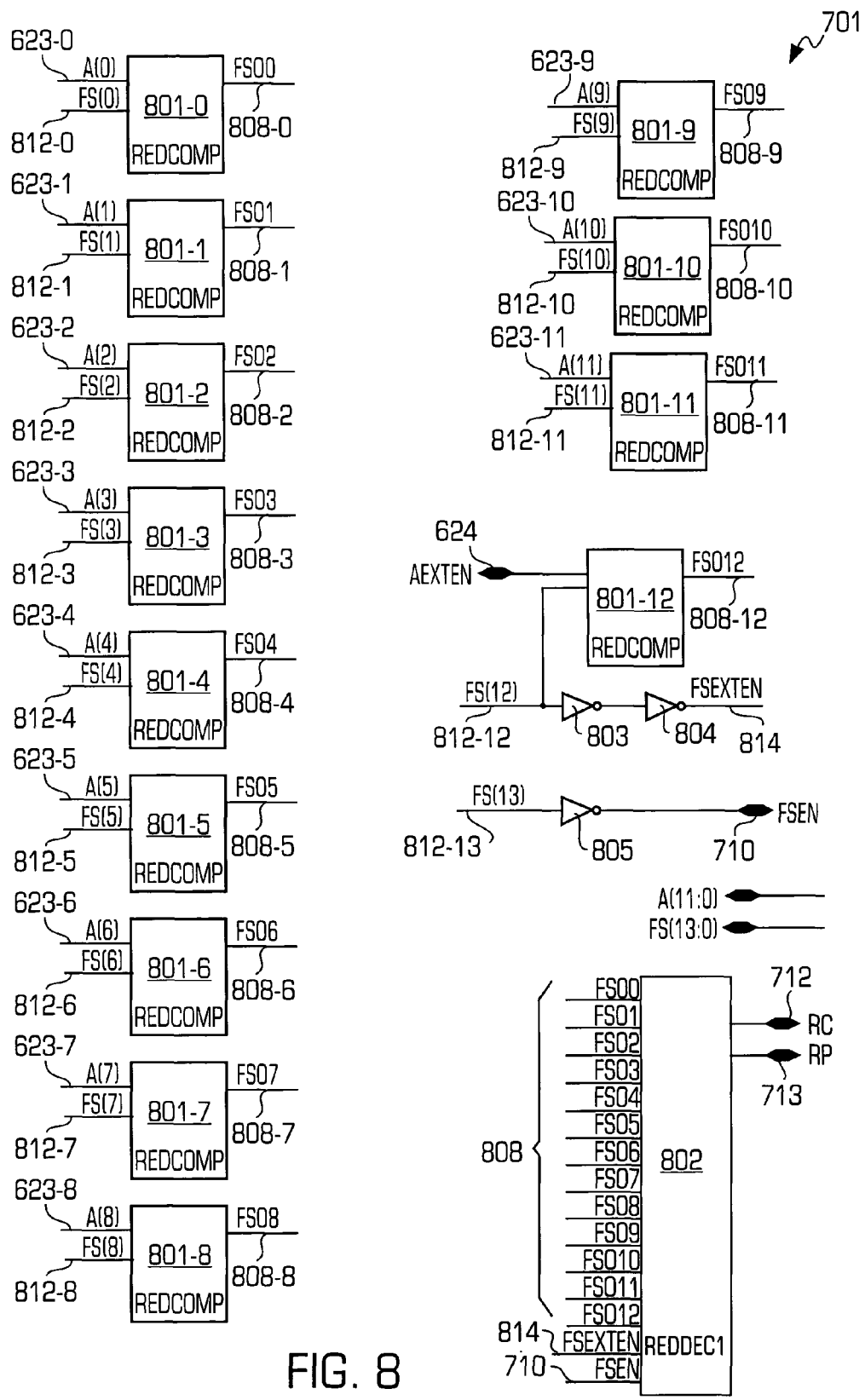
FIG. 8 is a block diagram illustrating a fuse redundancy decoder of the redundancy decoder of FIG. 7.

A data load operation may be used to load in the multiple bytes of data to be programmed into the memory cells, e.g., 512 bytes in a page. Loading of data in begins with a data load command through the input logic 160. After the command is validated by the input logic 160, addresses, e.g., A<0:8> (for byte) and A<9:11> (for page) and A<12:26> (for row), and data appear on the input/output bus 133. Addresses are then latched by the address counters 163, 165 and 162 and decoded by the byte pre-decoder 152, page decoder 150, and address pre-decoders 154 and 156. The input logic 160 then outputs various control signals to select the data latches located inside the y-drivers 110, 114 to latch in the data. The selection of appropriate data latches is done by decoding the addresses, e.g., A<0:8>, by the byte pre-decoder 152 and the byte select circuits 140 and 144. As described below in conjunction with the redundancy controller 186 in FIG. 6 and with the flow operation in FIG. 23, the data in may be multiplexed into the redundant y-drivers 112 by the redundancy controller 186 if an address match operation is true by enabling the redundant byte select circuit 142. The redundancy controller 186 executes an address match operation to compare a currently used address coupled on the input/output bus 133 to a "bad" stored fuse address that is stored in a redundant address fuse set in the fuse circuit (FUSECKT) 182. A redundant address fuse set represents a set of multiple fuses used to store a byte/page address corresponding to a bad column or pair of bad columns within the same byte. For example, as shown in FIG. 8, fuse addresses (FS<0: 13>) 812 comprise FS<0:11> corresponding to addresses (A<0:11>) 623, FS<12> corresponding to address extension enable (AEXTEN) 624, which enables redundancy repair of the spare array as described below in more detail in conjunction with FIG. 6, FS<13> corresponding to fuse state (FSEN) 710, which is a fuse state enable to enable the fuse set. Henceforth, a bad byte/page address is referred to interchangeably as a column address or simply as a redundant column when in fact actually two columns associated with the bad byte/page address are being discussed. The data load operation is described in more detail below in conjunction with FIGS. 6 and 23.

A read operation may be done to read out in parallel the data (digital bits), e.g., 512 bytes within a page, stored in the multilevel cells. The read operation begins with a read command coupled to the input logic 160. After the read command is validated by the input logic 160, addresses, such as A<0:8> (for byte) and A<9:11> (for page) and A<12:26> (for row), appearing on the input/output bus 133 are then latched by the address counters such as circuits 162, 163 and/or 165. An internal binary search sensing operation, operating on the selected page, is then executed by the algorithm controller 164 to decode the digital data bits stored in the multilevel cells in the selected page and latch them in data latches in the y-drivers 110, 112, and 114. A restore operation with compare-OR and/or inverted compare-OR function is executed by the algorithm controller 164 to ensure the selected cells are still within a certain operating range. The compare-OR function refers to the OR-ing function results of comparing the memory cell output to the desired states of multiple cells in parallel. The compare-OR and inverted compare-OR function are monitored separately for the regular arrays 101, the reference array 106, the spare array 104, and the redundant arrays 102. Appropriate flags are set by the algorithm controller 164 to indicate the result of the restore operation. The handling of redundancy in a restore function (especially the compare-OR and/or inverted compare-OR function) is described below. A data out operation may then be initiated to shift out serially the latched data. The redundancy controller 186 executes an address match operation to compare a currently used column address coupled on the input/output buffer 133 to a "bad" stored fuse address. A byte of data from a redundant column is multiplexed out instead of from a regular column if an address match comparison is true. The redundancy controller 186 controls the multiplexing of the data. The read operation is described in more detail in conjunction with FIGS. 6 and 26.

A program operation may be done to store in parallel the data in (digital bits) into the multilevel cells by placing an appropriate charge on selected multilevel cells depending on the operating requirements of the non-volatile memory technology used. The program operation begins with a program command coupled to the input logic 160. The program command is typically done after the data in loading that loaded data in a page, e.g., 512 bytes in a page. After the program command is validated by the input logic 160, an internal incremental verify then program operation is executed by the algorithm controller 164 to accurately place desired charges on the selected memory cells in the selected page. The verification operation with the compare-OR and/or inverted compare-OR is done to monitor if all or any cell fail the program operation or operate with an insufficient margin. The compare-OR and inverted compare-OR function are monitored separately for the regular arrays 101, the reference array 106, the spare array 104, and the redundant arrays 102. Appropriate flags are set by the algorithm controller 164 to indicate the result of the program operation. The handling of redundancy in programming and verification (including the compare-OR and/or inverted compare-OR function) is described below. The program operation is described in more detail below in conjunction with FIGS. 6 and 24.

Figure 2:
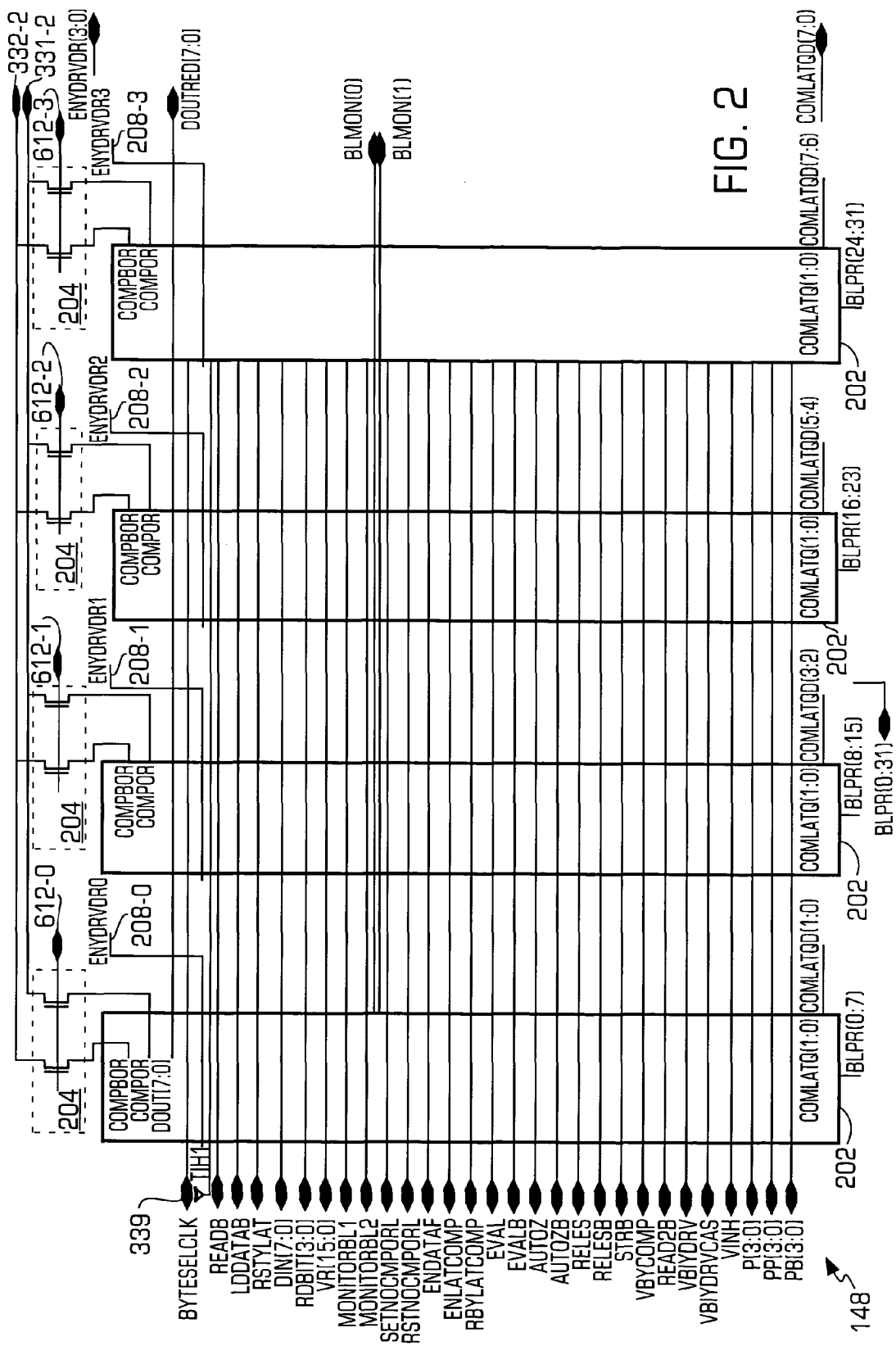
FIG. 2 is a block diagram illustrating a redundant driver circuit of the digital multilevel bit high density array system of FIG. 1.

FIG. 2 is a block diagram illustrating the redundant driver circuit 148. As described above in one embodiment, eight redundant y-drivers 112, described below, fix up to 8 bad columns for the regular arrays 101 and spare arrays 104 at a time, such as during a page write and read operation. Redundancy repair for the spare arrays 104 instead of the regular array 101 is enabled by an enable extension fuse, FS<12> in FIG. 8, associated with an address extension (AEXTEN) signal 624 as described below in conjunction with FIG. 6 and its sub-blocks. It is possible to fix more than 8 bad columns during a write or read operation by using time multiplexing for the redundant y-drivers.

The redundant driver circuit 148 comprises a plurality of redundant y-driver circuits 202 and a plurality of redundant compare-OR selection circuits 204, which couple the compare-OR function of redundant y-drivers to the system compare-OR logic (the compare-OR logic circuit 153 (FIG. 1)). The redundant y-driver circuit 202 comprises the redundant y-driver 112, the redundant page select circuit 122, and the redundant byte select circuit 142 (shown in FIG. 3). The compare-OR selection circuits 204 are enabled by redundant page y-driver enable signals 612-0 through 612-3 from the redundancy controller 186. As shown, there are four redundant y-driver circuits 202, which are selected by redundant y-driver enable signals 208-0 through 208-3 from the redundancy controller 186.

The redundant y-driver enable signals 208-0 through 208-3 are used to select the redundant y-driver 202 and the redundant page y-driver enable signals 612-0 through 612-3 are used to select the redundant compare-OR for the following reason. Recall, the column addressing architecture described in this embodiment allows access by page or byte. Because the smallest addressing granularity for column access is by byte, column replacement for redundancy is also done by byte. Single column access, although providing better memory utilization, comes at the price of additional decoding and control logic, which complicates the design. Thus, each redundant y-driver 202 operates on two columns with the same byte address (two columns to access one selected byte for a 4-bit multilevel cell at a time) because each circuit 202 includes a pair of y-drivers 110 (further description below in conjunction with FIG. 3). Column address comparison is used to detect whether the selected column is bad. The column address comparison results in the redundant y-driver enable signals 208-0 through 208-3 being forced active or inactive depending on address matching as described below in conjunction with FIG. 6. However, unlike the byte and page address comparison used to generate redundant y-driver enable signals 208-0 through 208-3, only the page addresses are used in the address comparison to generate the redundant page y-driver enable signals 612-0 through 612-3. This is because the compare-OR functions of all the y-drivers 202 are monitored at the same time (in page mode). The compare-OR functions to monitor the result of memory cell verification versus a desired reference value such as in erase, program, or read (as described in more detail below in conjunction with FIGS. 23–26). Page address comparison causes the redundant page y-driver enable signals 612-0 through 612-3 to be forced active or inactive depending on page address matching as described below in conjunction with FIG. 6. Page address and not byte comparison is used because all y-drivers operate by page mode operation, (e.g., page addressing is used for all the y-drivers including the redundant y-drivers simultaneously). For clarity, other signal lines of FIG. 2 are not numbered but are described below in conjunction with FIGS. 3 and 4.

Although there are a total of eight y-driver arrangements comprising 142, 112, and 122 as shown in FIG. 2, other numbers of y-drivers may be used, such as one, three or seven. For example, an odd number of y-drivers is used for nibble instead of byte operation, because one byte (8 digital bits) corresponds to two 4-bit multilevel cells and one nibble (4 digital bits) corresponds to one 4-bit multilevel cell.

Figure 3:
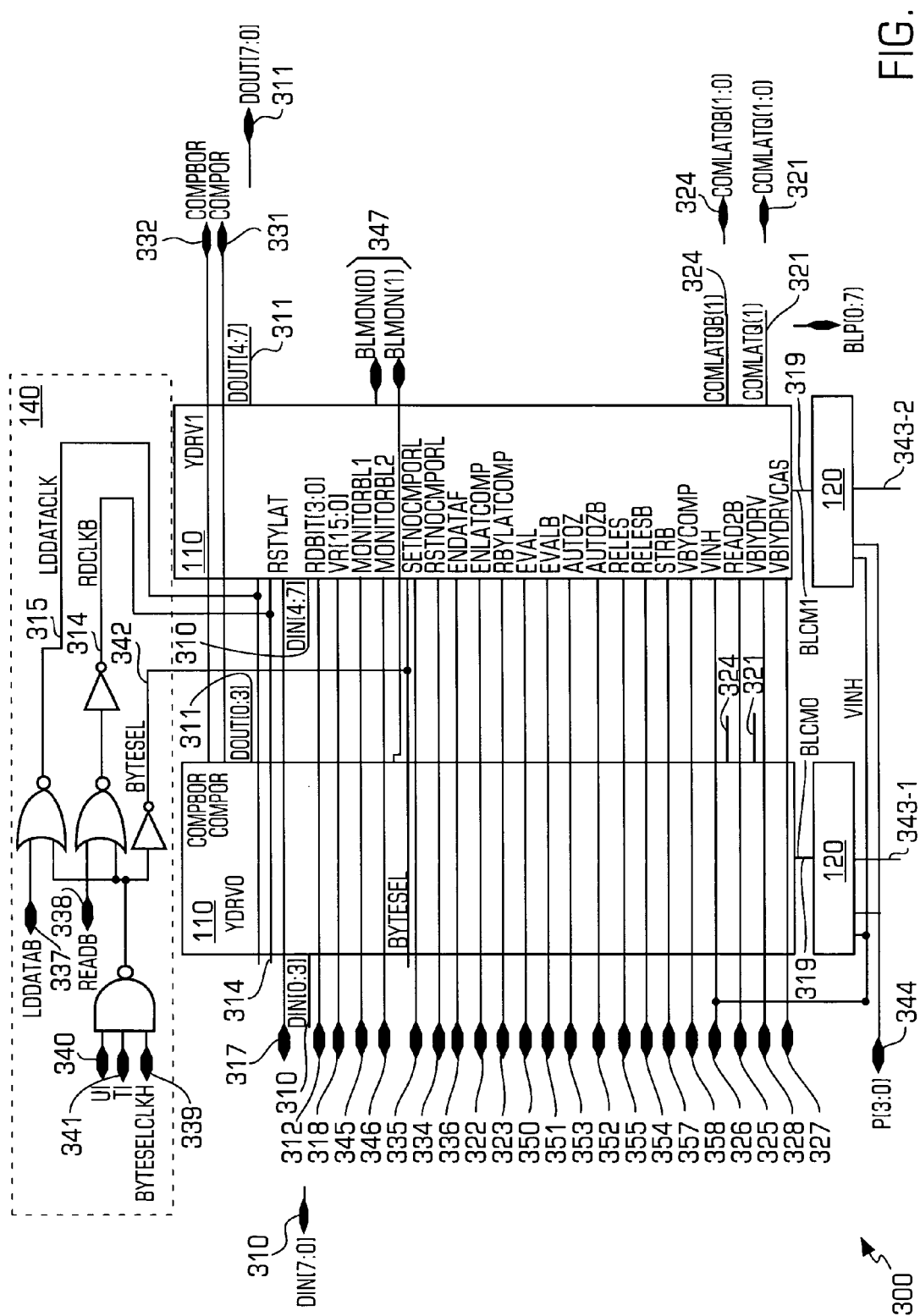
FIG. 3 is a circuit diagram illustrating a y-driver circuit that includes a pair of y-drivers of the digital multilevel bit high density array system of FIG. 1.

FIG. 3 is a schematic diagram illustrating the y-driver circuit 300. For the embodiment described herein, the y-driver 300 for the regular memory arrays is the same as the redundant y-driver circuit 202 for the redundant memory arrays in FIGS. 1 and 2 with the exception of the redundant y-driver enable signal 208, which is not used in the y-driver 300.

The y-driver circuit 300 comprises a pair of y-driver circuits 110 (same as redundant y-driver circuit 112), a pair of page select circuits 120 (same as redundant page select circuit 122), and a byte select circuit 140 (same as redundant byte select circuit 142). Only one instead of two byte select circuits 140 is shown because in this embodiment, it is shared between the two y-drivers 110. The byte select circuit 140 enables one byte of data in or one byte of data out of a pair of y-driver circuits 110 at a time. In this embodiment, the byte select circuit 140 is embedded in the y-driver circuit 300. In another embodiment, the byte select circuit 140 is separate from the y-driver circuit 300.

The y-driver circuit 300 is described for columns of memory cells in the array, but the memory arrays may be arranged in other configurations. In one embodiment, the memory array 101 may be arranged in segments with columns of memory cells, and the defective portions of the column segments are replaced by portions of the redundant memory array 102. In another embodiment, the memory array 101 may be arranged in row or column segments, and the defective segments are replaced by portions of the redundant memory array 102.

The byte select circuit 140 comprises selection logic including a NAND gate, NOR gates and inverters for generating an inverted read clock (RDCLKB) 314, a load data clock (LDDATACLK) 315, and a byte select (BYTESEL) signal 342 in response to a load data (LDDATAB) signal 337, a read (READB) signal 338, a byte select (BYTESELCLKH) clock 339, a first pre-decoded byte decoding signal (UI) 340, and a second pre-decoded byte decoding signal (TI) 341. The signals 337, 338, and 339 are provided from the algorithm controller 164. The byte decoding signals 340 and 341 are provided from the byte pre-decoder 152.

The page select circuits 120 provide data from the regular memory array 101 via a plurality of bit lines 343 to a bit line 319 for application to the corresponding y-driver circuit 110. The selection of the bit line 343 is controlled by the select signals 344 from the corresponding page decoder 150. An inhibit voltage line (VINH) 326 supplied from the voltage supply and regulator (VSUPREG) 190 provides an inhibit voltage to the unselected bit lines 343. The bit lines 343 are provided from the regular memory array 101 through the page select circuit 120. As noted above, the y-driver circuit 110 of FIGS. 3 and 4 is similar to the spare y-driver 114, the redundant y-driver 112 and the reference y-driver circuit 116. For the y-driver circuits 112, 114, and 116, the bit lines 343 pass from the respective redundant memory array 102, spare memory array 104, and reference memory array 106 through the respective redundant page select circuit 122, the spare page select circuit 124 and the reference page select circuit 126.

The input data 310 and the output data 311 are responsive to the clock signals (LDDATACLK) 315 and (RDCLKB) 314 from the byte select circuit (BYTESEL) 140, the redundant byte select circuit 142, the spare byte select circuit 144, and the reference byte select circuit 146 to the y-driver circuit 110, the redundant y-driver (RYDRV) circuit 112, the spare y-driver (SYDRV) circuit 114, and the reference y-driver circuit 116, respectively.

Figure 4:
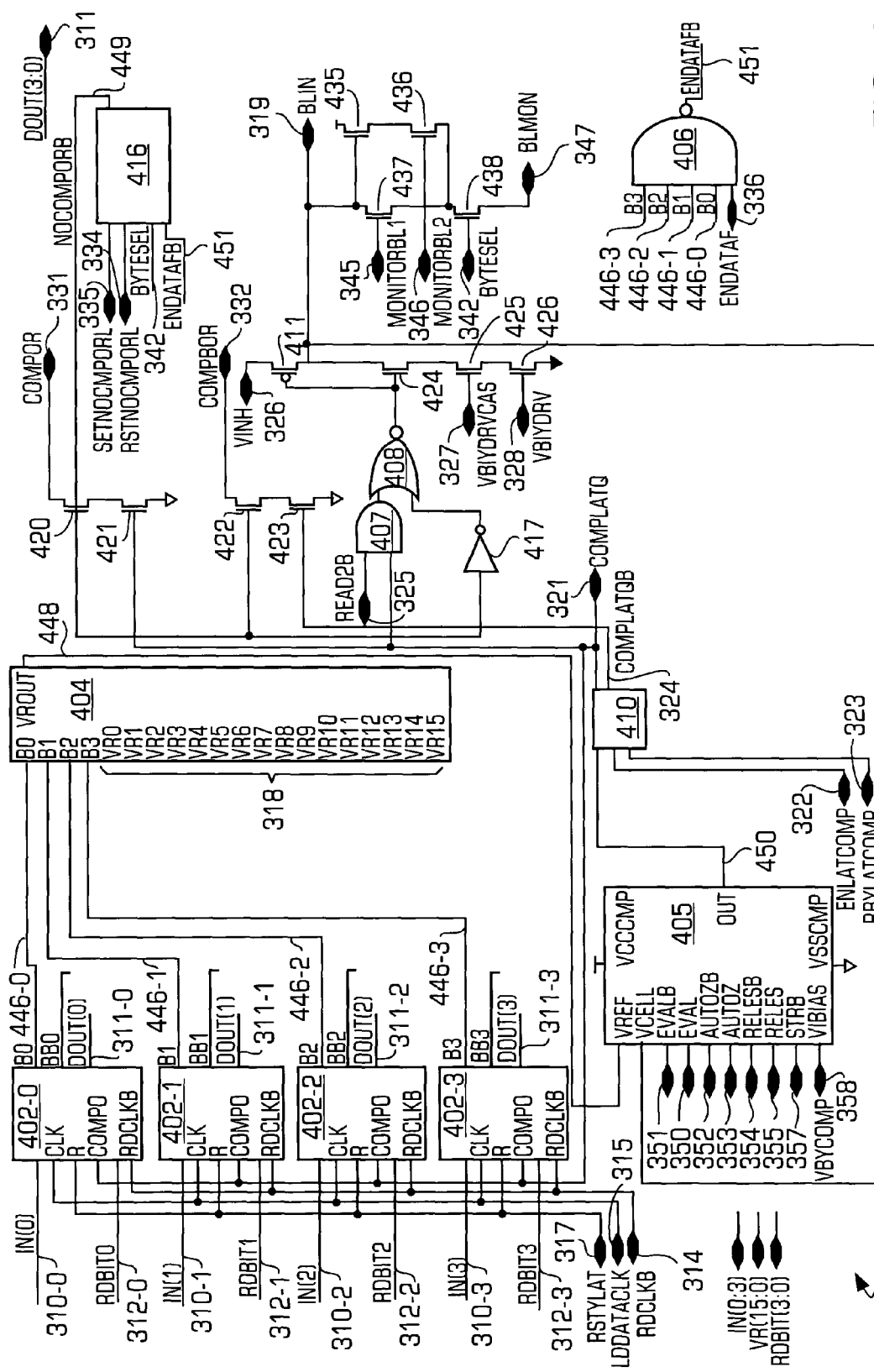
FIG. 4 is a circuit diagram illustrating a y-driver circuit of the digital multilevel bit high density array system of FIG. 1.

FIG. 4 is a schematic illustrating the y-driver circuit 110.

The y-driver circuit 110 comprises a plurality of data latches 402-0 through 402-3, a reference voltage decoder (ydryvrefdec) 404, a comparator 405, a NAND gate 406, an AND gate 407, a NOR gate 408, a latch 410, a PMOS transistor 411, a y-driver redundancy data latch (ydrvredlat) 416, an inverter 417, and a plurality of NMOS transistors 420–426 and 435–438. The description thereof similarly applies to the redundant y-driver circuit 112, the spare y-driver circuit 114, and the reference y-driver circuit 116.

The input buffer 196 (FIG. 1A) couples input/output data on the input/output line 197 to the input/output bus 133, which is coupled to the input data 310 and the output data 311 in the y-driver circuit 110. The plurality of data latches 402-0 through 402-3 latch data from the input data (IN) 310-0 through 310-3, respectively, during data loading in response to the load data clock (LDDATACLK) 315. The data latches 402-0 through 402-3 also latch data previously stored in a memory cell during a read operation in response to read bit data (RDBIT0 through RDBIT3) 312-0 through 312-3. The read bit data control signal (RDBIT0 through RDBIT3) 312-0 through 312-3 are provided from the algorithm controller 164 to decode respective least significant digital bit (B0) through most significant digital bit (B3) stored in the memory cell. The plurality of data latches 402-0 through 402-3 generate the output data (DOUT) 311-0 through 311-3, respectively, in response to the data stored in the memory arrays 101 and the inverted read clock (RDCLKB) 314. The data latches 402 hold the data during the data input step of a page programming cycle or hold the data during a latch during a page read cycle. For the purpose of illustration, four data latches 402 are shown for an embodiment in which 4 bits are stored per memory cell. Other numbers of bits may be stored per memory cell. A reset latch (RSTYLAT) signal 317 supplied from the algorithm controller 164 resets the data latches 402.

The plurality of data latches 402-0 through 402-3 generate output data (B) 446-0 through 446-3, respectively, which are applied to the reference voltage decoder 404, and also generate the output data 311-0 through 311-3, respectively. During a page program cycle, the data 446 represent previously loaded in data. During a page read cycle, the data 446 represent the data read out of the cell.

Figure 5A:
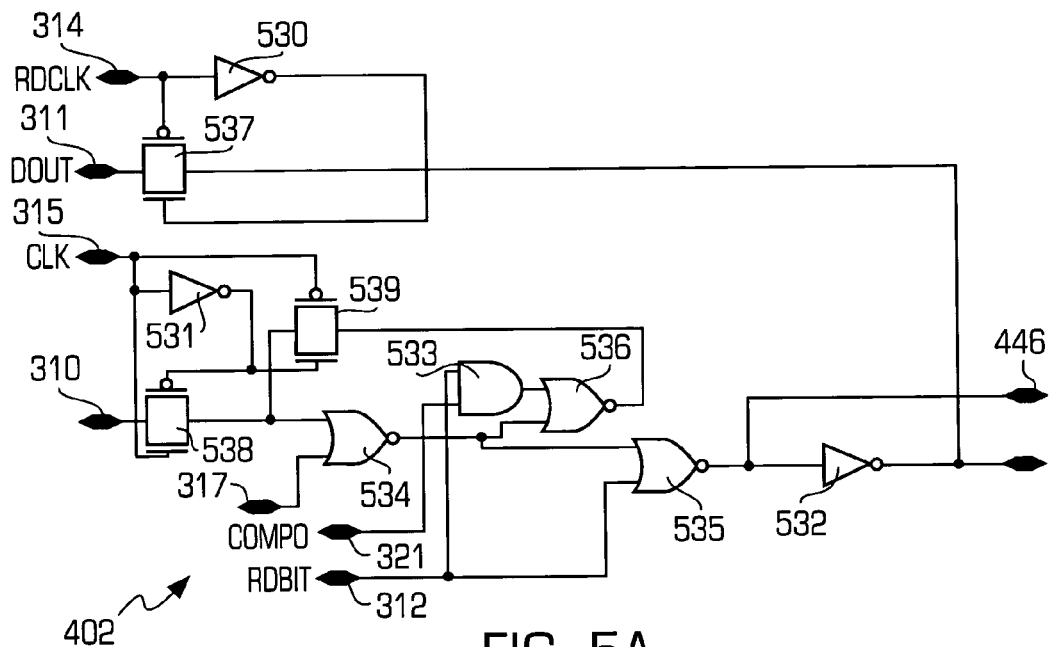
FIG. 5A is a block diagram illustrating a y-driver latch of the y-driver circuit of FIG. 4.

FIG. 5A is a block diagram illustrating the data latch 402.

The data latch 402 comprises a plurality of inverters 530, 531 and 532, an AND gate 533, a plurality of OR gates 534, 535 and 536, and a plurality of transfer gates 537, 538 and 539. The NOR gates 534 and 536, the AND gate 533, and the transfer gate 539 are coupled in a latch arrangement. The reset latch (RSTYLAT) signal 317 is applied to the NOR gate 534 to reset the latch. The input data (IN) 310 is applied via the transfer gate 538 to the other input of the NOR gate 534. The load data clock (LDDATACLK) 315 is applied to the transfer gates 538 and 539 and inverted by the inverter 531 for application to the transfer gates 538 and 539 for clocking the input data 310. A comparator latched output (COMLATQ) signal 321 described below is applied to a first input of the AND gate 533 for enabling or disabling the latch. The read bit (RDBIT) signal 312 is applied to the other input of the AND gate 533 for enabling the latch and applied to the NOR gate 535 for reading the contents of the latch, which is coupled from the output of NOR gate 534 to the other input of NOR gate 535. The output of the NOR gate 535 provides the output data (B) 446 and through the inverter 532 provides the inverted output data signal, which is transferred via the transfer gate 537 as the output data (DOUT) 311. The transfer gate 537 is enabled by the inverted read clock (RDCLKB) 314 and the inversion thereof by the inverter 530.

Refer again to FIG. 4. In response to the data of the output data (B) 446, the reference voltage decoder 404 couples a voltage based on one of the voltages applied to the corresponding voltage reference line (VR(15-0)) 318 as an reference voltage output 448 applied to a reference voltage input of the comparator 405.

Figure 5D:
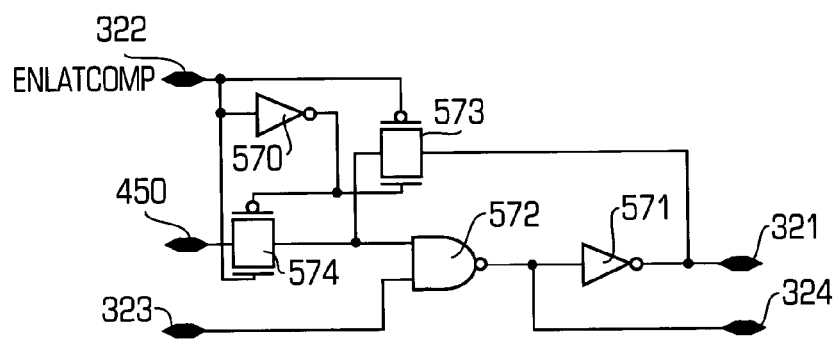
FIG. 5D is a block diagram illustrating a latch of the y-driver circuit of FIG. 4.
Figure 5E:
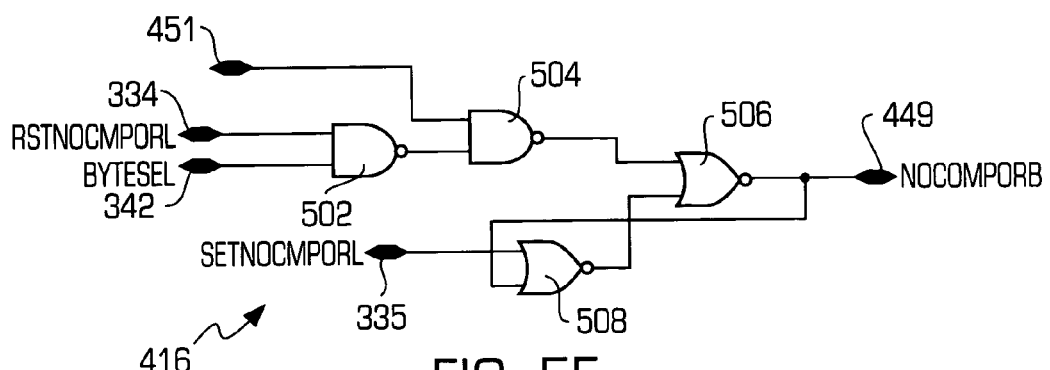
FIG. 5E is a block diagram illustrating a y-driver redundancy latch of the y-driver circuit of FIG. 4.
Figure 5B:
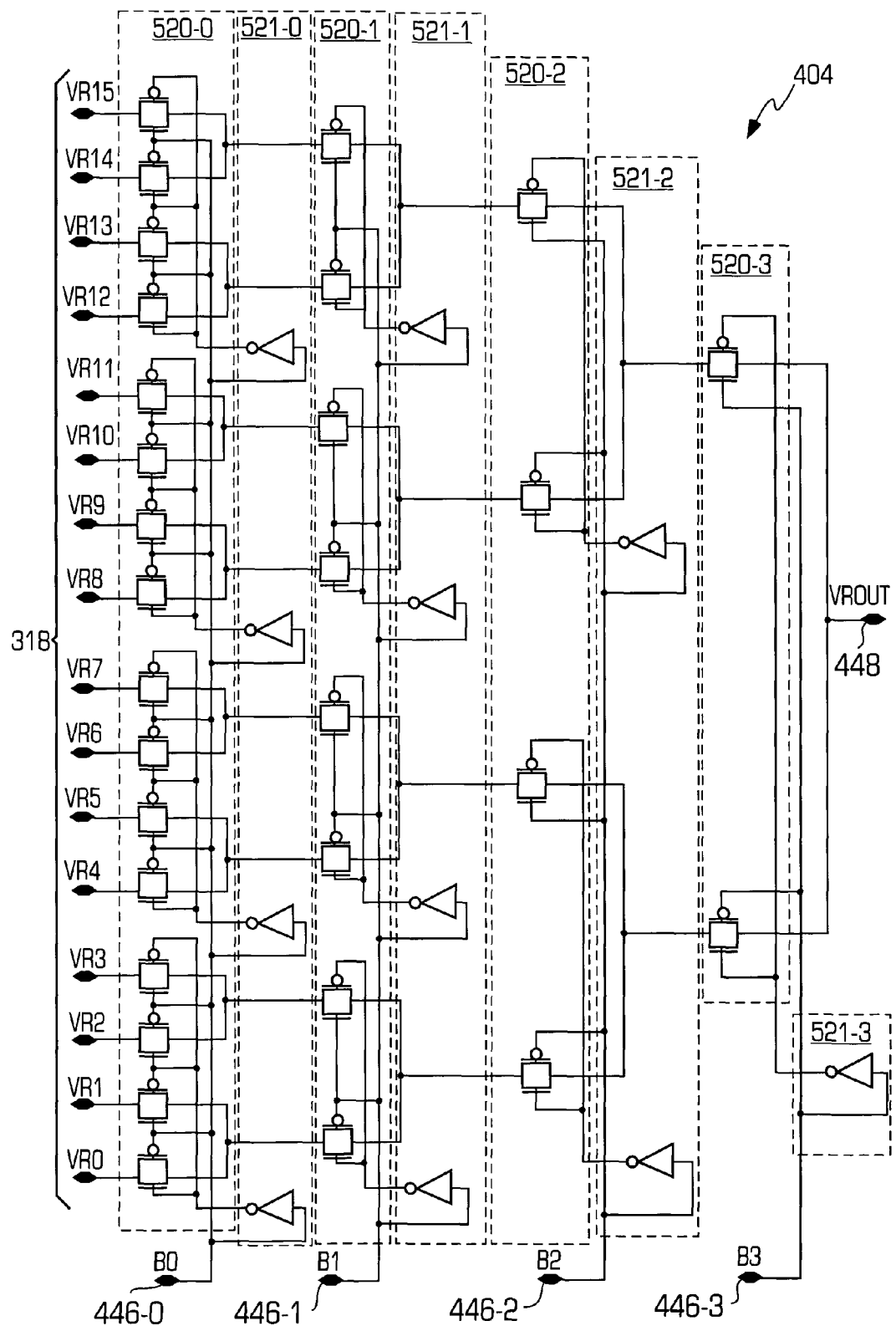
FIG. 5B is a block diagram illustrating a reference voltage decoder of the y-driver circuit of FIG. 4.

FIG. 5B is a block diagram illustrating the reference voltage decoder 404.

The reference voltage decoder 404 comprises a plurality of transfer gate circuits 520-0 through 520-3 and a plurality of selection logic circuits 521-0 through 521-3. The transfer gate circuits 520-0 through 520-3 are coupled in series. The selection logic circuits 521-0 through 521-3 provide enable signals to the respective transfer gate circuits 520-0 through 520-3 in response to the output data 446-0 through 446-3 (e.g., B0B1B2B3) from the data latches 402-0 through 402-3, respectively. The transfer gates 520-0 through 520-3 provide the selected voltage reference on the voltage reference lines 318 as the reference voltage output 448.

Refer again to FIG. 4. A bit line 319 from the page select circuit 120 (see FIG. 3) is coupled to a cell voltage VCELL input of the comparator 405. The comparator 405 provides a comparator output signal (COMPOUT) 450 to indicate whether the cell voltage VCELL on the bit line 319 is above or below the reference voltage 448 for application to a D input of the latch 410. The comparator 405 has a differential structure with an autozero function to zero out an offset.

Figure 5C:
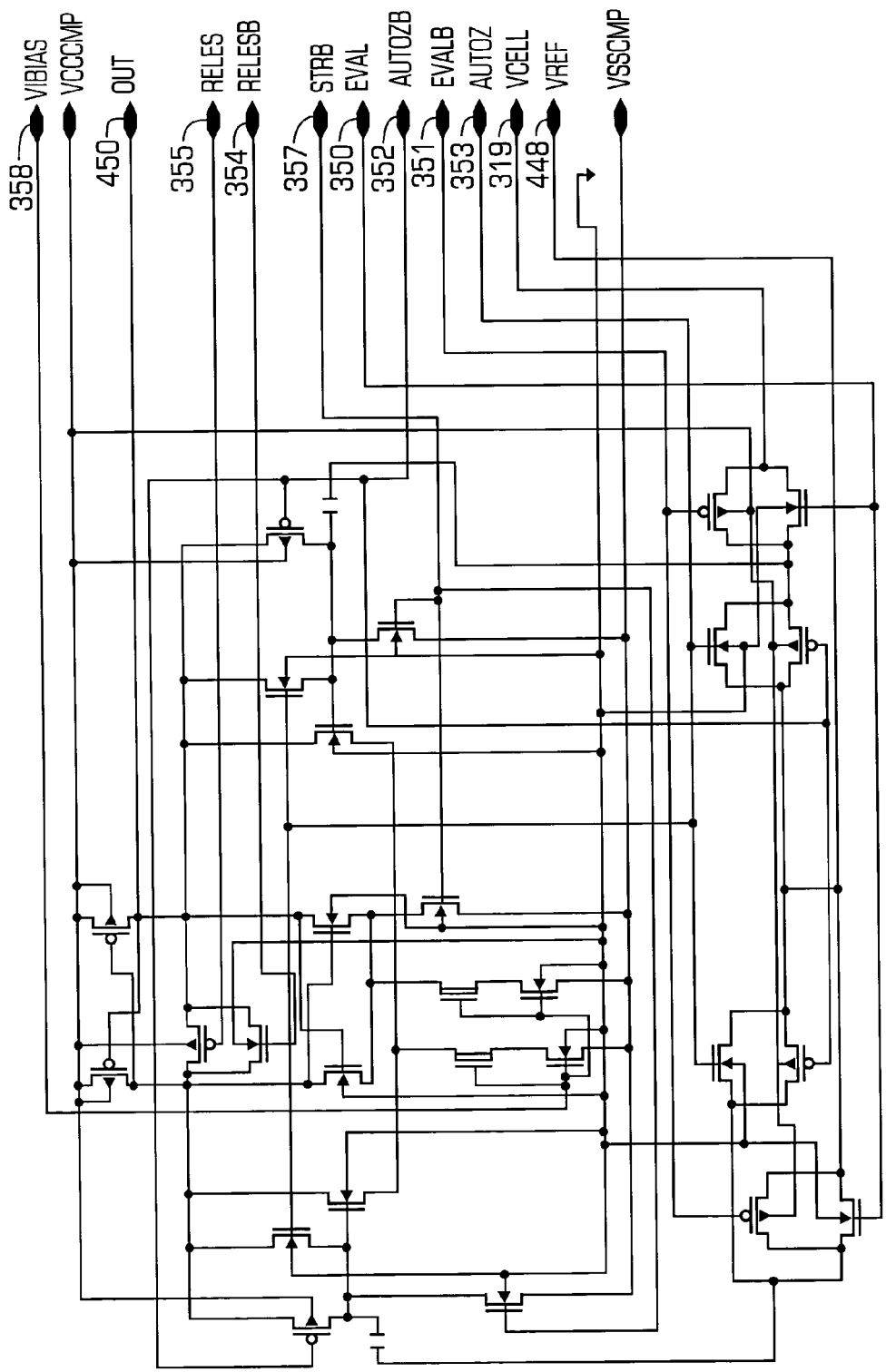
FIG. 5C is a block diagram illustrating a comparator of the y-driver circuit of FIG. 4.

FIG. 5C is a block diagram illustrating the comparator 405.

The comparator 405 generates the comparator output signal (COMPOUT) 450 in response to the comparison of the cell voltage VCELL on the bit line 319 and the reference voltage 448. Auto zero control signals (AUTOZ) 353 and (AUTOZB) 352 automatically zero the comparator offset.

Evaluation control signals (EVAL) 350 and (EVALB) 351 enable the comparator 405 to evaluate the inputs of the bit line 319 and the reference voltage 448. Release control signals (RELES) 355 and (RELESB) 354 release the comparator 405. A strobe signal (STRB) 357 latches the output of the comparator 405. The control signals 350 through 355 and 357 are generated by the algorithm controller (ALGOCNTRL) 164. A comparator bias (VBYCOMP) signal 358 generated by the voltage algorithm controller (VALGGEN) 176 biases the comparator 405.

Refer again to FIG. 4. The latch 410 generates a comparator latch (COMPLATQ) signal 321 and an inverted comparator latch (COMLATQB) signal 324 that indicates a result of comparing the voltage on the bit line 319 and the reference voltage of the reference voltage output 448. Under the control of the algorithm controller (ALGOCNTRL) 164, an enable comparator latch (ENLATCOMP) signal 322 functions as a strobe signal to enable the latch 410 during a certain time to latch the output of the comparator 405.

FIG. 5D is a block diagram illustrating the latch 410.

The latch 410 comprises inverters 570 and 571, a NAND gate 572, and transfer gates 573 and 574. The comparator output (COMPOUT) signal 450 is applied via the transfer gate 574 to a first input of the NAND gate 572. The reset comparator latch (RBYLATCOMP) signal 323 is applied to a second input of the AND gate 572. The output of the NAND gate 572 is coupled to the inverter 571, and also generates the inverted comparator latch output (COMLATQB) signal 324. The output of the inverter 571 is coupled via the transfer gate 573 to the first input of the NAND gate 572, and also provides the comparator latched output (COMLATQ) signal 321. The transfer gates 573 and 574 are controlled by the enable comparator latch (ENLATCOMP) signal 322, which functions as a clock, and is inverted by the inverter 570.

Refer again to FIG. 4. When the enable comparator latch (ENLATCOMP) signal 322 is at logic high, the latch 410 outputs the logic level of the comparator output (COMPOUT) signal 450 applied on the D input as the comparator latch output (COMLATQ) signal 321. When the enable comparator latch (ENLATCOMP) signal 322 goes to logic low, the latch 410 latches the logic level of the comparator output (COMPOUT) signal 450 on the comparator latch output (COMLATQ) signal 321.

The reset comparator latch (RBYLATCOMP) signal 323 applied to a reset RB input of the latch 410 resets the latch 410 at suitable times under the control of the algorithm controller (ALGOCNTRL) 164. When the reset comparator latch (RBYLATCOMP) signal 323 is logic low, the latch 410 is reset, whereby the comparator latch output (COMLATQ) 321 is at logic low and the inverted comparator latch output (COMLATQB) 324 is at logic high.

The comparator latch output (COMLATQ) signal 321 from the Q output of the latch 410 is applied to the gate of the NMOS transistor 421, an input of the AND gate 407, and the data latches 402. The inverted comparator latch output (COMLATQB) 324 from the QB output of the latch 410 is applied to the gate of the NMOS transistor 423.

A read (READ2B) signal 325 supplied from the algorithm controller 164 is applied to another input of the AND gate 407. The read (READ2B) signal 325 is at a logic high during a page programming cycle, and is at a logic low during a page read cycle. The output of the AND gate 407 is applied to a first input of the NOR gate 408.

A no-compare-OR (NOCOMPORB) signal 449 from the y-driver redundancy latch 416 is coupled to the inverter 417. The inverter 417 inverts the no-compare-OR (NOCOMPORB) signal 449 and applies the inverted signal to the second input of the NOR gate 408. The output of the NOR gate 408 is applied to the gates of the PMOS transistor 411 and the NMOS transistor 424.

The PMOS transistor 411 sets the memory cell coupled thereto on the bit line (BLIN) 319 into a program or program inhibit mode. The drain-source terminals of the PMOS transistor 411 are coupled between an inhibit voltage (VINH) signal 326 and the bit line (BLIN) 319. When enabled, the PMOS transistor 411 pulls the bit line 319 to the inhibit voltage (VINH) 326.

The NMOS transistors 424, 425 and 426 form a current bias circuit to apply a constant current load on the bit line (BLIN) 319. The NMOS transistors 424, 425 and 426 are coupled in a cascode arrangement between the bit line 319 and ground, and include gates coupled to a first y-driver bias voltage (VBIYDRVCAS) 327 and a second y-driver bias voltage (VBIYDRV) 328, respectively, and supplied from the voltage algorithm controller (VALGGEN) 176.

The compare-OR (COMPOR) signal 331 is controlled by the NMOS transistors 420 and 421. The drain-source terminals of the NMOS transistors 420 and 421 are coupled in series between the compare-OR (COMPOR) signal 331 and ground. The gate of the NMOS transistor 421 is coupled to the comparator latched output (COMLATQ) 321 of the latch 410. The no-compare-OR (NOCOMPORB) signal 449 is applied to the gate of the NMOS transistor 420.

The inverted compare-OR (COMPBOR) signal 332 is controlled by the NMOS transistors 422 and 423. The drain-source terminals of the NMOS transistors 422 and 423 are coupled in series between the inverted compare-OR (COMPBOR) signal 332 and ground. The gate of the NMOS transistor 423 is coupled to the inverted comparator latched output (COMLATQB) 324 of the latch 410. The no-compare-OR (NOCOMPORB) signal 449 is applied to the gate of the NMOS transistor 422.

The no-compare-OR (NOCOMPORB) signal 449 enables or disables the compare-OR (COMPOR) signal 331 and the inverted compare-OR (COMPBOR) signal 332. When the compare-OR (COMPOR) signal 331 and the inverted compare-OR (COMPBOR) signal 332 are enabled during the compare-OR function, the latch 410 sets the states of these signals responsive to the comparator output signal (COMPOUT) 450 from the comparator 405. During the compare-OR function, the compare-OR (COMPOR) signal 331 and the inverted compare-OR (COMPBOR) signal 332 are first both pulled up to logic high (one) by the compare-OR logic (COMPORLOG) circuit 153. Then, if the comparator output signal (COMPOUT) 450 is logic high, the comparator latched output (COMLATQ) 321 of the latch 410 is high and the transistor 421 pulls the compare-OR (COMPOR) signal 331 to ground (zero). Also, if the comparator output signal (COMPOUT) 450 is logic high, the inverted comparator latched output (COMLATQB) 324 of the latch 410 is low, and the transistor 423 is off allowing the inverted compare-OR (COMPBOR) signal 332 to remain high (one). The comparator output signal (COMPOUT) 450 is a logic high when the cell voltage VCELL is less than the reference voltage output 448. However, if the comparator output signal (COMPOUT) 450 is logic low, the comparator latched output (COMLATQ) 321 of the latch 410 is low, and the transistor 421 is off allowing the compare-OR (COMPOR) signal 331 to remain high (one). Also, if the comparator output signal (COMPOUT) 450 is logic low, the inverted comparator latched output (COMLATQB) 324 of the latch 410 is high and the transistor 423 pulls the inverted compare-OR (COMPBOR) signal 332 to ground (zero). The comparator output signal (COMPOUT) 450 is a logic low when the cell voltage VCELL is higher than the reference voltage output 448. If any of the compare-OR (COMPOR) signals 331 are low from any of the enabled y-drivers 110, 114, or 112, the compare-OR logic (COMPORLOG) circuit 153 forces the compare-OR (COMPOR) signal 131 to a logic low (zero). If all of the compare-OR (COMPOR) signals 331 are high from all of the enabled y-drivers 110, 114, or 112, the compare-OR logic (COMPORLOG) circuit 153 forces the compare-OR (COMPOR) signal 131 to a logic high (one). If any of the inverted compare-OR (COMPBOR) signals 332 are low from any of the enabled y-drivers 110, 114, or 112, the compare-OR logic (COMPORLOG) circuit 153 forces inverted compare-OR (COMPBOR) signal 132 to a logic low (zero). If all of the inverted compare-OR (COMPBOR) signals 332 are high from all of the enabled y-drivers 110, 114, or 112, the compare-OR logic (COMPORLOG) circuit 153 forces the inverted compare-OR (COMPBOR) signal 132 to a logic high (one).

The NAND gate 406 generates an enable data signal (ENDATAFB) 451 in response to data select (B0 through B3) signals 446 and the enable data (ENDATAF) signal 336 supplied from the algorithm controller 164. The enable data signal (ENDATAFB) 451 is an input data pattern indicator that is used for example to achieve a desired operation, such as program inhibit and is coupled to the redundancy latch 416.

FIG. 5E is a block diagram illustrating the y-driver redundancy latch 416. The y-driver redundancy latch 416 is used to latch information related to redundancy of the y-driver, such as whether the y-driver is used for bad or good columns. The y-driver redundancy latch 416 is then used to control various functions of the y-drivers as appropriate for redundancy operation such as enabling/disabling the compare-OR function or inhibiting the bitline during programming. The y-driver redundancy latch (YDRVREDLAT) 416 comprises a pair of NAND gates 502 and 504 and a pair of NOR gates 506 and 508. The NOR gates are cross-coupled to form a latch. A set no-compare-OR latch (SETNOCMPORL) signal 335 from the input logic circuit 160 (see FIG. 1) sets the latch formed of the NOR gates 506 and 508. The NAND gates 502 and 504 form selection logic. The NAND gate 502 provides selection logic for a reset no-compare-OR (RSTNOCMPORL) signal 334 from the redundancy controller 186 and a byte select (BYTESEL) signal 342 from the byte select circuit 140. The latch formed of the NOR gates 506 and 508 generates the no-compare-OR (NOCOMPORB) signal 449. The NAND gate 504 provides selection logic for the enable data (ENDATAFB) signal 451.

Refer again to FIG. 4. The NMOS transistors 435, 436, 437 and 438 provide monitoring of the bit line (BLIN) 319. The drain-source terminals of the NMOS transistors 437 and 438 are connected in series between the bit line 319 and a bit line monitor (BLMON) signal 347. The bitline monitor (BLMON) signal 347 is coupled to the test logic circuit (TESTLOGIC) 180 to provide direct information from the bitline 319 during any operation. This is used, for example, to monitor the effects of disturb conditions on a memory cell on the bitline 319. A first bit line monitor enable (MONITORBL1) signal 345 supplied from the test logic circuit (TESTLOGIC) 180 is applied to the gate of the NMOS transistor 437. A byte select (BYTESEL) signal 342 is applied to the gate of the NMOS transistor 438. When the NMOS transistors 437 and 438 are enabled, the bit line monitor signal 347 is coupled to the bit line 319. The drain-source terminals of the NMOS transistors 435 and 436 are coupled in series between a power supply line and a drain of the NMOS transistor 438. The gate of the NMOS transistor 435 is coupled to the bit line 319. The gate of the NMOS transistor 436 is coupled to a second bit line monitor enable (MONITORBL2) signal 346 supplied from the test logic circuit (TESTLOGIC) 180. When the NMOS transistors 436 and 438 are enabled, the bit line monitor signal 347 is coupled to the power supply when the bit line 319 is at a sufficient voltage to enable the NMOS transistor 435. The NMOS transistors 436 and 438 provide buffered monitoring of the bit line 319.

Figure 6:
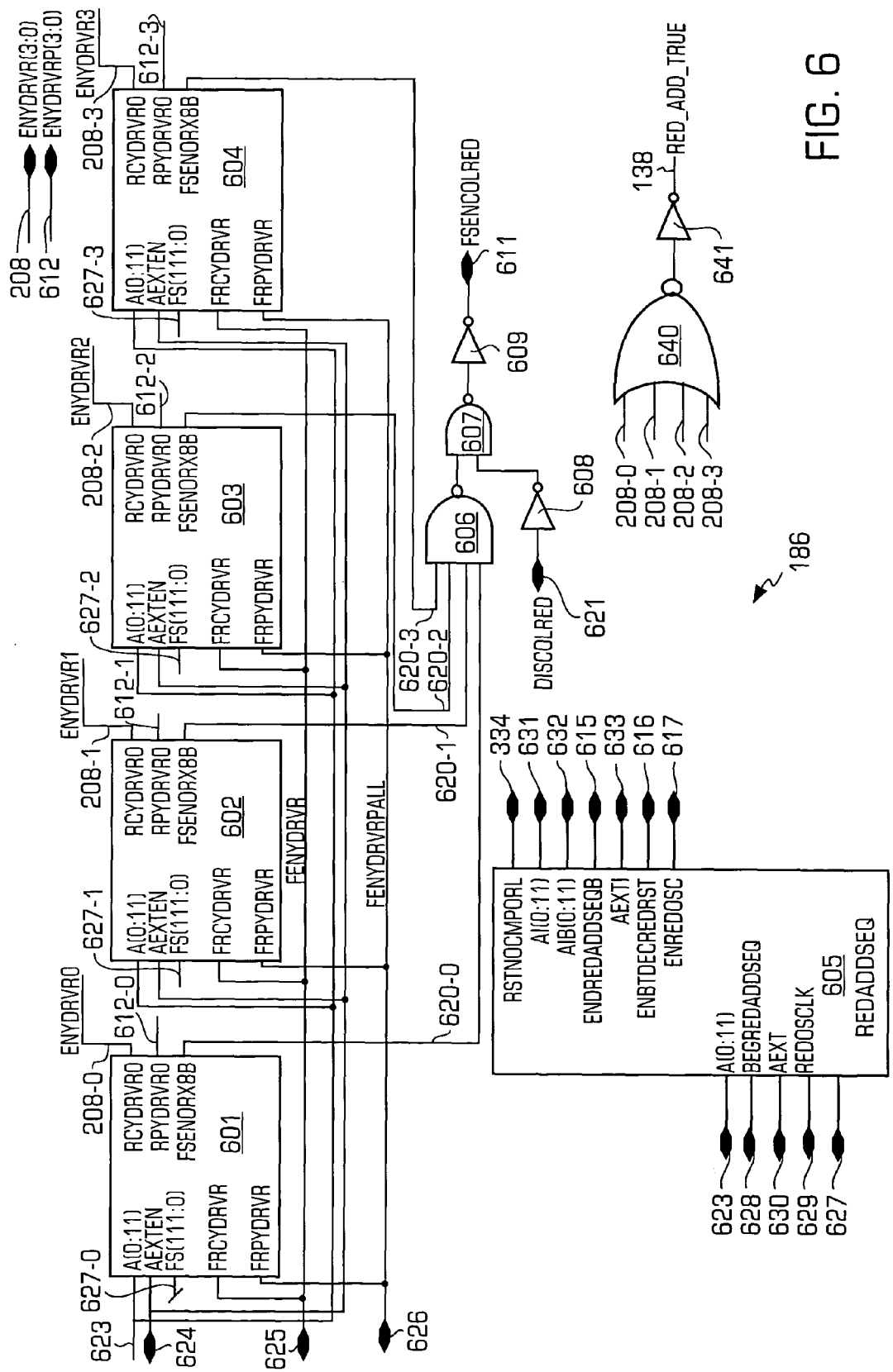
FIG. 6 is a block diagram illustrating a redundancy controller of the memory array system of FIG. 1A.

FIG. 6 is a block diagram illustrating the redundancy controller (REDCNTRL) 186.

The redundancy controller 186 enables the column redundancy of the redundant memory array 102 and the correspondent redundant y-drivers 112. The redundancy controller 186 comprises a plurality of redundancy decoders (reddesfsx8) 601, 602, 603, 604, a redundancy address sequencer (redaddseq) 605, a NOR gate 640, NAND gates 606 and 607 and inverters 608, 609, and 641.

The redundancy controller 186 generates a column redundancy fuse enable (FSENCOLRED) signal 611 as an indicator that the column redundancy is to be used so that the memory array system 100 can take action to optimize system performance. The column redundancy fuse enable signal 611, if indicative of an inactive state (low level signal), is applied to the input logic 160 and the address counters 162, 163 and 165 to disable permanently during any operation the multiplexing of data into the redundant y-drivers 112 during data loading, or the multiplexing of data from the redundant y-drivers 112 during data out reading. The column redundancy fuse enable signal 611 indicating an inactive state also signals to the input logic 160 and the compare-OR logic circuit 153 to not activate permanently during any operation the compare-OR function of the redundant y-drivers 112. This action eliminates any speed penalty due to any circuit path being activated due to redundancy.

The redundancy controller 186 also generates the redundant page y-driver enable (ENYDRVRPx) signals 612-0 through 612-3 to enable corresponding redundant compare-OR function, and redundant y-driver enable (ENYDRVR) signals 208-0 through 208-3 to enable corresponding redundant y-drivers 112 (see FIG. 2). The redundancy controller 186 also generates a redundancy address (RED_ADD_TRUE) signal 138, indicating a column is bad, to serve as a true or false flag to indicate to the controllers 160 and 164 to issue appropriate control signals coupled to the y-drivers 110, 112, 114 and 116 to take appropriate actions during operation (see description below for FIGS. 23–26).

The redundancy controller 186 also generates the reset no-compare-OR latch (RSTNOCMPORL) signal 334 to reset the redundancy latch 416 (see description with FIG. 4), an end redundant address sequencing (ENDREDADDSEQB) signal 615 to signal the end of the action of the redundancy address sequencer 605, an enable byte decoder redundancy reset (ENBTDECREDRST) signal 616 to enable appropriately the byte pre-decoder 152 and byte address counters 163 or 165, and an enable redundant oscillator (ENREDOSC) signal 617 to enable an oscillator (not shown) used to keep track of the internal timing for redundancy operation.

The redundancy decoders 601, 602, 603, 604 are used for redundant byte and page enabling. The redundancy decoders 601, 602, 603, and 604 compare incoming page, e.g., A<9:11>, and byte addresses, e.g., A<0:8> 623, to stored fuse addresses (FS<xxx>) 627 to generate address matching for page address (redundant page y-driver enable 612-0 through 612-3) and byte/page address (redundant column (y-driver) enable 208-0 through 208-3).

The redundancy decoders 601, 602, 603, 604 generate the redundant page y-driver enable (ENYDRVPx) signals 612, the redundant y-driver enable (ENYDRVR) signals 208, and fuse enable OR (FSENORX8B) signals 620, which are applied to corresponding inputs of the NAND gate 606. One input of the NAND gate 607 is coupled to the output of the NAND gate 606, and another input of the NAND gate 607 is coupled to the output of the inverter 608, which inverts a disable column redundancy (DISCOLRED) signal 621. The inverter 609 generates the column redundancy fuse enable (FSENCOLRED) signal 611 from the output of the NAND gate 607. The redundant y-driver enable (ENYDRVR) signals 208 are applied to the inputs of the NOR gate 640. The inverter 641 generates the redundancy address (RED_ADD_TRUE) signal 138 from the output of the NOR gate 640. The redundancy decoders 601, 602, 603, 604 receive an address signal 623 (e.g., A<0:11>), an address extension enable (AEXTEN) signal 624, a y-driver fuse enable (FENYDRVR) signal 625, a y-driver fuse enable all (FENYDRVRPALL) signal 626, and a fuse (FS<x:y>) state signal 627-0 through 627-3. The row page address counter 162 and the byte address counters 163 and 165 provide the address signal 623 and the address extension enable signal 624 to the redundancy decoders 601, 602, 603, 604. The address extension enable (AEXTEN) signal 624 combines the address extension signal (AEXT) 630 provided from the spare byte address counter 165 and an extension enable control command (not shown) from the input logic 160. Unless the extension array or spare array 104 is enabled by an extension enable command through the input logic 160, the extension array is not accessible, e.g., the (AEXTEN) signal 624 is inactive. The test logic circuit 180 provides the disable column redundancy signal 621, the y-driver fuse enable signal 625 and the y-driver fuse enable all signal 626 to the redundancy decoders 601 through 604 for testing functions. The fuse circuit 182 comprising a plurality of fuse circuits, described below in conjunction with FIG. 9B, provides the fuse state signals 627-0 through 627-3.

Figure 7:
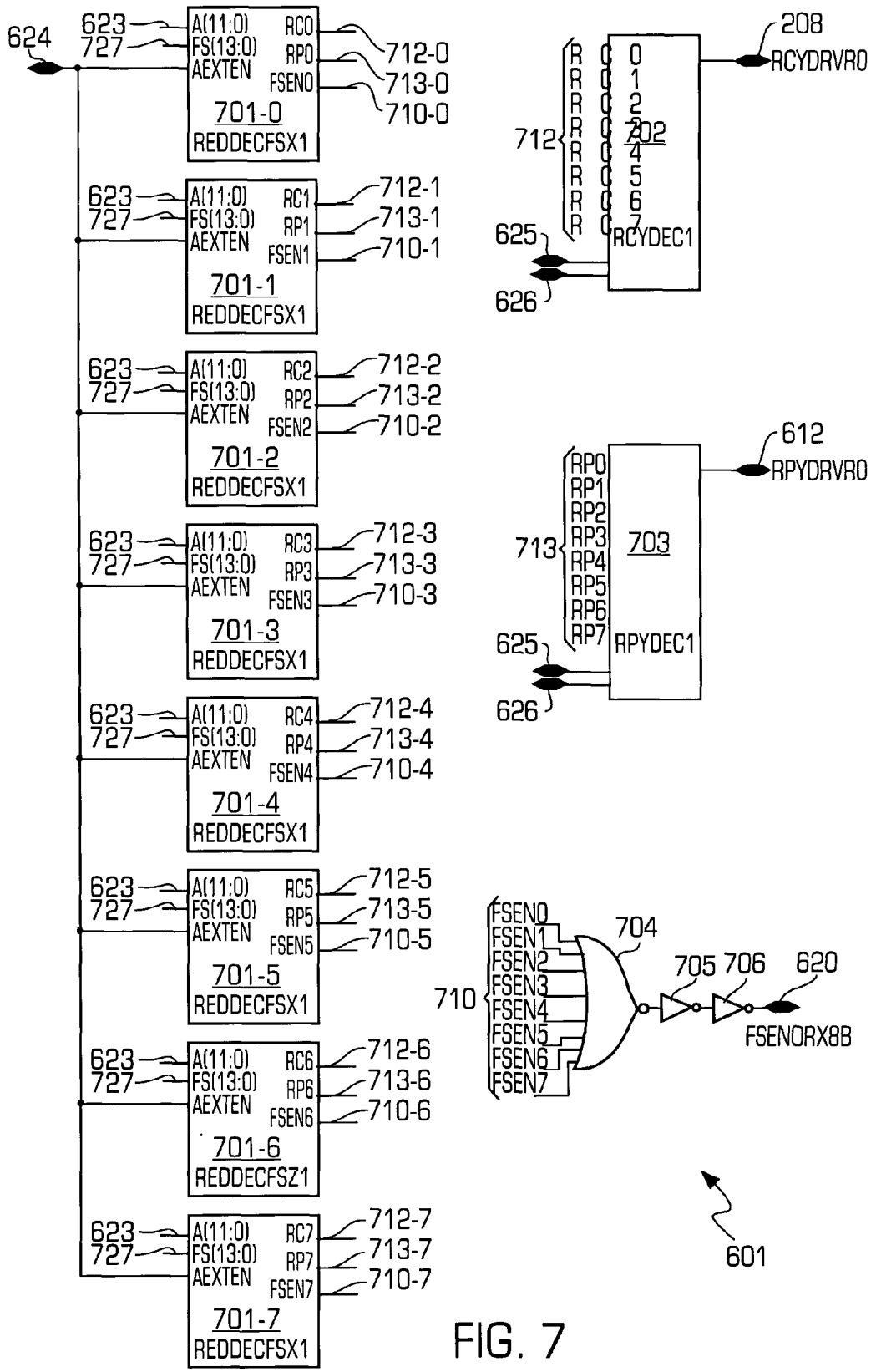
FIG. 7 is a block diagram illustrating a redundancy decoder of the redundancy controller of FIG. 6.

FIG. 7 is a block diagram illustrating the redundancy decoders 601, 602, 603, 604. For the sake of illustration, FIG. 7 is described for the redundancy decoder 601. The redundancy decoders 602, 603, 604 function in a similar manner. The redundancy decoder 601 comprises fuse redundancy decoders (reddecfsx1) 701-0 through 701-7, a redundant column decoder (rcydec1) 702, a redundant page decoder (rpydec1) 703, a NOR gate 704, and inverters 705 and 706.

The fuse redundancy decoders 701-0 through 701-7 generate a corresponding fuse state enable (FSEN) signal 710-0 through 710-7, which are applied to a respective input of the NOR gate 704. The inverters 705 and 706 are coupled in series to buffer the output of the NOR gate 704 and generate the fuse enable OR signal 620. The fuse redundancy decoders 701-0 through 701-7 also generate a corresponding redundant column (RCx) signal 712-0 through 712-7 and a corresponding redundant page (RPx) signal 713-0 through 713-7, which are applied to the redundant column decoder (rcydec1) 702 and the redundant page decoder (rpydec1) 703, respectively. The address signals (A<0:11>) 623, the address extension enable (AEXTEN) signal 624, and fuse state signals 727 are applied to the fuse redundancy decoders 701. The fuse state signals 727 correspond to the fuse state signals 627 (see FIG. 6).

FIG. 8 is a block diagram illustrating the fuse redundancy decoder 701.

The fuse redundancy decoder 701 is used to compare address 623 and 624 to a stored fuse state 812, which corresponds to a fuse state signal 727. There are eight redundancy decoders 701, as shown in FIG. 7, used with a pair of redundant y-drivers 112 as shown in FIGS. 2 and 3. The fuse redundancy decoder 701 comprises a plurality of redundancy comparators (redcomp) 801-0 through 801-12, a redundancy decoder (reddec1) 802, and a plurality of inverters 803, 804 and 805.

Each redundancy comparator (redcomp) 801-0 through 801-11 generates a fuse state output (FSOx) signal 808-0 through 808-11, respectively, which is applied to a corresponding input of the redundancy decoder (reddec1) 802, in response to an address (A<x>) signal 623-0 (A<0>) through 623-11 (A<11>), respectively, and a fuse state (FS<x>) signal 812-0 through 812-11, respectively. The redundancy comparator 801-12 generates a fuse state output (FSO12) 808-12, in response to the address extension enable (AEXTEN) signal 624 and a fuse state signal 812-12. The inverters 803 and 804 generate a fuse extension (FSEXTEN) signal 814 in response to the fuse state signal 812-12. The inverter 805 generates the fuse state enable (FSEN) signal 710 in response to a fuse state FS(13) 812-13. The signals 808-0 through 808-12, 814, and 710 are input to the redundancy decoder 802. The fuse state signals 627 and 727 comprise the fuse state signals 812-0 through 812-13, which are provided from fuse circuits 182 described below in conjunction with FIG. 9B (each of signals 812-0 through 812-13 corresponds to a FS signal 9184 in FIG. 9B).

The redundancy decoder 802 generates the redundant column (RC) signal 712 to indicate a byte and page address matching and the redundant page (RP) signal 713 to indicate a page address matching in response to the fuse state output (FSO) 808, the fuse extension (FSEXTEN) signal 814, and the fuse state enable signal (FSEN) 710. The redundant column (RC) signal 712 and redundant page (RP) signal 713 couple to the redundant column decoder (rcydec1) 702 and redundant page decoder (rpydec1) 703, which in turn generate redundant y-driver enable signals 208 and redundant page y-driver enable signals 612 to enable the redundant byte select 142 and the redundant compare-OR selection circuits 204, respectively, in the redundant y-driver 148 as shown in FIGS. 2, 6, and 7.

Figure 9A:
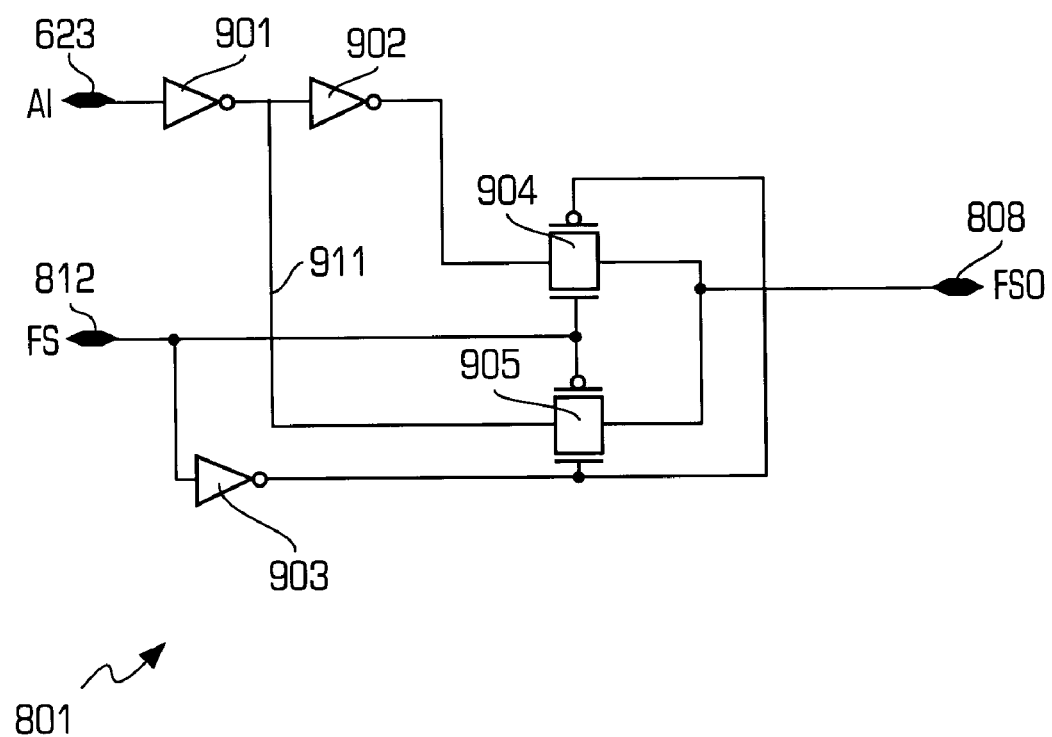
FIG. 9A is a block diagram illustrating a redundancy comparator of the fuse redundancy decoder of FIG. 8.
Figure 9B:
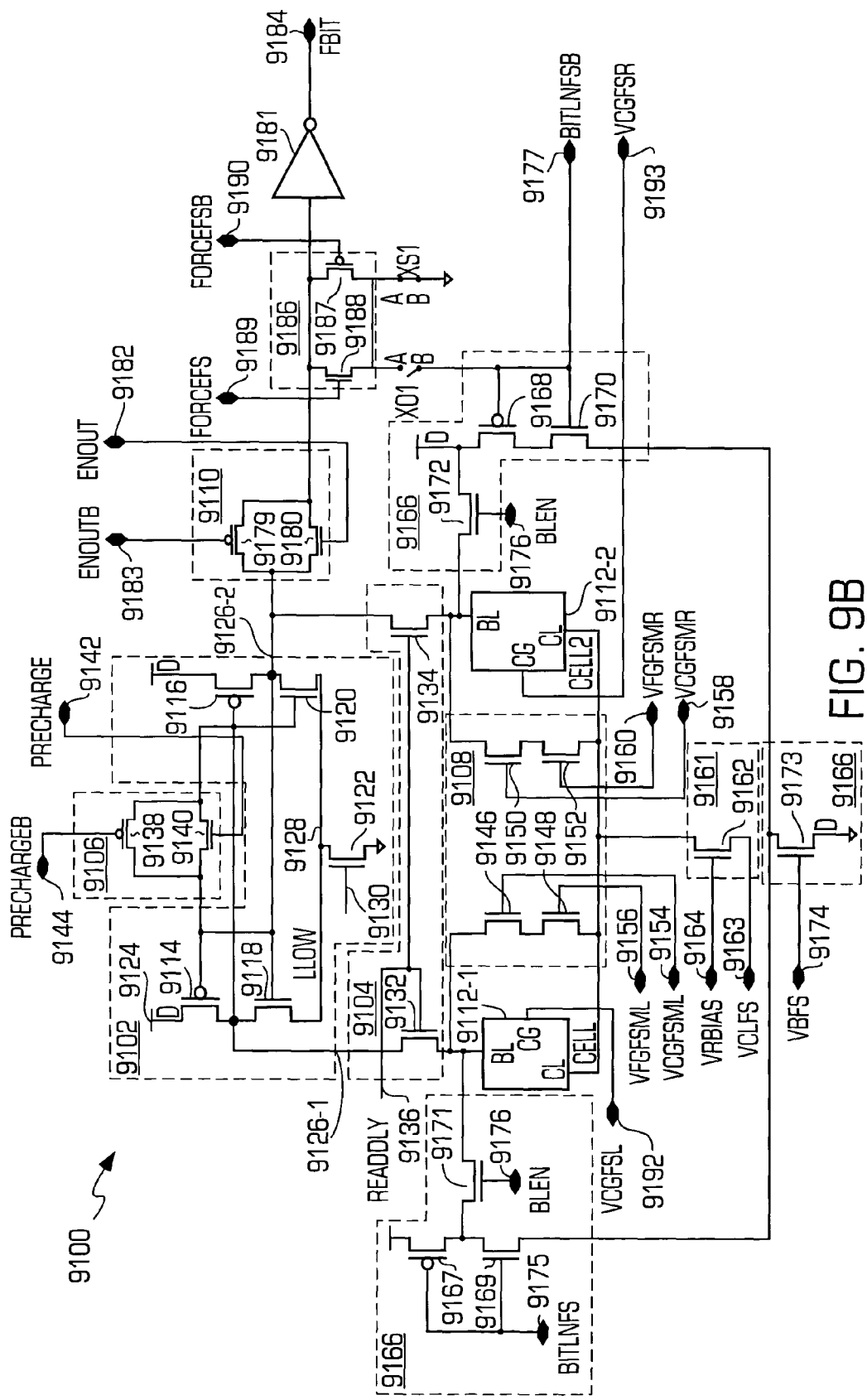
FIG. 9B is a block diagram illustrating a fuse cell element that is used in the column redundancy.

FIG. 9A is a block diagram illustrating the redundancy comparator (redcomp) 801.

The redundancy comparator (redcomp) 801 is a one bit digital comparator that outputs a "1" if two inputs are the same ("11" or "00") and outputs a "0" if two inputs are different ("01" or "10"). The redundancy comparator 801 is used for address match comparison as described previously, and comprises a plurality of inverters 901, 902 and 903, and a plurality of transfer gates 904 and 905. The inverter 901 applies an inverted signal of the address signal 623 to the transfer gate 905. The inverter 902 applies an address signal corresponding to the address signal 623 to the transfer gate 904. The fuse state signal 812 and an inverted fuse state signal from the inverter 903 control the transfer gates 904 and 905 to couple the address signal 623 or the inverted address signal 911, respectively, to the fuse state outputs 808.

FIG. 9B is a block diagram illustrating a fuse cell element 9100 that is used for column redundancy address storage. This fuse cell element 9100 is a sub-block of the fuse circuit 182. In one embodiment, the fuse cell element may be the fuse cell element described in co-pending patent application Ser. No. 10/002,036, filed Nov. 1, 2001, entitled "Nonvolatile flash fuse element," published on May 8, 2003, U.S. Publication Number 2003/0086326 A1, and assigned to the same assignee as this patent application, the subject matter of which is incorporated herein by reference.

The fuse cell element 9100 comprises a latch 9102, an isolation circuit 9104, a precharge circuit 9106, a margin circuit 9108, an isolation transfer gate 9110, and memory cells 9112-1 and 9112-2. The input signals numbered 9xyz entering FIG. 9B, except output signal 9184, are provided by a fuse control circuit inside the fuse circuit 182. The signal 9184 corresponds to the fuse state signal FS 627 (FIG. 6), 727 (FIG. 7), and 812 (FIG. 8). To better comprehend the invention, the description of FIGS. 9B and 9C may be read after the description of FIGS. 10–26 and return to this section last.

In one embodiment, the latch 9102 and the memory cells 9112-1 and 9112-2 are in a constant current differential sensing arrangement, in which an input pair of a differential comparator is replaced by a fuse pair (e.g., the memory cells 9112-1 and 9112-2). The difference in the floating gate voltage of the fuse pair (the memory cells 9112-1 and 9112-2) generates the input differential voltage. Accordingly, the comparator output is an accurate indication of the fuse pair output. Well-known advantages of a true differential comparator, such as constant bias current, noise insensitivity to power supply fluctuation, and common mode rejection, are thus preserved in this fuse sensing arrangement. Constant bias current is advantageous in terms of power layout distribution (such as metal width) and low power consumption. Furthermore, the fuse pair may include a cross-coupled fuse pair to average out the effects of electrical differences between the fuse pair due to processing and physical location, such as bottom and top fuse locations, on a memory device, which improves yield and reliability.

The sensing scheme has two phases. The first phase is active (with bias current and voltage) sensing by the differential comparator to amplify a floating gate voltage differential in the input fuse pair. The second phase is constant current latching amplification by enabling a current controlled cross coupled built-in latch (e.g., latch 9102) to then completely open up the output voltage to full rail and isolate the fuse cells from the latch 9102 by shutting off the pass gate (e.g., the isolation circuit 9104) from fuse cells to the latch 9102. The built-in latch refers to the latching PMOS transistors (e.g., PMOS transistors 9114 and 9116 described below) as part of the differential comparator. The constant current latching amplification refers to the latch amplification at a fixed bias current.

The sensing scheme can alternately allow the fuse cells (memory cells 9112) to be in an on-condition, namely fuse cells in operating condition (voltages on control gate and bit line), by not isolating the fuse cells from the latch 9102 (e.g., by not shutting off the pass gates of the isolation circuit 9104 from the fuse cells, memory cells 9112, to the latch 9102).

In one embodiment, the sensing scheme can also use one logic signal edge triggered from a power-on-reset (POR) signal (not shown) to control the sensing. In this embodiment, as the power-on-reset (POR) signal transitions from high to low, as the supply voltage VCC transitions from low to high, the built-in latch 9102 and the differential comparator are on. When the voltage VCC is turning on and as the power-on-reset (POR) signal transitions from high to low at the VCC trip point, the built-in latch 9102 then opens up the output to full rail. The fuse cells (memory cells 9112) can then operate (voltages on the control gate and bit line). Alternatively, the sensing scheme may use a logic signal triggered from an on-chip or off-chip control logic circuit (not shown) to control the sensing.

In one embodiment, the first and second memory cells 9112-1, 9112-2 are programmable non-volatile fuse elements. In one embodiment, the memory cells 9112-1, 9112-2 are source side hot electron injection flash memory. In one embodiment, the memory cells 9112-1, 9112-2 are split gate memory cells. A fuse control gate voltage (VCGFSL) 9192 is applied to the memory cell 9112-1 to control the control gate (CG) thereof. A fuse control gate voltage (VCGFSR) 9193 is applied to the memory cell 9112-2 to control the control gate (CG) thereof.

The latch 9102 detects the contents stored in the memory cells 9112-1, 9112-2 and latches the read contents allowing the memory cells 9112-1, 9112-2 to be electrically disconnected from the latch 9102 by the isolation circuit 9104. The latch 9102 comprises p-channel metal oxide semiconductor field effect transistors (PMOS transistors) 9114, 9116 and n-channel metal oxide semiconductor field effect transistors (NMOS transistors) 9118, 9120, 9122. The drain-source terminals of the PMOS transistors 9114, 9116 are coupled between a power supply line 9124 and a first latch input 9126-1 and a second latch input 9126-2, respectively. The drain-source terminals of the NMOS transistors 9118, 9120 are coupled between the first and second latch inputs 9126-1 and 9126-2, respectively, and a common node 9128. The gates of the PMOS transistor 9114 and the NMOS transistor 9118 are coupled together and to the second latch input 9126-2. The gates of the PMOS transistor 9116 and the NMOS transistor 9120 are coupled together and to the first latch input 9126-1. The NMOS transistor 9122 includes drain-source terminals coupled between the common node 9128 and ground, and includes a gate coupled to a latch signal 9130. The NMOS transistor 9122 controls the current of the latch 9102 during sensing, and functions as a logic switch during latching.

The isolation circuit 9104 isolates the memory cells 9112-1, 9112-2 during standby and isolates the latch 9102 from a write circuit (not shown) during write. In one embodiment, the isolation circuit 9104 comprises NMOS transistors 9132 and 9134 including drain-source terminals coupled between the respective first and second latch inputs 9126-1, 9126-2 and a bit line (BL) terminal of the respective first and second memory cells 9112-1, 9112-2, and including a gate coupled to a read delay (READDLY) signal 9136. The read delay signal 9136 is set at a time after the memory cells 9112 are read sufficient for the latch 9102 to latch the read content of the memory cells 9112. The read delay signal 9136 also is set during standby and during writes to the memory cells 9112.

The precharge circuit 9106 precharges the voltage applied to the latch 9102 and the latch inputs 9126 before reading the memory cells 9112. In one embodiment, the precharge circuit 9106 comprises a PMOS transistor 9138 and an NMOS transistor 9140 coupled together as a transfer gate between the gates of the PMOS transistors 9114, 9116. The gates of the NMOS transistor 9140 and the PMOS transistor 9138 are controlled by a precharge signal 9142 and an inverted precharge signal (PRECHARGEB) 9144, respectively. During precharge, the PMOS transistor 9138 and the NMOS transistor 9140 equalize the voltage on the first and second latch inputs 9126-1 and 9126-2.

The margin circuit 9108 provides a current to the latch 9102 sufficient to ensure that a definite margin voltage exists between the pair of memory cells 9112-1, 9112-2. In one embodiment, the margin circuit 9108 comprises NMOS transistors 9146, 9148, 9150, 9152. The drain-source terminals of the NMOS transistors 9146, 9148 are coupled together in series, and the series connected NMOS transistors 9146, 9148 are coupled in parallel between the bit line (BL) terminal and a common line (CL) terminal of the memory cell 9112-1. The gates of the NMOS transistors 9146, 9148 are coupled to receive a first fuse control gate margin control (VCGFSML) signal 9154 and a first fuse floating gate margin control (VFGFSML) signal 9156, respectively. The drain-source terminals of the NMOS transistors 9150, 9152 are coupled together in series, and the series connected NMOS transistors 9150, 9152 are coupled in parallel between the bit (BL) terminal and the common line (CL) terminal of the memory cell 9112-2. The gates of the NMOS transistors 9150, 9152 are coupled to receive a second fuse control gate margin control (VCGFSMR) signal 9158 and a second fuse floating gate margin control (VFGFSMR) signal 9160, respectively.

The fuse cell element 9100 also has a mass margining feature to ensure a definite margin voltage exists between the fuse pair (memory cells 9112-1, 9112-2). Mass margining refers to all fuses (in a predefined portion of the memory, such as all in a bank or page or device) being exercised at the same time, resulting in shortened test time. The NMOS transistors 9146, 9148 and the NMOS transistors 9150, 9152 function as dummy transistors which are a pair of series connected transistors that are connected in parallel with the respective memory cells 9112-1, 9112-2. One dummy transistor simulates a control gate transistor of a memory cell 9112. The other dummy transistor simulates a floating gate transistor of the memory cell 9112. By comparing a reference voltage on the dummy pair of NMOS transistors 9146, 9148 and the control gate voltage 9193 of the memory cell 9112-2, and likewise by comparing a reference voltage on the dummy pair of NMOS transistors 9150, 9152 and the control gate voltage 9192 of the memory cell 9112-1, the state of the pair of memory cells 9112-1, 9112-2 is known. Hence, a definite voltage is observed which is related to the margin of the memory cell fuse pair. This definite voltage is called the voltage of the memory cell to more easily explain the fuse cell element and its operation.

In an alternate embodiment, mass margining applies a current offset from the supply voltage VCC on the power supply line 9124 or from a ground line to the bit line of one of the memory cells 9112-1 and 9112-2 during sensing. A MOS transistor (not shown) includes drain-source terminals coupled between the power supply line 9124 or the ground line and the bit line of one of the memory cells 9112-1 and 9112-2, and includes a gate biased at a certain voltage.

The fuse apparatus can also allow multilevel fuse sensing by setting an appropriate reference voltage on one fuse control gate and comparing it against a reference value on the other fuse control gate (or against a reference value on the dummy transistor gate of the other side) of the differential comparator.

In one multilevel fuse sensing embodiment, one of the fuse control gate voltages 9192 or 9193 of one of the memory cells 9112-1, 9112-2 is set to an appropriate reference voltage, and compared against a reference value on the control gate of the other of the memory cells 9112-1, 9112-2. In another embodiment, the comparison is against a reference value on the gate on one of the NMOS transistors 9146, 9148, 9150, 9152 corresponding to the control gate of the other of the memory cells 9112-1, 9112-2.

The fuse may be programmed using a constant current mass fuse programming, in which all the bias currents to all fuses are provided at the same time for programming to save time.

As an illustrative example, setting the fuse control gate voltage (VCGFSL) 9192 and the fuse control gate voltage (VCGFSR) 9193 equal to each other and equal to approximately 1.5 volts, a difference in the floating gate voltages causes the latch 9102 to flip according to the difference. In one embodiment, the floating gate difference is obtained by erasing one of the memory cells 9112-1, 9112-2 and programming the other to store one binary state of the fuse element or reversing the program and erase state of the memory cell pair to store the opposite fuse state. In one embodiment, the fuse margin is tested to ensure the fuse memory cells 9112 have sufficient margin voltage difference to prevent the floating gates from losing the information, and thus preventing the latch 9102 from flipping incorrectly.

In one embodiment, the fuse margin test is performed to verify that an erased memory cell 9112 has a certain difference margin voltage. For the sake of illustration in this margin test, the memory cell 9112-1 is erased. The fuse control gate voltage (VCGFSR) 9193 is set to 0 volts to turn off the memory cell 9112-2. The fuse control gate voltage (VCGFSL) 9192 is set to the operating voltage, e.g., 1.5 volts. The first fuse control gate margin control (VCGFSML) signal 9154 applied to the NMOS transistor 9146 and the first fuse floating gate margin control (VFGFSML) signal 9156 applied to the NMOS transistor 9148 are set to zero. The second fuse control gate margin control (VCGFSMR) signal 9158 applied to the NMOS transistor 9150 is set to the operating voltage, e.g., 1.5 volts. In order to observe the voltage of the memory cell 9112-1, the second fuse floating gate margin control (VFGFSMR) signal 9160 is varied until the voltage on the second latch input 9126-2 switches from high to low. At this event, the voltage of the first memory cell 9112-1 equals the voltage applied to the NMOS transistor 9152, i.e., the second fuse floating gate margin control (VFGFSMR) signal 9160.

In order to test that the voltage of the memory cell 9112-1 is greater than the margin voltage for more reliable operation, the second fuse floating gate margin control (VFGFSMR) signal 9160 is set equal to a predetermined first voltage margin, and the voltage of the memory cell 9112-1 is greater than the desired voltage margin if the voltage on the latch input at 9126-2 is still high.

In one embodiment, the fuse margin test is performed to verify that a programmed memory cell 9112 has a certain difference margin voltage. For the sake of illustration in this margin test, the memory cell 9112-1 is programmed. The fuse control gate voltage (VCGFSR) 9193 is set to 0 volts to turn off the memory cell 9112-2. The fuse control gate voltage (VCGFSL) 9192, the second fuse control gate margin control (VCGFSMR) signal 9158 applied to the NMOS transistor 9150, and the first fuse control gate margin control (VCGFSML) signal 9154 applied to the NMOS transistor 9146 are set to the operating voltage, e.g., 1.5 volts. In order to observe the voltage of the memory cell 9112-1, the second fuse floating gate margin control (VFGFSMR) signal 9160 is set to a value which simulates a predetermined weakly erased but still acceptably reliable memory cell. The first fuse floating gate margin control (VFGFSML) signal 9156 applied to the NMOS transistor 9148 is varied until the voltage on the second latch input 9126-2 switches from low to high. At this event, the voltage of the first memory cell 9112-1 equals the voltage applied to the NMOS transistor 9148, i.e., the first fuse floating gate margin control (VFGFSML) signal 9156.

In order to test that the voltage of the memory cell 9112-1 is greater than the margin voltage desired for more reliable operation, the first fuse floating gate margin control (VFG- FSML) signal 9156 is set equal to a predetermined first voltage margin, and the voltage of the memory cell 9112-1 is greater than the voltage margin if the voltage on the second latch input 9126-2 is still low.

In another embodiment, the fuse margin test is again performed to verify that a programmed memory cell 9112 has a certain difference margin voltage. For illustration, the memory cell 9112-1 is again programmed. The fuse control gate voltage (VCGFSR) 9193 is set to 0 volts to turn off the memory cell 9112-2. The first fuse control gate margin control (VCGFSML) signal 9154 applied to the NMOS transistor 9146 and the first fuse floating gate margin control (VFGFSML) signal 9156 applied to the NMOS transistor 9148 are set to zero. The fuse control gate voltage (VCGFSL) 9192 and the second fuse control gate margin control (VCGFSMR) signal 9158 applied to the NMOS transistor 9150 are set to the operating voltage, e.g., 1.5 volts. In order to observe the voltage of the memory cell 9112-1, the second fuse floating gate margin control (VFGFSMR) signal 9160 is set to a value which simulates a predetermined weakly erased but still acceptably reliable memory cell. If the voltage on the first latch input 9126-1 is high, then the voltage of the first memory cell 9112-1 is less than the first margin voltage. The fuse control gate voltage (VCGFSL) 9192 is set to a higher voltage, e.g., 3.5 volts. If the voltage on the first latch input 9126-1 is high, then the voltage of the first memory cell 9112-1 is less than the second margin voltage. The voltage margin equals the difference between the two tested voltages multiplied by a control gate coupling ratio. In this example, the margin voltage is 0.4 volts (equals a coupling ratio of 0.2 times the difference between the 3.5 volts and the 1.5 volts). Thus the voltage of the first memory cell 9112-1 has at least a margin voltage equal to 0.4 volts.

The margin of the entire fuse element 9100 is a function of the margins for both memory cells 9112-1 and 9112-2. Thus, similar procedures are performed to test the margin of the complementary memory cell. The present invention allows both memory cell margins to be tested independently, such as the testing described above. In another embodiment, the fuse margin is tested by the differential swing in the voltages applied to the control gate. The fuse control gate voltage (VCGFSL) 9192 applied to the first memory cell 9112-1 and the fuse control gate voltage (VCGFSR) 9193 applied to the second memory cell 9112-2 are swung in opposite directions by a voltage VM and the state of the latch (e.g., the voltage on the first latch input 9126-1 and the second latch input 9126-2) are tested. The margin voltage equals a fixed coupling ratio times the voltage VM.

The fuse cell element 9100 further comprises a read bias current circuit 9161, a programming inhibit circuit 9166, an inverter 9181, and a fuse forcing circuit 9186. The read bias current circuit 9161 provides bias current for reading of the memory cells 9112. In one embodiment, the read bias current circuit 9161 comprises an NMOS transistor 9162. The NMOS transistor 9162 includes drain-source terminals coupled between the common line (CL) input terminals of the memory cells 9112-1, 9112-2 and a fuse common line terminal voltage (VCLFS) signal 9163, and includes a gate coupled to a read bias voltage (VRBIAS) 9164.

The programming inhibit circuit 9166 inhibits the programming of the memory cells 9112-1, 9112-2. In one embodiment, the programming inhibit circuit 9166 comprises PMOS transistors 9167, 9168 and NMOS transistors 9169, 9170, 9171, 9172, 9173.

The NMOS transistor 9173 provides bias current for programming the memory cells. Specifically, the NMOS transistor 9173 includes drain-source terminals coupled between the common node formed of the source terminals of the NMOS transistors 9169, 9170 and ground, and includes a gate coupled to receive a fuse bias voltage (VBFS) 9174.

The drain-source terminals of the PMOS transistor 9167 and the NMOS transistor 9169 are series coupled between the power supply line 9124 and the drain terminal of the NMOS transistor 9173. The gates of the PMOS transistor 9167 and the NMOS transistor 9169 are coupled together and to a fuse bit line signal (BITLNFS) 9175.

The NMOS transistor 9171 isolates the memory cell 9112-1 from the read circuit during read. The NMOS transistor 9171 includes drain-source terminals coupled between the bit line (BL) terminal of the memory cell 9112-1 and the common node formed of the PMOS transistor 9167 and the NMOS transistor 9169, and includes the gate coupled to receive a bit line enabled (BLEN) signal 9176.

The drain-source terminals of the PMOS transistor 9168 and the NMOS transistor 9170 are series coupled between the power supply line 9124 and the drain terminal of the NMOS transistor 9173. The gates of the PMOS transistor 9168 and the NMOS transistor 9170 are coupled together and to an inverted fuse bit line signal (BITLNFSB) 9177.

The NMOS transistor 9172 isolates the memory cell 9112-2 from the read circuit during read. The NMOS transistor 9172 includes drain-source terminals coupled between the bit line (BL) terminal of the memory cell 9112-2 and the common node formed of the PMOS transistor 9168 and the NMOS transistor 9170, and includes a gate coupled to receive the bit line enabled (BLEN) signal 9176.

The isolation transfer gate 9110 isolates the sensing circuit (the latch 9102) from the external circuits. In one embodiment, the isolation transfer gate 9110 comprises a PMOS transistor 9179 and NMOS transistor 9180 coupled together as a transfer gate between the second latch input 9126-2 and the input of the inverter 9181. The gates of the PMOS transistor 9179 and the NMOS transistor 9180 are controlled by complimentary enable output signals (ENOUT, ENOUTB) 9182 and 9183, respectively. The inverter 9181 provides an output (FBIT) signal 9184 indicative of the contents of the memory cells 9112.

The fuse forcing circuit 9186 forces memory cells 9112-1, 9112-2 to selected storage states. In one embodiment, the fuse forcing circuit 9186 comprises a PMOS transistor 9187 and an NMOS transistor 9188. The NMOS transistor 9188 and the PMOS transistor 9187 are coupled together as a transfer gate between the common node of the isolation transfer gate 9110 and the input of the inverter 9181 and selectively to either ground or the fuse bit line signal (BITLNFSB) terminal 9177. The gates of the NMOS transistor 9188 and the PMOS transistor 9187 are coupled to a fuse forcing (FORCEFS) signal 9189 and an inverted fuse forcing (FORCEFSB) signal 9190, respectively, to enable the fuse force circuit 9186.

The fuse cell element 9100 may be used for multi-level voltage storage of multiple bits per cell. The voltages applied to the memory cells 9112-1, 9112-2 are controlled by applying the multiple bits to a digital-to-analog converter (not shown) for applying an analog voltage to the memory cells 9112. Likewise, memory cells 9112 may be read by converting the voltage therefrom into multiple bits by an analog-to-digital converter (not shown). The multi-level fuse cells may be used in circuits having a plurality of fuse cell elements 9100.

Figure 9C:
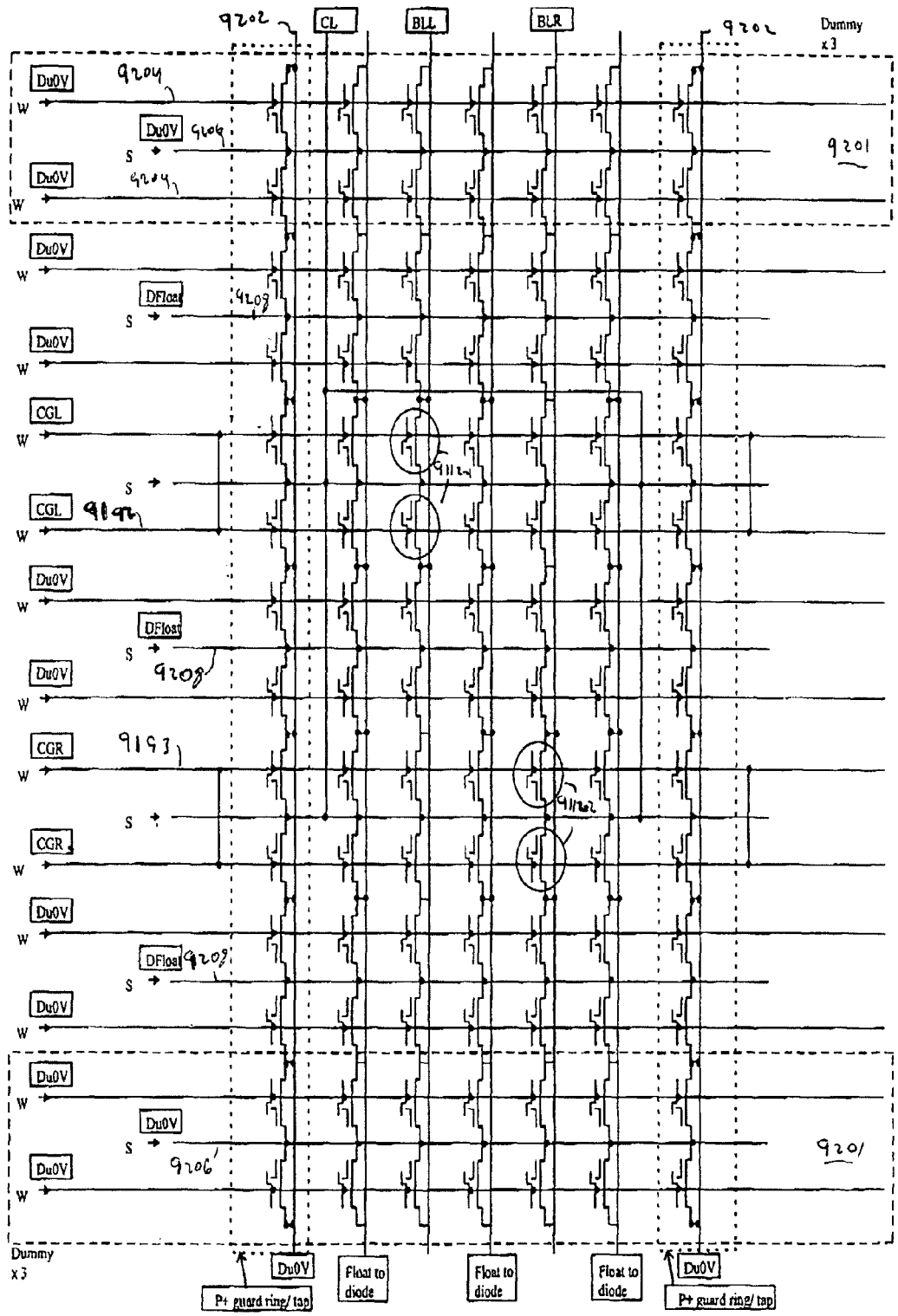
FIG. 9C is a block diagram illustrating memory cells of the fuse circuit of FIG. 9B.

FIG. 9C is a block diagram illustrating memory cells 9112-1 and 9112-2 of the fuse cell element 9100.

In this embodiment, the columns of flash transistors are arranged such that two memory cells, top and bottom are used for each fuse cell 9112-1 and 9112-2, respectively. The two cells average out top and bottom process non-uniformity. Other averaging combinations may be used such as 3, 4 or 5. A dummy row 9201 is disposed on the top and on the bottom and a dummy bit line 9202 is disposed on the right and on the left. A dummy source line 9208 immediately on the top and bottom is left floating. This floating avoids leakage on the bit lines. Dummy source lines 9206 on the uppermost top and lowermost bottom are grounded. The dummy word lines 9204 are connected to ground. It should be noted that except where the memory cells are used, there is no bit line contact to other dummy memory cells.

Figure 10:
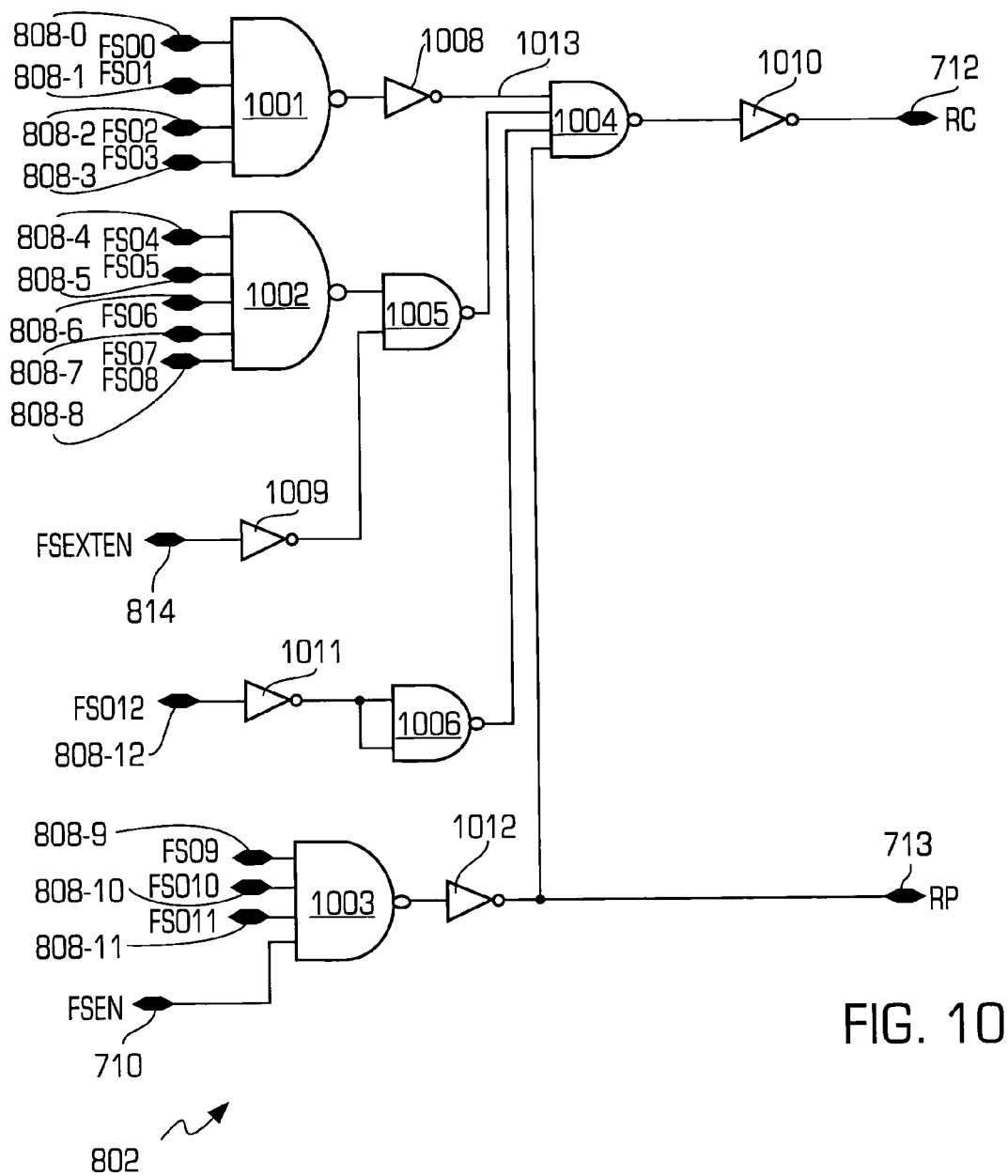
FIG. 10 is a block diagram illustrating a fuse redundancy decoder of the fuse redundancy decoder of FIG. 8.

FIG. 10 is a block diagram illustrating the redundancy decoder (reddec1) 802.

The redundancy decoder (reddec1) 802 comprises a plurality of NAND gates 1001, 1002, 1003, 1004, 1005, 1006 and inverters 1008, 1009, 1010, 1011, 1012. The NAND gate 1001 and the inverter 1008 generate an AND signal 1013 of the fuse states output FSO<0:3> 808-0 through 808-3 and apply the AND signal 1013 to a first input of the NAND gate 1004. The NAND gate 1002 generates a NAND signal from the applied fuse states output FSO<4:8> 808-4 through 808-8 and applies the NAND signal to a first input of the NAND gate 1005. The inverter 1009 inverts the fuse extension (FSEXTEN) signal 814 and applies the inverted signal to a second input of the NAND gate 1005. The output of the NAND gate 1005 is applied to a second input of the NAND gate 1004. The inverter 1011 and the NAND gate 1006 provide the fuse state output FSO<12> 808-12 to a third input of the NAND gate 1004. The NAND gate 1003 and the inverter 1012 generate the redundant page (RP) signal 713, which also is applied to a fourth input of the NAND gate 1004, as an AND of the fuse states output FSO<9:11> 808-9 through 808-11 and the fuse state enable (FSEN) signal 710. The inverter 1010 provides the redundant column (RC) signal 712 in response to the output of the NAND gate 1004.

Refer again to FIG. 7. The redundant column decoder (rcydec1) 702 generates the y-driver enable (RCYDRVR) signal 208 in response to the redundant column (RCx) signals 712, the y-driver fuse enable all (FENYDRVRPALL) signal 626, and the y-driver fuse enable signal 625 applied thereto.

Figure 11:
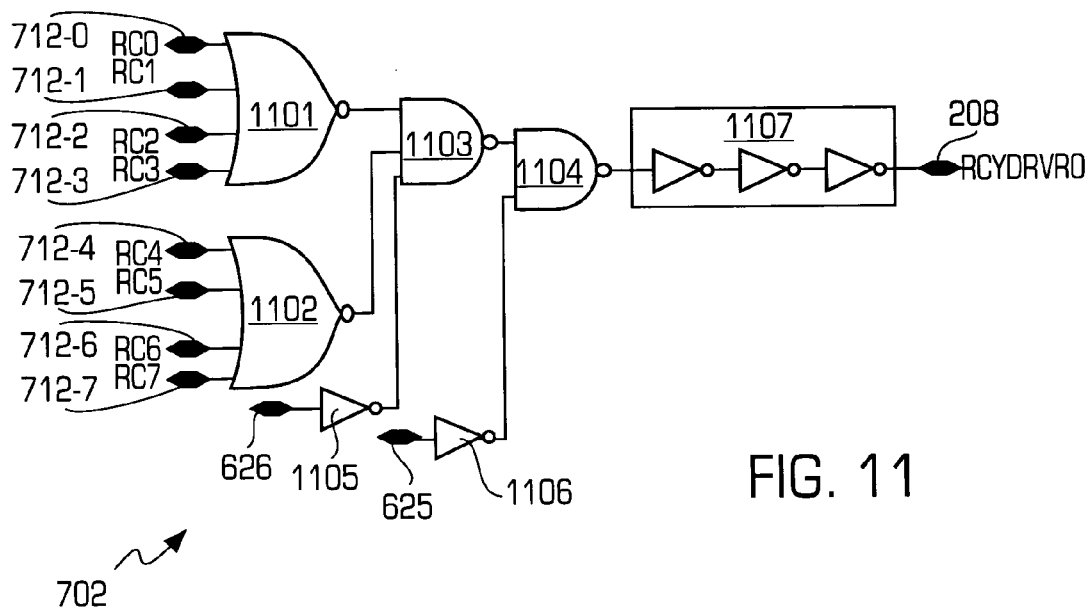
FIG. 11 is a block diagram illustrating a redundant column decoder of the redundancy decoder of FIG. 7.

FIG. 11 is a block diagram illustrating the redundant column decoder (rcydec1) 702.

The redundant column decoder (rcydec1) 702 comprises NOR gates 1101 and 1102, NAND gates 1103, 1104, and inverters 1105, 1106, and 1107. The NOR gate 1101 generates a NOR of the redundancy column (RC) signals 712-0 through 712-3. The NOR gate 1102 generates a NOR of the redundancy column (RC) signals 712-4 through 712-7. The outputs of the NOR gates 1101 and 1102 are coupled to corresponding inputs of the NAND gate 1103. The NAND gate 1103 is enabled by the complement of the y-driver fuse enable all (FENYDRVRPALL) signal 626 from the inverter 1105. The NAND gate 1104 and the inverter 1107 form an AND gate to generate the y-driver enable signal (ENYDRV) signal 208 from the output of the NAND gate 1103 when enabled by the complement of the y-driver fuse enable signal 625 from the inverter 1106.

Refer again to FIG. 7. The redundant page decoder (rpydecl) 703 generates the page y-driver enable (rpydrvr) signal 612 in response to the redundant page (RPx) signals 713, the y-driver fuse enable all (FENYDRVPALL) signal 626 and the y-driver fuse enable signal 625 applied thereto.

Figure 12:
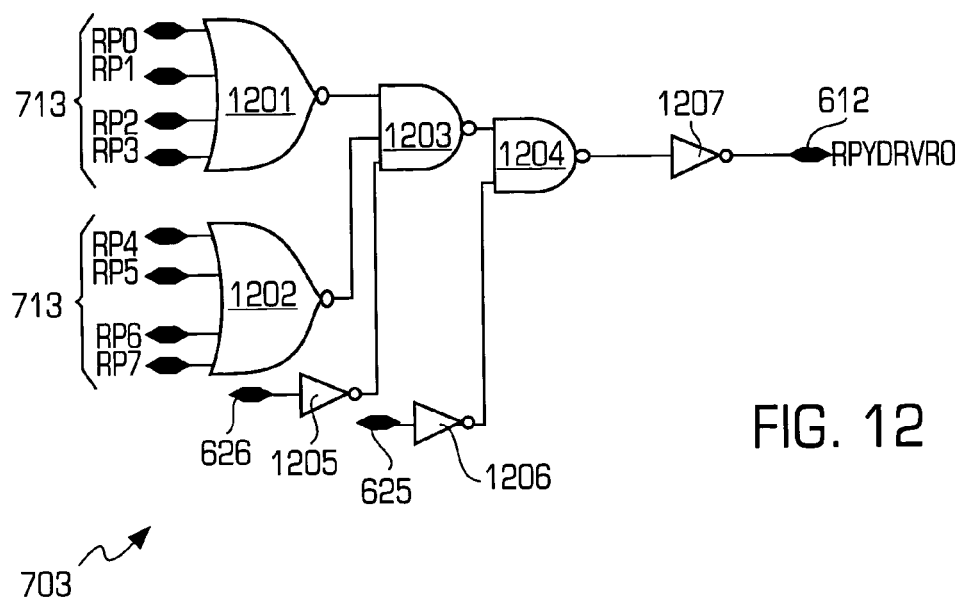
FIG. 12 is a block diagram illustrating a redundant page decoder of the redundancy decoder of FIG. 7.

FIG. 12 is a block diagram illustrating the redundant page decoder (rpydecl) 703.

The redundant page (rpydecl) decoder 703 comprises NOR gates 1201 and 1202, NAND gates 1203 and 1204, and inverters 1205, 1206 and 1207, which are arranged in a similar manner as the NOR gates 1101 and 1102, NAND gates 1103 and 1104, and inverters 1105, 1106, and 1107, respectively.

It may be useful to summarize some of the embodiments of this invention that have been previously discussed before describing more details of the redundancy controller (REDCNTRL) 186. As described above, to load, program, and read data, the multilevel memory system 100 operates on a page of 512 regular plus 16 extension data bytes at the same time. Each selected row of memory includes 8 pages of data. A circuit block including a y-driver and a page select circuit independently operate on a single selected column coupled to a memory cell capable of storing 4 bits of multilevel data. Each page select can multiplex 1 of 8 columns (or pages) in the array to its associated y-driver. A byte select circuit coupled to a pair of y-drivers can enable a byte of data to be loaded in or read out of the y-drivers. Selecting a particular byte on a selected page on a selected row addresses a particular byte of data in the memory. Thus, on a selected page, addressing a particular byte is the same as addressing a particular pair of y-drivers. Due to page mode operation, column redundancy in this system replaces a bad y-driver 110 and its associated column with a good redundant y-driver 112 and its associated column. The redundancy controller (REDCNTRL) 186 controls the replacement by matching the selected byte and page address (column address) to the bad column addresses previously stored in the fuse circuit (FUSECKT) 182. Thus, the redundancy controller (REDCNTRL) 186 disables a byte select circuit 140 or 144 and enables a redundant byte select circuit 142 coupled to a pair of redundant y-drivers 112. A byte of data is thus rerouted from the bad column pair to a good redundant column pair. With 8 redundant y-drivers 112, up to 4 bytes can be redirected for each one of the 8 pages.

Refer again to FIG. 6. During load in or read out of byte data to or from the latches 402 in the y-drivers 110, the redundancy controller 186 identifies whether the selected column address is bad. The redundancy controller 186 employs the redundancy address decoders 601 through 604 to detect the bad address by comparing the addresses A<0:11> 623 and AEXTEN 624 with the fuse (addresses) state signals FS 627 that correspond to previously stored bad addresses in the fuse circuit (FUSECKT) 182. If a bad address is found (address comparison is true), the redundant y-driver enable signal 208 then disables the appropriate address decoding circuitry, such as the byte-predecoder 152, the byte address counters 163 and 165, coupled to the selected y-drivers 110 through the inverted read clock (RDCLKB) 314, the load data clock (LDDATACLK) 315, and the byte select (BYTESEL) signals 342. This prevents reading out the data from or loading in the data into the selected y-drivers 110. The redundancy controller 186 instead directly enables the data from or into the redundant y-drivers 112, as shown in FIGS. 2 and 3. The signal 208 from the redundancy controller 186 is coupled to signal 341 of the redundant byte select circuit 142 (represented by the byte select circuit 140 of FIG. 3) to select the associated redundant y-drivers 112. In another embodiment, the signals 208-0 through 208-3 enable or disable the appropriate decoding circuitry (not shown) at the input/output buffers 196 instead of the y-drivers. In this approach the speed of reading out or loading in the data from the redundant y-drivers 112 is faster due to eliminating delay paths associated with the serial operations of address decoding, bad address matching, y-driver enabling, and I/O. In this alternate embodiment, the regular and redundant y-drivers are all enabled while, in parallel, the bad address matching is performed and the good for bad data replacement is done in the input/output buffers 196.

For enabling the compare-OR (COMPOR) or inverted compare-OR (COMPBOR) function, the redundancy address sequencer 605 detects the address as follows. (The compare-OR function is described in more detail above.) One usage of the compare-OR function is to indicate the operating voltage range of the memory cells. For the system 100 shown in FIG. 1, a page mode operation is done at the system hierarchy in which the memory operation is done on multiple cells, or a page, at the same time to speed up the write-read data rate. For example, in one embodiment, a page has 1024 cells, and 1024 y-drivers are used. The compare-OR function is done for all 1024 y-drivers at the same time. If a bad column exists, the corresponding "bad" y-driver 110 is disabled from participating in the compare-OR function. In one embodiment, the disabling is done by cycling through the addresses of all 1024 y-drivers (actually cycling thru 512 byte addresses on the selected page corresponding to all 512 y-driver pairs) while comparing those addresses individually with the stored bad addresses. If a match is found, the matched y-driver 110 is disabled. This embodiment uses 512 timing cycles. In another preferred embodiment, the stored bad address from the fuse is used and then superimposed (multiplexed directly to the address decoder input) on the address decoder for the 1024 y-drivers 110 to directly disable the compare-OR function in the bad y-driver 110. This embodiment uses a number of timing cycles equal to the number of fuse addresses. For example, column redundancy is implemented with 32 sets of fuses replacing possibly 32 bad bytes and therefore uses only 32 cycles. The 32 bad bytes are replaced using the 4 redundant y-driver circuits 202 that are each capable of accessing 8 pages as described above in conjunction with FIGS. 2 and 3. The second embodiment is faster than cycling through the 512 address cycles. In one embodiment of cycling through all the y-driver addresses, the regular byte address counter 163 and the byte predecoder are part of the redundancy address sequencer 605, and are used to provide decoding for all y-drivers.

For all embodiments, the fuse address for column redundancy is enabled for each column fuse by a dedicated enable fuse signal 710 (FIG. 8). For example, in FIGS. 6, 7, and 8, there is one 710 output from each one of the eight decoders 701 from each one of the 4 decoders 601-4. So there are 8×4=32 separate 710 signals in the system. Each one of the 32 signals 710 corresponds to and enables one of the 32 redundancy bytes. When the fuse enable signal 710 is low, the redundant column signal 712 and the redundant page signal 713 (FIGS. 8 and 10) are also low, e.g., disabled.

In another embodiment, the redundancy address sequencer 605 cycles through only the fuse addresses that have been enabled for column redundancy. This approach has an even shorter time usage associated with the redundancy address sequencer 605. Here the fuse enable signal 710 is used to control the redundancy address sequencer 605 to cycle through only enabled fuse addresses by using additional control logic (not shown). For example, if one fuse address set is used to fix one bad column (pair), then only one cycle is used. The fuse address for column redundancy is enabled for each column fuse by a dedicated enable fuse signal 710 (FIG. 8). When the fuse enable signal 710 is low, the output signals, the redundant column signal 712 and the redundant page signal 713 (FIG. 8) are low, e.g., disabled. If no column redundancy is used, the redundancy controller 186 is not activated due to all the fuse enable signals 710 being low. Thus the fuse enable column redundancy (FSENCOLRED) signal 611, which couples through the logic circuit 160, disables the redundancy address sequencer 605, and hence no additional time is wasted. Although this embodiment improves performance, it uses more control logic (which is not shown).

In one embodiment, the redundant address sequencer 605 shown in FIG. 6 cycles through all the fuse addresses, e.g., 32 times for 32 fuse address sets, to directly access the y-driver latch 416 to disable the compare-OR function in the bad y-driver as described above and described below in more detail. The redundancy address sequencer 605 generates the reset no-compare-OR (RSTNOCMPORL) signal 334, an enable redundant oscillator (ENREDOSC) 617, address (AI) signals 631, inverted address (AIB) signals 632, an address extension (AEXTI) signal 633, and the enable byte decoder redundancy reset (ENBTDECREDRST) signal 616. The enable redundant oscillator (ENREDOSC) 617 enables a redundant oscillator (not shown) to provide timing for the redundant address sequencer 605. The signals 631, 632, 633 and 616 cycle through all the fuse addresses, and couple to the byte pre-decoder 152 to directly access the y-driver latch 416 in the "bad" y-drivers. The reset no-compare-OR signal 334 is used to reset the y-driver redundancy latches 416 in the accessed bad y-driver pairs during each of the 32 cycles if the bad address matches one of the addresses on the selected page. The redundancy address sequencer 605 receives the address signals 623 provided from the address counters 162, 163, and 165, a redundant oscillator clock (REDOSCLK) 629 provided from the redundant oscillator (not shown), an address extension (AEXT) signal 630 provided from the spare byte address counter 165, and the fuse state signals FS 627 that correspond to previously stored bad addresses from the fuse circuit (FUSECKT) 182. The input logic 160 provides a begin redundant address sequencing signal (BEGREDADDSEQ) 628 to initiate the redundancy address sequencer 605.

Figure 13:
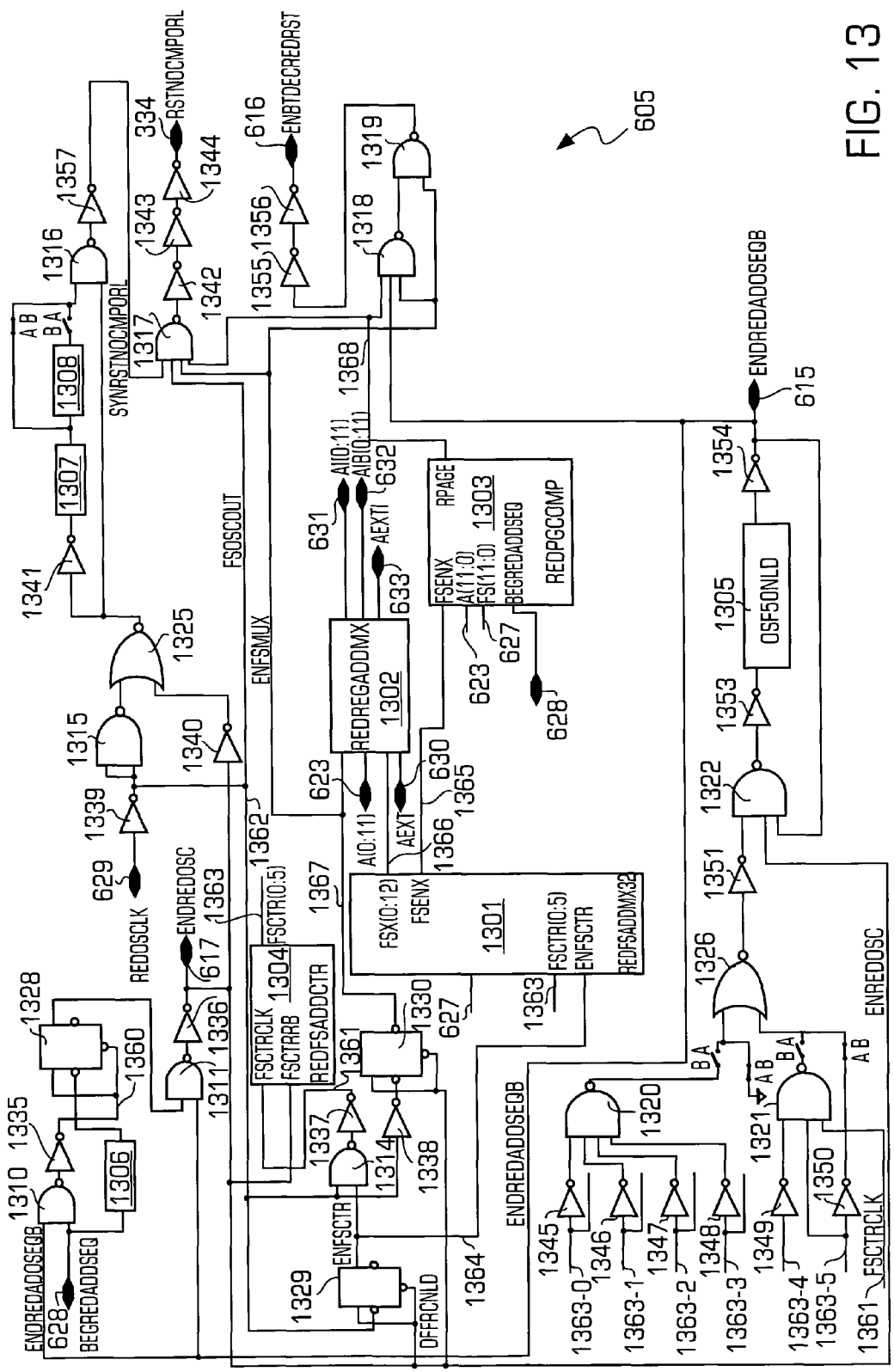
FIG. 13 is a block diagram illustrating a redundancy address sequencer of the redundancy controller of FIG. 6.

FIG. 13 is a block diagram illustrating the redundancy address sequencer 605.

The redundancy address sequencer 605 comprises a first redundant fuse address multiplexer (redfsaddmx32) 1301, a redundant regular address multiplexer (redregaddmx) 1302, a redundant page comparator (redpgcomp) 1303, a redundant fuse address counter (redfsaddctr) 1304, a oneshot circuit (OSF50NLD) 1305, a plurality of delay circuits 1306, 1307 and 1308, a plurality of NAND gates 1310, 1311, 1314 through 1322, a plurality of NOR gates 1325 and 1326, a plurality of D flip-flops 1328 through 1330, and a plurality of inverters 1335–1351 and 1353–1357.

The NAND gate 1314 and the inverter 1337 generate a fuse counter clock (FSCTRCLK) 1361 as the logic AND of the Q output from the D flip-flop 1329 and a fuse oscillator output signal 1362. The D flip-flop 1329 provides an enable fuse counter (ENFSCTR) signal 1364 in response to the fuse oscillator output signal 1362 applied to the clock input of the D flip-flop 1329 and to the enable redundant oscillator (ENREDOSC) signal 617 applied to the reset and Q inputs of the D flip-flop 1329. The inverter 1339 generates the fuse oscillator output signal 1362 in response to the redundant oscillator clock (REDOSCLK) 629. The redundant fuse address counter 1304 generates fuse counter (FSCTR) signals 1363.

The first redundant fuse address multiplexer 1301 receives the fuse state signals FS 627, the fuse counter signals 1363, and the enable fuse counter (ENFSCTR) signal 1364, and generates a multiplexed fuse enable (FSENX) signal 1365 and multiplexed fuse states (FSX) 1366. The first redundant fuse address multiplexer (redfsaddmx32) 1301 is used to multiplex out one fuse address set (each fuse address set corresponds to a stored bad address), out of 32 fuse address sets (627) at a time during each of the 32 timing cycles. The one multiplexed out fuse address set is multiplexed fuse address set FSX 1366. The multiplexed fuse enable (FSENX) signal 1365 indicates whether the associated multiplexed fuse address set FSX 1366 is being used for redundancy. The multiplexed fuse address set FSX 1366 and the multiplexed fuse enable (FSENX) signal 1365 are used to access the bad y-driver latch 416 to disable the compare-OR functions under the control of the redundant fuse address counter (redfsaddctr) 1304 which cycles through all 32 fuse addresses.

The redundant regular address multiplexer (redregaddmx) 1302 is used to enable to its outputs 631 and 632, either the regular byte/page address A<0:11> 623 if redundancy is not used or the multiplexed fuse address set FSX 1366 if redundancy is invoked (by the ENFSMUX signal 1367 described below). The redundant regular address multiplexer 1302 also provides buffering for its outputs, address signals 631 and 632, that couple to the inputs of the byte address predecoder 152 which accesses the y-drivers. Thus, if redundancy is invoked, the multiplexer 1302 forces the byte address predecoder 152 to select the bad y-driver address stored in the multiplexed fuse address set FSX 1366 during each of the 32 cycles.

The redundant page comparator (redpgcomp) 1303 provides a logic signal, redundant page (RPAGE) 1368, which couples to logic circuits generating the reset no-compare-OR signal (RSTNOCMPORL) 334 and to the enable byte decoder redundancy reset (ENBTDECREDRST) signal 616. As described above, the enable byte decoder redundancy reset signal 616 enables the byte pre-decoder 152 and byte address counters 163 or 165. The enable byte decoder redundancy reset signal 616 is used in the operation of the spare array 104.

The redundant page (RPAGE) 1368 is invoked when the selected page address A<9:11> 623 matches a stored fuse (bad) page address FS<9:11> 627 (page address matching) and the multiplexed fuse enable (FSENX) signal 1365 indicates the associated multiplexed fuse address set FSX 1366 is being used for redundancy (fuse enabling). This prevents resetting the redundant latch 416 on a good y-driver based on a default state in the multiplexed fuse address set FSX 1366 sent out by the redundant regular address multiplexer 1302 in some instances. The redundant latch 416 is reset by a true state of the signal reset no-compare-OR (RSTNOCMPORL) 334.

As described below, the redundant address sequencer 605 also generates the end redundant address sequencing (ENDREDADOSEQB) signal 615 to signal the end of the action of the redundant address sequencer 605. The NAND gate 1310 and the inverter 1335 form an AND signal 1360 from the begin redundant address sequencing signal 628 and the end redundant address sequencing signal 615, and apply the AND signal 1360 to the reset and Q inputs of the D flip-flop 1328. The delay circuit 1306 delays the begin redundant address sequencing signal 628 for clocking the D flip-flop 1328. The NAND 1311 and the inverter 1336 generate the enable redundant oscillator (ENREDOSC) signal 617 as the AND of the output of the D flip-flop 1328 and the end redundant address sequencing signal 615. The enable redundant oscillator signal 617 is applied to a first input of the redundant fuse address counter 1304.

Figure 14:
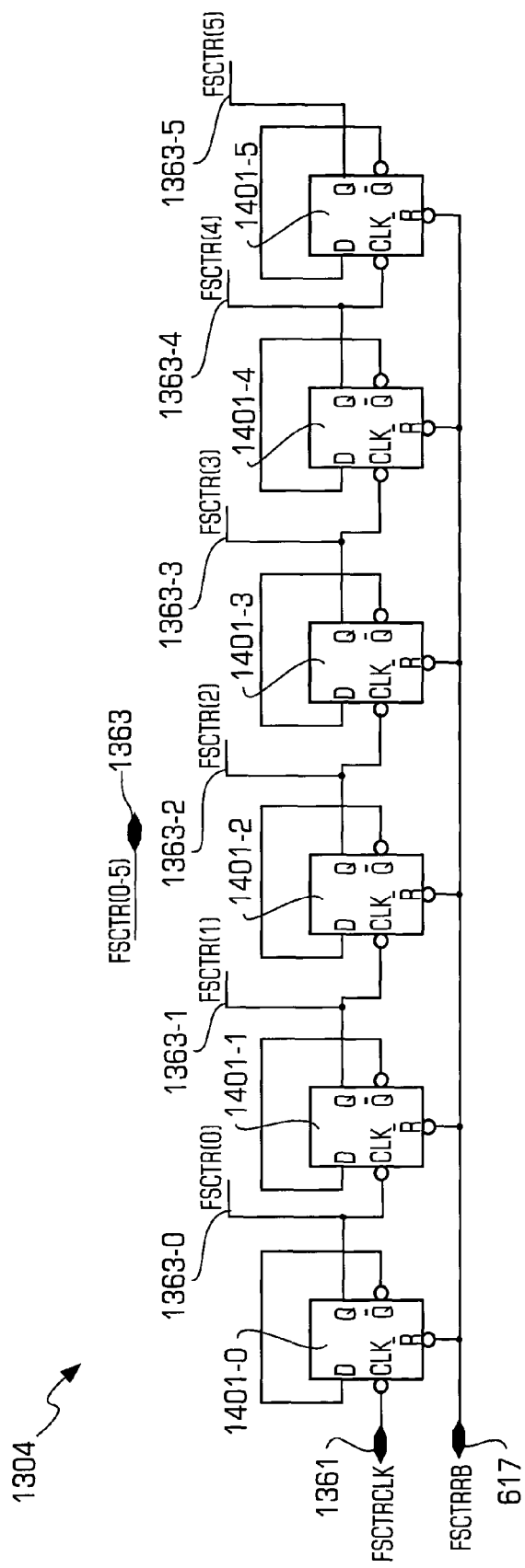
FIG. 14 is a block diagram illustrating a redundant fuse address counter of the redundancy address sequencer of FIG. 13.

FIG. 14 is a block diagram illustrating the redundant fuse address counter 1304 that is used to cycle through the fuse address sets.

The redundant fuse address counter (redfsaddctr) 1304 comprises a plurality of D flip-flops 1401-0 through 1401-5. The fuse counter clock (FSCTRCLK) signal 1361 is applied to the clock input of the D flip-flop 1401-0. The Qbar output of each flip-flop 1401 is coupled to the D input of the same flip-flop 1401. The Q output of the flip-flops 1401-0 through 1401-5 is coupled to the clock input of the next flip-flop 1401 (except the flip-flop 1401-5) and is provided as the fuse counter (FSCTR(x)) signals 1363-0 through 1363-5, respectively, in response to the enable redundant oscillator (ENREDOSC) signal 617 coupled to the reset input of the flip-flops 1401-0 through 1401-5.

Figure 15:
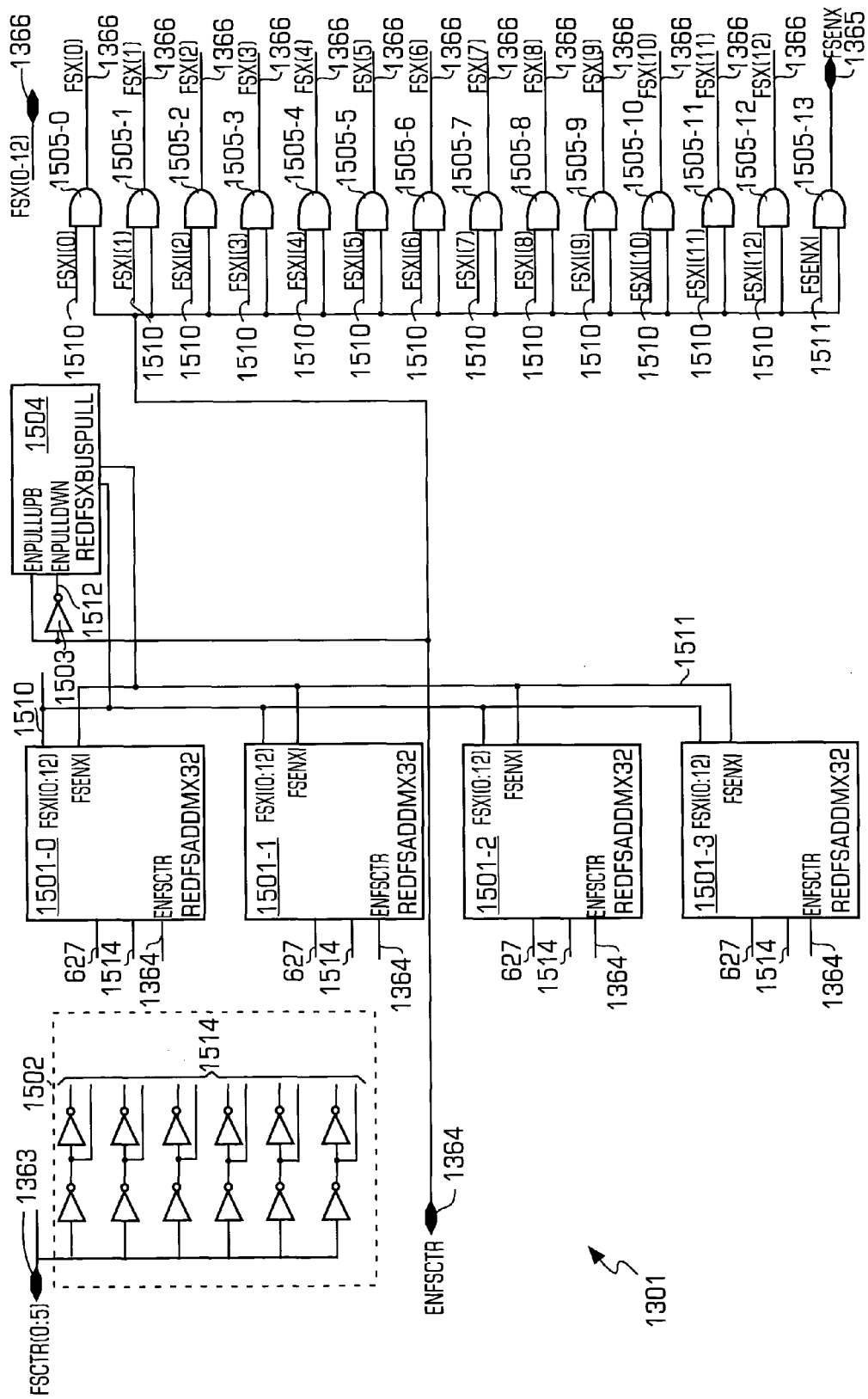
FIG. 15 is a block diagram illustrating a first redundant fuse address multiplexer of the redundancy address sequencer of FIG. 13.

FIG. 15 is a block diagram illustrating the first redundant fuse address multiplexer 1301.

The first redundant fuse multiplexer 1301 comprises a plurality of second redundant fuse multiplexers 1501-0 through 1501-3, an inverter logic circuit 1502, an inverter 1503, a redundant fuse bus pull (REDFSXBUSPULL) circuit 1504, and a plurality of AND gates 1505-0 through 1505-13. The inverter logic circuit 1502 generates fuse counter signals 1514, which include the buffered fuse counter signals 1363 and inverted counterparts of the fuse counter signals 1363, and provides the fuse counter signals 1514 to the second redundant fuse multiplexers 1501. The fuse state signals 627 are also applied to the second redundant fuse multiplexers 1501. For clarity, individual ones of the fuse counter signals 1514, the fuse state signals 627 are not individually numbered in FIG. 15. The second redundant fuse multiplexer 1501 is enabled by the enable fuse counter signal 1364. The second redundant fuse multiplexers 1501 generate internal fuse state (FSXI<0:12>) signals 1510 and internal fuse enable (FSENXI) signal 1511. The AND gates 1505-0 through 1505-12 generate the buffered multiplexed fuse state signals FSX 1366 in response to the internal fuse state signals FSXI 1510 and the enable fuse counter signal 1364. The AND gate 1505-13 generates the buffered multiplexed fuse enable signal FSENX 1365 in response to the internal fuse enable signal FSENXI 1511 and the enable fuse counter signal 1364.

Figure 16:
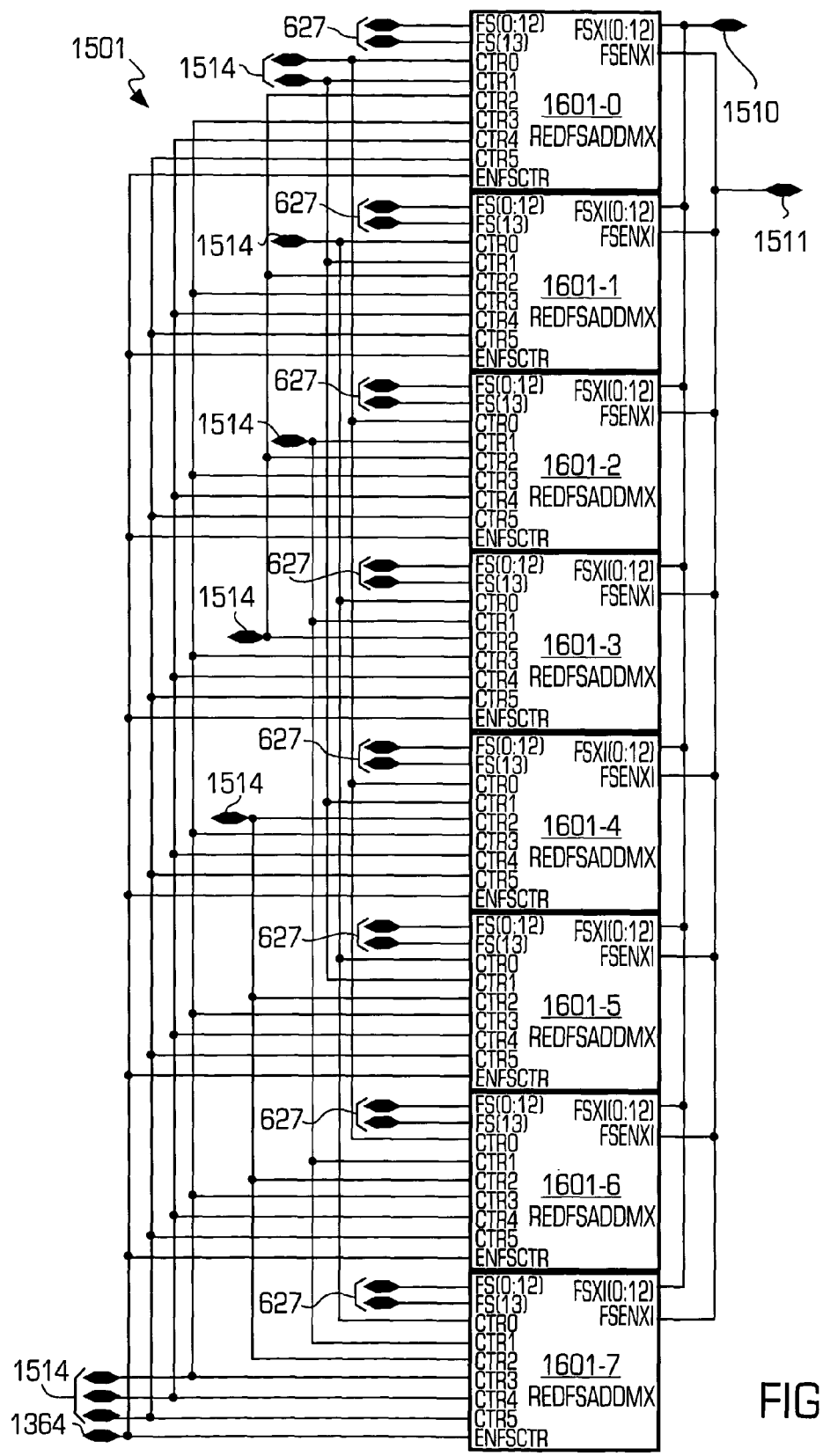
FIG. 16 is a block diagram illustrating a second redundant fuse address multiplexer of the first redundant fuse address multiplexer of FIG. 15.

FIG. 16 is a block diagram illustrating the second redundant fuse address multiplexer 1501.

The second redundant fuse address multiplexer 1501 comprises a plurality of third redundant fuse address multiplexers 1601-0 through 1601-7, which generate the internal fuse state signals 1510 and the internal fuse enable signal 1511 in response to the fuse state signals 627 and the fuse counter signals 1514 (which is a buffered fuse counter signal 1363). For clarity, the fuse state signals 627 and the fuse counter signals 1514 are not labeled individually by bit number in FIG. 16. The third redundant fuse address multiplexer 1601 is enabled by the enable fuse counter (ENFSCTR) signal 1364.

Figure 17:
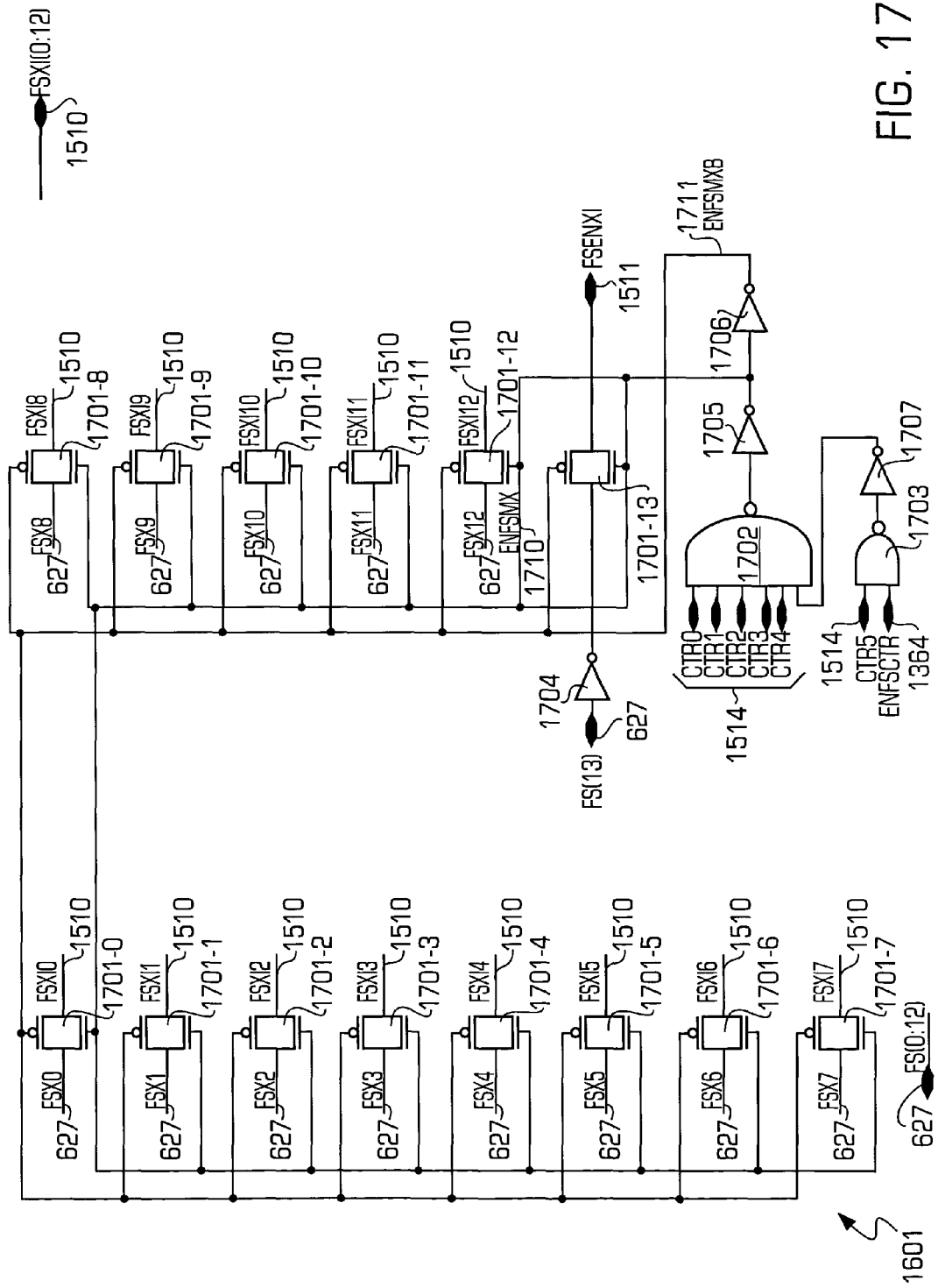
FIG. 17 is a block diagram illustrating a third redundant fuse address multiplexer of the second redundant fuse address multiplexer of FIG. 16.

FIG. 17 is a block diagram illustrating the third redundant fuse address multiplexer 1601.

The third redundant fuse address multiplexer 1601 comprises a plurality of transfer gates 1701-0 through 1701-13, a plurality of NAND gates 1702 and 1703, and a plurality of inverters 1704, 1705, 1706 and 1707. The transfer gates 1701-0 through 1701-12 provide the internal fuse state signal 1510 in response to the applied fuse state signal 627 when enabled by an enable fuse multiplexer (ENFSMX) signal 1710 from the inverter 1705 and enabled by an inverted enable fuse multiplex (ENFSMXB) signal 1711 from the inverter 1706. The NAND gate 1702 and the inverters 1705 and 1706 are coupled in series. The inverted and non-inverted signals 1514 of the fuse counter signals 1363 from the inverter circuit 1502 (FIG. 15) are applied to the corresponding inputs of the NAND gate 1702. The NAND gate 1702 is enabled by a AND gate formed of the NAND gate 1703 and the inverter 1707, which is enabled by the fuse counter (CTR5) signal 1514 and the enable fuse counter (ENFSCTR) signal 1364. The fuse state enable FS(13) signal is applied to the inverter 1704, which has an output applied to the transfer gate 1701-13 for providing the internal fuse enable (FSENXI) 1511.

Refer again to FIG. 15. The internal fuse state signals 1510 and the internal fuse enable signals 1511 are coupled to the redundant fuse bus pull-up (REDFSXBUSPULL) circuit 1504 to pull up or down these signals. The enable fuse counter (ENFSCTR) signal 1364 forms an enable pull-up signal. The inverter 1503 generates an enable pull-down signal 1512 in response to the enable fuse counter signal 1364.

Figure 18:
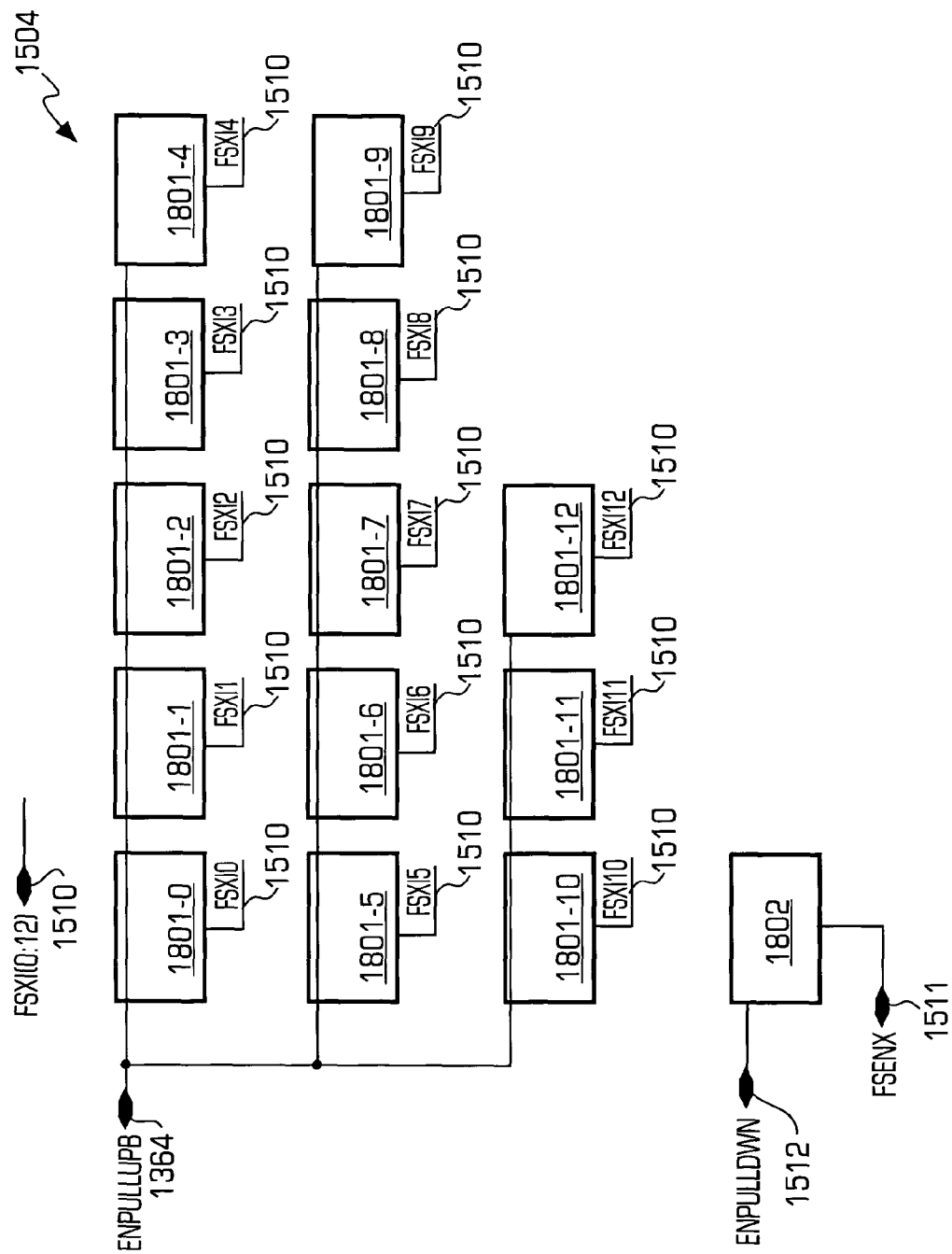
FIG. 18 is a block diagram illustrating a redundant fuse bus pull circuit of the first redundant fuse address multiplexer of FIG. 15.

FIG. 18 is a block diagram illustrating the redundant fuse bus pull (REDFSXBUSPULL) circuit 1504.

The redundant fuse bus pull (REDFSXBUSPULL) circuit 1504 comprises a plurality of redundant fuse pull-up (REDFSXPULLUP) circuits 1801-0 through 1801-12 and a redundant fuse pull-down (REDFSXPULLDWN) circuit 1802. The redundant fuse pull-up circuits 1801 pull up the internal fuse state signals 1510 in response to the enable fuse counter signal 1364.

Figure 19:
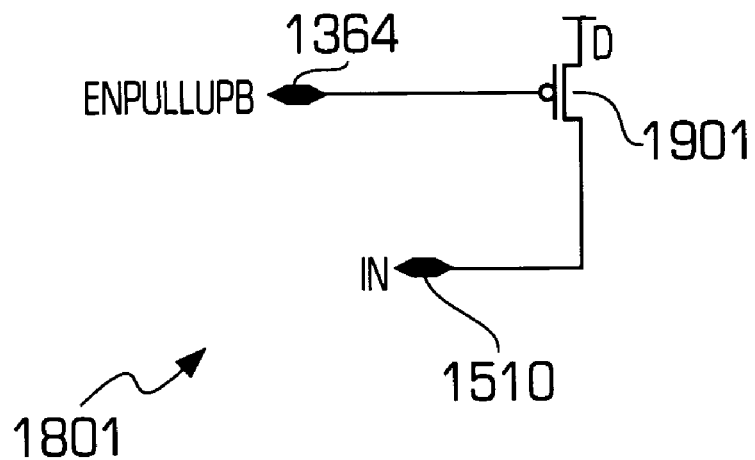
FIG. 19 is a block diagram illustrating a redundant fuse pull-up circuit of the redundant fuse bus pull circuit of FIG. 18.

FIG. 19 is a block diagram illustrating the redundant fuse pull-up circuit (REDFSXPULLUP) 1801.

The redundant fuse pull-up circuit (REDFSXPULLUP) 1801 comprises a PMOS transistor 1901. The drain-source terminals of the PMOS transistor 1901 couple the internal fuse state (FSXIx) signal 1510 applied to the drain terminal to the supply voltage applied to the source terminal in response to the enable fuse counter signal 1364 applied to the gate of the PMOS transistor 1901.

Refer again to FIG. 18. The redundant fuse pull-down circuit 1802 pulls down the internal fuse enable signal 1511 in response to the enable pull-down signal 1512.

Figure 20:
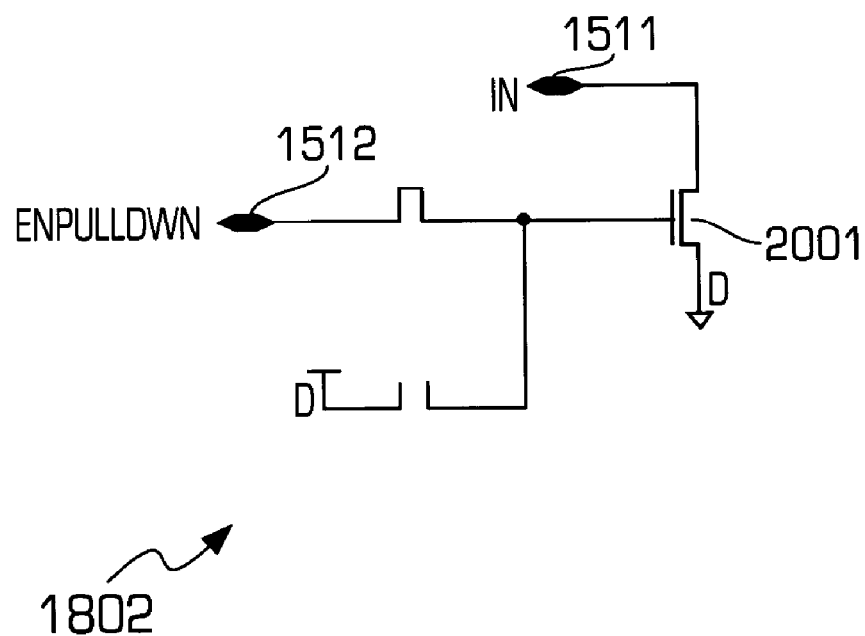
FIG. 20 is a block diagram illustrating a redundant fuse pull-down circuit of the redundant fuse bus pull circuit of FIG. 18.

FIG. 20 is a block diagram illustrating the redundant fuse pull-down circuit (REDFSXPULLDWN) 1802.

The redundant fuse pull-down circuit (REDFSXPULLDWN) 1802 comprises an NMOS transistor 2001. The drain-source terminals of the NMOS transistor 2001 couple the internal fuse enable (FSENXI) signal 1511 applied to the drain terminal to ground in response to the enable pull-down (ENPULLDWN) signal 1512 applied to the gate of the NMOS transistor 2001.

Refer again to FIG. 13. The first redundant fuse address multiplexer 1301 provides the multiplexed fuse state 1366 to the redundant regular address multiplexer 1302. The D flip-flop 1330 generates an enable fuse multiplexer signal 1367, which is applied to the redundant regular address multiplexer 1302, in response to the enabled redundancy oscillator signal 617. The enable fuse multiplexer signal 1367 is invoked by the begin redundant address sequencing signal 628, which is initiated by the input interface logic circuit 160. The D flip-flop 1330 is clocked by the redundant oscillator clock 629, which has been inverted by the inverters 1339 and 1338. The address signals 623 and the address extension (AEXT) signal 630 are applied to the redundant regular address multiplexer 1302.

Figure 21:
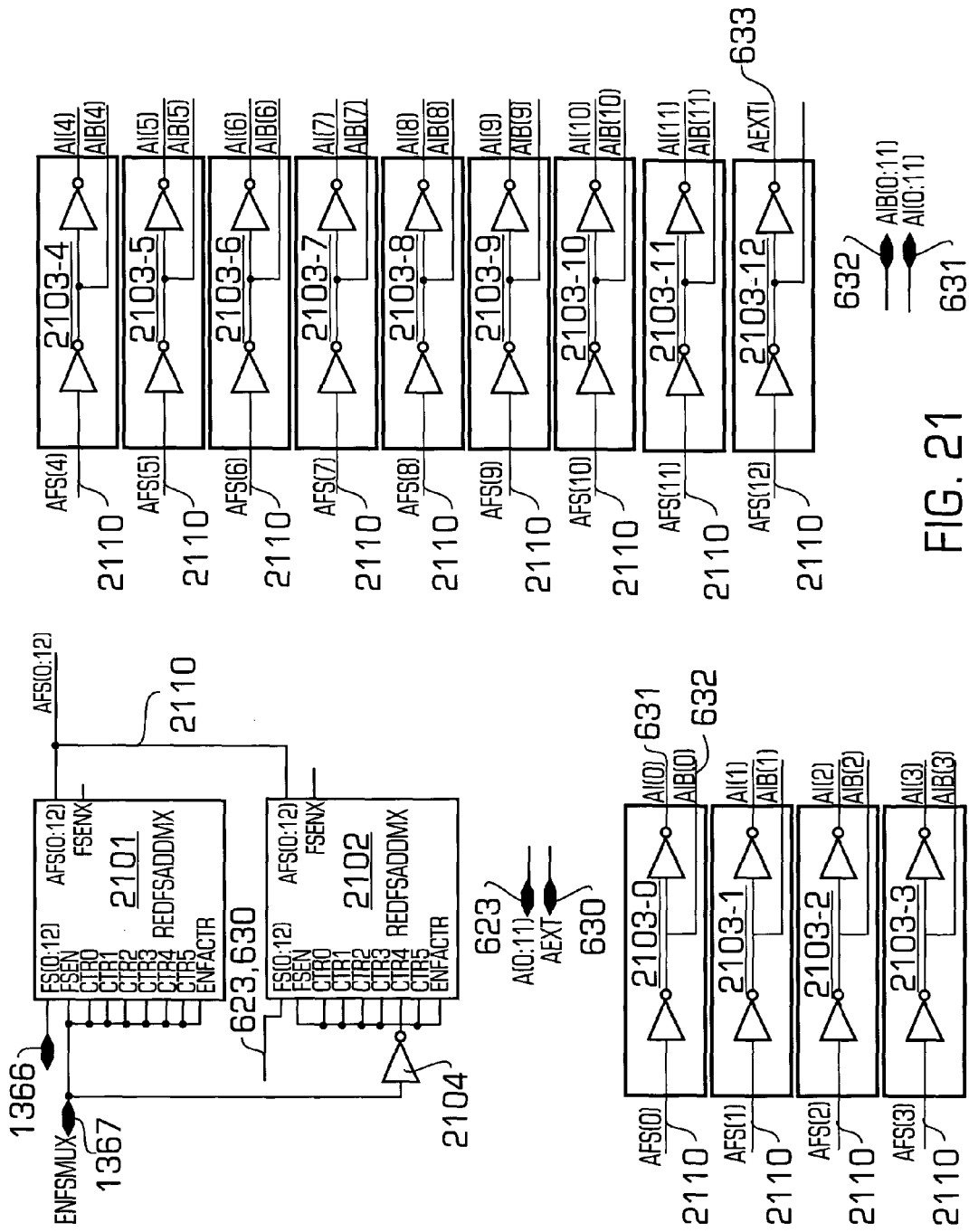
FIG. 21 is a block diagram illustrating a redundant register address multiplexer of the redundancy address sequencer of FIG. 13.

FIG. 21 is a block diagram illustrating the redundant register address multiplexer 1302.

The redundant register address multiplexer 1302, together with the redundant page comparator 1303, are used to reset the latch 416 in the defective y-driver circuit 110. The multiplexer 1302 enables the multiplexed fuse states 1366 to the address signals (AEXTI) 633, AI<0:11> 631, and AIB<0:11> 632, which couple to the byte pre-decoder 152, which then couples to the y-drivers 110, 112, 114 through the byte select circuits 140, 142, and 144. The redundant register address multiplexer (redregaddmx) 1302 comprises a plurality of redundant fuse address multiplexers (redfsaddmx) 2101 and 2102, a plurality of inverter chains 2103-0 through 2103-12, and an inverter 2104. The multiplexed fuse states 1366 and the enable fuse multiplexer signal 1367 are applied to the redundant fuse address multiplexer 2101. The address signals 623, the address extension signal 630 and the inverted enable fuse multiplexer signal 1367 from the inverter 2104 are applied to the redundant fuse address multiplexer 2102. The redundant fuse address multiplexers 2101 and 2102 are similar to the redundant fuse multiplexer 1601 described above in conjunction with FIG. 17. Depending on the enable fuse multiplexer signal 1367, the redundant fuse address multiplexers 2101 and 2102 provide either the multiplexed fuse state signals 1366 or the regular address signals 623, 630 to the inverter chain 2103 via an AFS(0:12) bus 2110. Each inverter chain 2103 comprises a series of inverters to generate the address signal 631 and the inverted address signal 632. The inverter chain 2103-12 generates the address extension signal 633.

Refer again to FIG. 13. The redundant page comparator 1303 generates a redundant page (RPAGE) signal 1368 in response to the multiplexed fuse enable signal 1365, the begin redundancy address sequencing signal 628, the address signal 623, and the fuse state signals 627. The address signal 623 and the fuse state signal 627 correspond to the bits that select a page. This is due to page mode operation of the system 100 which uses page address matching for redundancy as described above.

Figure 22:
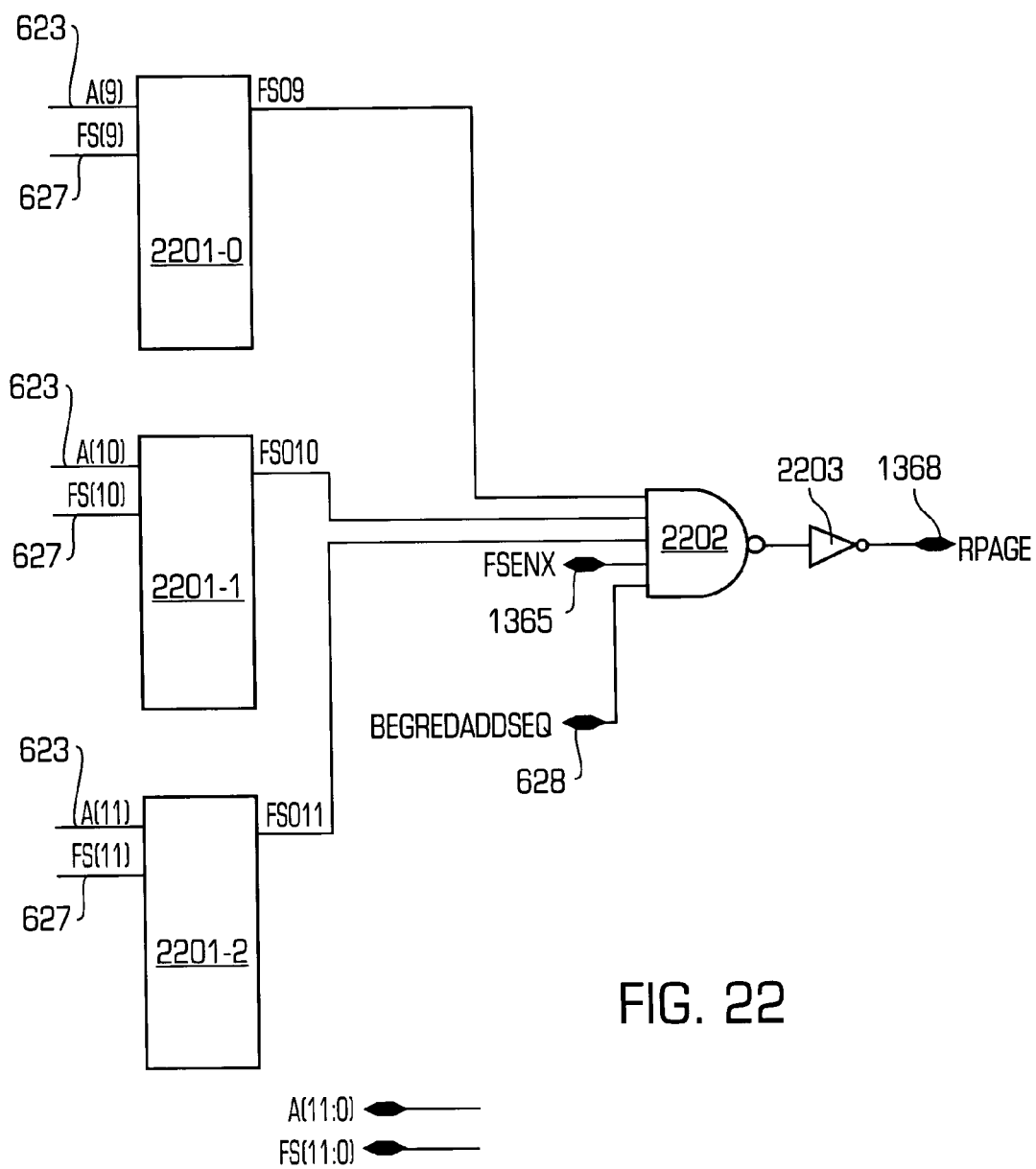
FIG. 22 is a block diagram illustrating a redundant page comparator of the redundancy address sequencer of FIG. 13.

FIG. 22 is a block diagram illustrating a redundant page comparator 1303.

The redundant page comparator 1303 comprises a plurality of redundant comparators 2201-0 through 2201-2, a NAND gate 2202, and an inverter 2203. The redundancy comparators 2201 may be, for example, circuits similar to the redundancy comparator 801 described above in conjunction with FIG. 9A. The address signal 623 and the fuse state signal 627 are applied to the redundancy comparators 2201. Each redundancy comparator 2201-0 through 2201-2 generates a corresponding input of the NAND gate 2202. The multiplexed fuse enable signal 1365 and the begin redundancy address sequencing signal 628 are applied to corresponding inputs of the NAND gate 2202. The inverter 2203 and the NAND gate 2202 generate the redundancy page signal 1368 as the logic AND of the signals from the redundancy comparators 2201-0 through 2201-2, the multiplexed fuse enable signal 1365 and the begin redundancy address sequencing signal 628.

Refer again to FIG. 13. The redundant page signal 1368 is applied to an input of the NAND gate 1318. The end redundancy address sequencing signal 615 and the enable fuse multiplexer signal 1367 are applied to corresponding inputs of the NAND gate 1318. The output of NAND gate 1318 is applied to corresponding input of the NAND gate 1319. The enable fuse multiplexer signal 1367 is applied to another input of the NAND gate 1319. The output of the NAND gate 1319 and the double inversion by the serially connected inverters 1355 and 1356 generate an enable byte decode redundancy reset (ENBTDECREDRST) signal 616.

The reset no-compare-OR (RSTNOCMPORL) signal 334 is generated from the redundant oscillator clock 629, the enable redundancy oscillator signal 617, the enable fuse multiplexer signal 1367, and the redundant page signal 1368. The redundant oscillator clock 629 is applied through the inverter 1339 and the NAND gate 1315 to the NOR gate 1325, which is enabled by the inverter 1340 in response to the enable redundancy oscillator signal 617. The output of the NOR gate 1325 is applied to an input of the AND gate formed of the NAND gate 1316 and the inverter 1357 and delayed through the inverter 1341 and the delay circuits 1307 and 1308 for application of another input of the NAND gate 1316. The output of the inverter 1357 is applied to the first input of the AND gate formed of the NAND gate 1317 and the inverters 1342, 1343 and 1344, which generates the reset no-compare-OR (RSTNOCMPORL) signal 334. The enable fuse multiplexer signal 1367, the fuse oscillator output signal 1362, and the redundant page signal 1368 are applied to corresponding inputs of the NAND gate 1317. The reset no-compare-OR (RSTNOCMPORL) signal 334 couples to the y-driver redundancy latch 416 (see FIG. 5E).

The fuse counter signals 1363 from the redundant fuse address counter 1304 are applied to the respective inverters 1345, 1346, 1347, 1348, 1349 and 1350. The output of the inverters 1345 through 1348 are applied to the NAND gate 1320, and the outputs of the inverters 1349, the fuse counter clock (FSCTRCLK) 1361, and the fuse counter signal 1363-5 are applied to inputs of the NAND gate 1321. The output of the inverter 1350 or the output of the NAND gate 1321 are selectively applied to an input of the OR gate formed of the NOR gate 1326 and the inverter 1351. The output of the NAND gate 1320 or ground are selectively applied to another input of the NOR gate 1326, based on a desired decoding count. The selected fuse state from the inverter 1351 is applied to an input of the AND gate formed of the NAND gate 1322 and the inverter 1353. The AND gate 1322 is disabled by the enable redundant oscillator signal 617 from the inverter 1336. The enable signal from the inverter 1353 is applied to the oneshot circuit 1305 that provides the output to the inverter 1354 which generates the end redundancy address sequencing signal 615, which also is applied to another input of the AND gate 1322.

In one embodiment, each fuse address 812-0 through 812-13 (FIG. 8) corresponds to an address of a segmented column. In another embodiment, the number of fuse sets (as indicated by the fuse state signal 627 of FIG. 6) is less than the number of the redundancy columns, for example, less than 32 fuse sets even though there are 32 redundancy columns. In one embodiment, this is done by sharing some fuse sets for a certain number of redundancy columns to save area due to a reduced number of fuse sets.

For the description of FIGS. 23 through 26, communication between the memory system 100 with an external controller is via a serial byte by byte protocol, for example, signal transmission is by 8 digital data bits at a time.

Figure 23:
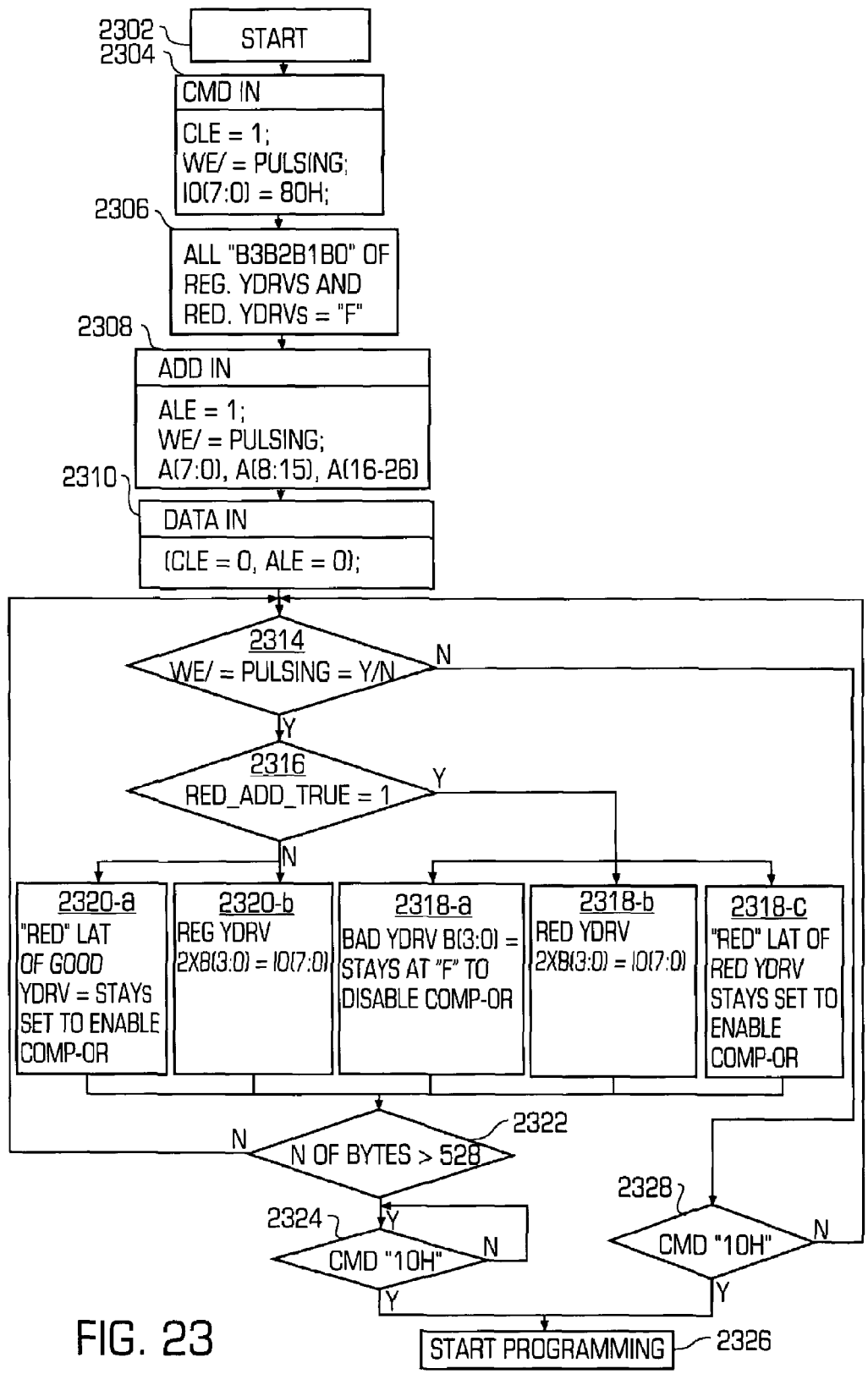
FIG. 23 is a flowchart illustrating program data loading of the memory array system of FIG. 1.

FIG. 23 is a flowchart illustrating program data loading of the memory array system 100. The program data loading is started (block 2302). In one embodiment, the command sequence is 80H (command code for data loading), A0–. . . A26 (for addresses), DATAIN=DI0 . . . DI528 (for 528 bytes of data in including 512 regular data and 16 extension bytes).

In response to a command sequence applied by the external controller via the input/output line 197 to the memory array system 100, the data loading is initiated (block 2304). In one embodiment for the input command for data load, a chip load enable (CLE) is set to one (CLE=1), a write enable (WE/) signal is pulsing, and the input/output signal 133 is set to data load command code 80H (IO(7:0) =80H) to begin the data loading sequence.

The data in the data latches 402 (e.g., B3B2B1B0) of the regular y-driver circuits 110 and 114 and the data latches 402 of the redundant y-drivers 112 are reset to a predetermined value in response to the data load command (block 2306). The predetermined value corresponds to a default input data to be stored in the regular memory array. In one embodiment, the predetermined value is fixed, for example, '1111' ("F"), for reasons described below. In another embodiment, a configuration (fuse) bit initialization is executed to load in data from fuse non-volatile memory cells to the volatile latches 9102 located in the fuse circuit 182 at this step. For either of these embodiments, the predetermined value of the data latch 402 reset controls the compare-OR function as follows. The redundant latches 416 of the y-driver circuits 110, 114, and 112 are reset to disable the compare-OR (COMPOR) signal 331 and the inverted compare-OR (COMPBOR) signal 332 by the enable data signal (EN-DATAFB) 451. The enable data signal (ENDATAFB) 451, generated from NAND gate 406 as shown in FIG. 4, is enabled when the data pattern B3B2B1B0 is "F" in the data latches 402 and the enable data signal 336 is high. Thus, the compare-OR functions can be disabled when the predetermined value in the data latches 402 (e.g., B3B2B1B0) is reset to "F". This allows partial programming of a page, as described below.

The addresses are then supplied by the external controller to provide addresses to the memory array system 100 (block 2308). In one embodiment, the address latch enable (ALE) signal is set to one (ALE=1), the write enable (WE/) signal is pulsing, the addresses A<0:26> are coupled on the input/output line 197. The addresses are latched by address counters 162, 163, and 165 to provide addresses to the memory array system 100.

The loading of input data is then initiated to the memory array system 100 (block 2310). In one embodiment, the chip load enable signal is set to zero (CLE=0) and the address latch enable signal is set to zero (ALE=0) (block 2310). The write enable (WE/) signal is pulsing, and the data is read in through the input/output bus 133 (IO<7:0>=DATA IN) to the input data 310 to the latches 402 (blocks 2314 through 2322). The input data 310 to be stored is loaded into the latches 402 in the y-driver 110 or 114.

In one embodiment, data that is not specifically loading into the latches (unloaded data) in the y-drivers stays at the predetermined default value, e.g., '1111' ("F"), for reasons described below.

In one embodiment, a redundancy address comparison is done in real time, e.g., the comparison is done as the data is loading into the latches 402. The bad y-drivers 110 and 114 are disabled from loading in data. In one embodiment, the bad y-drivers 110 and 114 are disabled by disabling the byte address predecoder 152 in response to a match between an incoming address 623 and the fuse address 627 as provided by the redundancy controller 186. Hence, data in the bad y-drivers 110 and 114 remains reset (e.g., stays at "F"). The data (e.g., "F") disconnects the compare-OR function from the bad y-drivers 110 and 114 (as done by the signal 451 coupled to the redundant latch 416 in FIG. 4). Hence, the bad y-drivers are disabled from the compare-OR function. A predetermined data value (e.g., '1111' or "F") is designated to indicate that no memory cell programming is to be performed by that y-driver. Similarly, if the data input 310 is '1111', no programming is to happen and no compare-OR function is performed (as done by the signal 451 coupled to the redundant latch 416 and in turn coupled to the inverter 417 and the NOR gate 408 to the PMOS transistor 411 to inhibit the bitline 319 as shown in FIG. 4). Another example is to use the data "F" to allow partial page programming where only a subset of bytes within a page are loaded in and are programmed at a time while the other previously programmed or still erased bytes on the same page are not changed (data stays at "F"). At the end of data loading, the data (e.g., "F") is decoded by the NAND gate 406 (enabled by the (ENDATAF) signal 336) to disconnect the compare-OR function. If a redundancy address match occurs, the redundant y-driver circuit (RYDRV) 112 is enabled to load in data and to connect to the compare-OR function.

If the write enable signal is pulsing (block 2314), the redundancy address (RED_ADD_TRUE) signal 138 is evaluated. The redundancy address (RED_ADD_TRUE) signal 138 from the redundancy controller 186 serves as a flag coupled to the controllers 160 and 164 to issue appropriate control signals for the memory array system 100 to execute appropriate actions as described below. If the redundancy address signal 138 indicates a bad y-driver 110 or 114 (RED_ADD_TRUE=1) (block 2316), the data stored in the bad y-driver circuit (YDRVR) 110 or 114 remains unchanged (e.g., B(3:0)='F') to disable the compare-OR function (block 2318-*a*). The data stored in a pair of the redundant y-driver circuits (RYDRV) 112 in the redundant y-driver circuit 202 is set equal to the input data 133 (e.g., 2×B(3:0)=IO(7:0)) (block 2318-*b*). The pair of redundancy data latches 416 of the redundant y-driver circuits (RYDRV) 112 stays in a set condition to enable the compare-OR function (block 2318-*c*). On the other hand, if the write enable signal is pulsing (block 2314) and if the redundancy address signal 138 does not equal one (RED_ADD_TRUE=0) (block 2316), the redundancy data latches 416 of the good y-drivers (YDRVR) 110 or 114 remains set to enable the compare-OR function (block 2320-*a*) and the data stored in data latches 402 of a pair of the regular y-driver circuits (YDRVR) 110 or 114 is set equal to the input data 133 (e.g., 2×B(3:0)=(IO(7:0)) (block 2320-*b*). The loading of the y-driver circuit 110 or 114 continues until the number N of bytes written is greater than a selected number (e.g., 528) (block 2322). When the input command is a start programming command (e.g. '10H') (block 2324), the programming is started (block 2326).

In another embodiment, the input data is loaded in the redundant y-drivers 112 as well as in the bad regular y-drivers 110 or 114. In this embodiment, disabling the data loading for the bad regular y-drivers 110 or 114 need not be done and thus less circuitry is used. Furthermore, the predetermined data "F" is not used to disable the compare-OR function, but instead uses another mechanism, such as the redundancy address sequencer 605, to disable the compare-OR function.

On the other hand, if the write enable signal is not pulsing (block 2314), until the input command is a start programming command (e.g. '10H') (block 2328), the programming does not start, and if the input command is a start programming command (e.g., '10H')(block 2328), the programming is started (step 2326).

Figure 24:
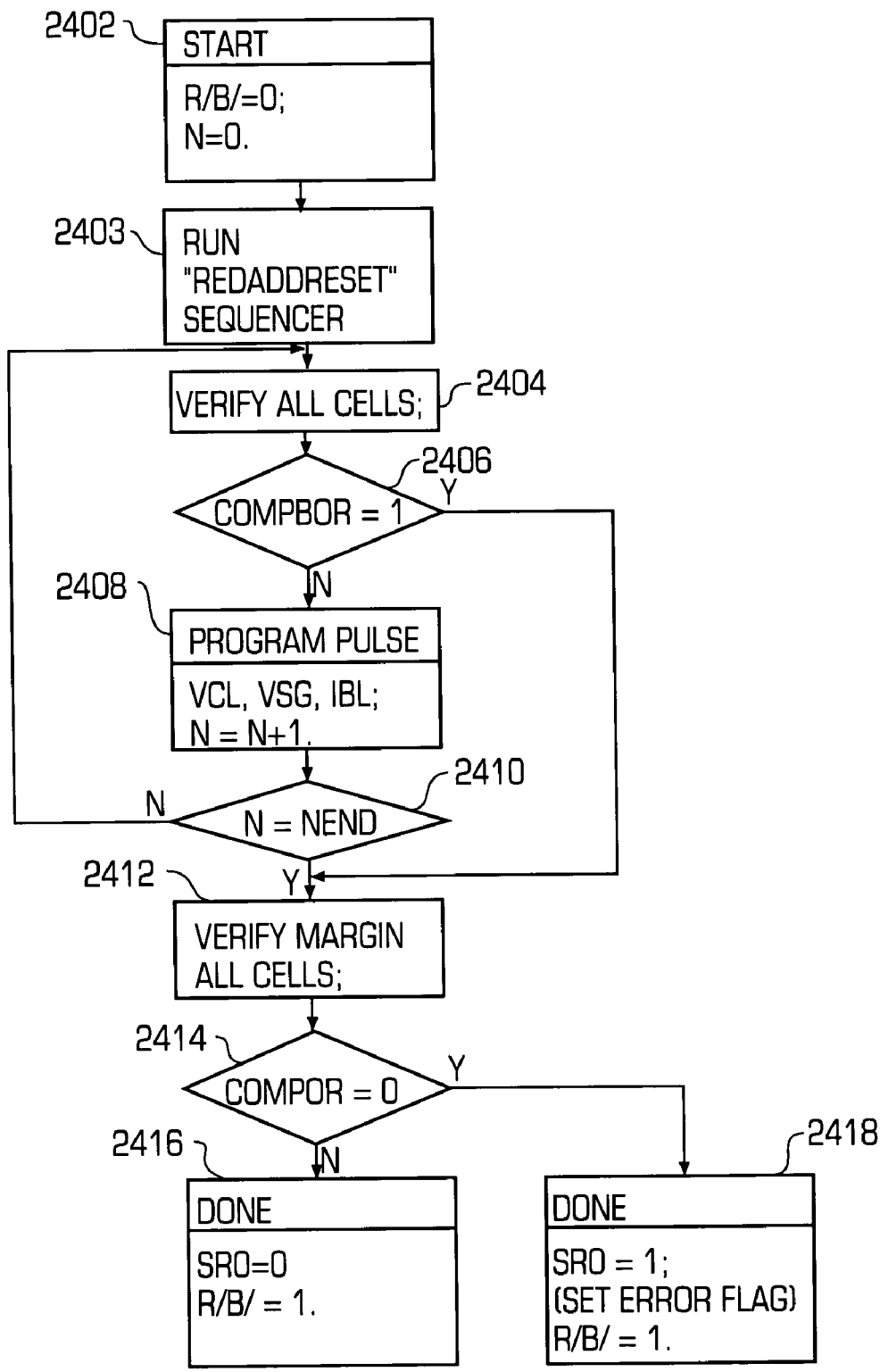
FIG. 24 is a flowchart illustrating programming of data and reference cells with redundancy of the memory array system of FIG. 1.

FIG. 24 is a flowchart illustrating the programming of data and reference cells with redundancy of the memory array system 100. At the start of the programming, several programming variables are initialized (block 2402). In one embodiment, the inverted ready busy signal is set to zero (R/B/=0), and a verification counter is set to zero (N=0). The inverted ready busy signal (R/B/) is zero to indicate an internal operation is ongoing. In another embodiment, a configuration (fuse) bit initialization is executed to load in data from fuse non-volatile memory cells to the volatile latches 9102 located in the fuse circuit 182 at this step. The redundancy address sequencer 605 then disables and enables the compare-OR function in the bad and redundant y-drivers, respectively, as appropriate (block 2403), as described above and hereafter called a run redundancy address reset "REDADDRESET" sequencer step. The run "REDADDRESET" sequencer step includes executing the redundancy address sequencer 605 to cycle through all 32 fuse addresses to disable the redundant latch 416 inside the bad y-drivers 110 and 114.

The cells are verified (block 2404). In one embodiment, the values in the data latches 402 determine the reference value of one of 16 references for verification. Other numbers of reference values may be determined. As described above, the margin defines a desired difference in voltage recurrent between memory cell output and reference value. In one embodiment, the data latches 402 (e.g., B3–B0) select one of the reference voltages VR(15-0) 318 (from the y-driver reference decoder 404) offset with a margin voltage, vmargin (e.g. 30 mV generated by a circuit which is not shown, and used in a system with 100 mV separation between adjacent reference voltages VR(15-0)), for each y-driver. If for any y-driver, the voltage of the cell (VCELL) coupled to each y-driver is less than the selected reference voltage 318 offset with the margin, e.g., VCELL<(VR(15-0)-vmargin), then the inverted compare-OR signal 332 is set to one (COMPBOR=1) to indicate the cell has been correctly programmed with the desired margin (e.g., VCELL<(VR(15-0)–30 mV) and the voltage on the bit line 319 is set to equal to the voltage on the voltage inhibit signal 326 (BL=VINH) to prevent further programming. To better understand the principle of margin in this embodiment, it is useful to know that the voltage VCELL is decreasing after each programming pulse. When the inverted compare-OR signal 332 from each of the enabled y-drivers is equal to one, then the compare-OR logic (COMPORLOG) circuit 153 sets inverted compare-OR signal 132 equal to one to indicate the programming has been completed correctly for all y-drivers in the memory array system 100.

If the inverted compare-OR signal 132 is not set to one (e.g., COMPBOR≠1) (block 2406), a program pulse is applied to the memory array system 100 (block 2408). Only those selected cells coupled to bit-lines coupled to y-drivers whose inverted compare-OR signal 332 is not set to one (e.g., COMPBOR≠1) receive the programming pulse. Bit-lines coupled to y-drivers whose inverted compare-OR signal 332 is set to one (e.g., COMPBOR=1) remain coupled to the voltage inhibit signal 326 (BL=VINH) to prevent further programming. In one embodiment, the common line voltage (VCL) applied to the source of the memory cells, the select gate voltage (VSG) applied to the gate of the selected memory cells and the bit line current (IBL) applied to the drains (also called bitlines) of the memory cells are set at programming values, and the verification counter is incremented (N=N+1). If the verification counter is less than an end of count value (N<NEND)(block 2410), the system 100 returns back to verification (block 2404), described above.

On the other hand, if the verification counter equals an end of count value (N=NEND) (block 2410) or if the inverted compare-OR signal 132 is set (e.g., COMPBOR=1) (block 2406), the margin is verified on all cells (block 2412). In one embodiment, the verify is done to check that the voltage VCELL of the cells has not been programmed so low that it is too close to the adjacent state below the desired program state. In one embodiment, the data latches 402 (e.g., B3–B0) select one of the reference voltages VR(15-0) 318 (from the y-driver reference decoder 404) offset with a verify margin voltage, vvmargin (e.g. 70 mV generated by a circuit which is not shown), for each cell (y-driver). If for any cell (y-driver), the voltage of the cell VCELL is less than the selected reference voltage 318 offset with the verify margin, e.g., VCELL<=(VR(15-0)–vvmargin), the compare-OR signal 331 is set to zero (COMPOR=0), which is indicative that the cell voltage is over-programmed below the desired reference value, e.g., VCELL<(VR(15-0)–70 mV). When the compare-OR signal 331 from any of the y-drivers is equal to zero, then the compare-OR logic (COMPORLOG) circuit 153 sets compare-OR signal 131 equal to zero to indicate the verify has been completed incorrectly for some y-drivers in memory array system 100.

If the compare-OR signal 131 is not equal to zero (e.g., COMPOR=1) (block 2414), the programming and verification is completed correctly, and a program status bit (SRO) and an inverted ready busy signal (R/B/) are set (block 2416). In one embodiment, the program status bit is set equal to zero (e.g. SR0=0) and the inverted ready busy signal is set to one (e.g., R/B/=1).

On the other hand, if the compare-OR signal 131 is equal to zero (block 2414), the programming and verification is completed with error and the program status bit and inverted ready busy signal are set (block 2418). In one embodiment, the program status bit is set to one (e.g. SR0=1 to indicate an error in program) and the inverted ready busy signal is set to one (e.g., R/B/=1). In an alternate embodiment, separate system status flags can be used to discriminate between two separate error conditions as follows. One status flag can be set to indicate the compare-OR signal 131 is equal to zero and the system failed to verify correctly (e.g. over-programming has occurred). Another status flag can be set to indicate the inverted compare-OR signal 132 is still equal to zero after the verification counter equals an end of count value (N=NEND) and the system failed to program correctly (e.g. insufficient programming has occurred).

Figure 25:
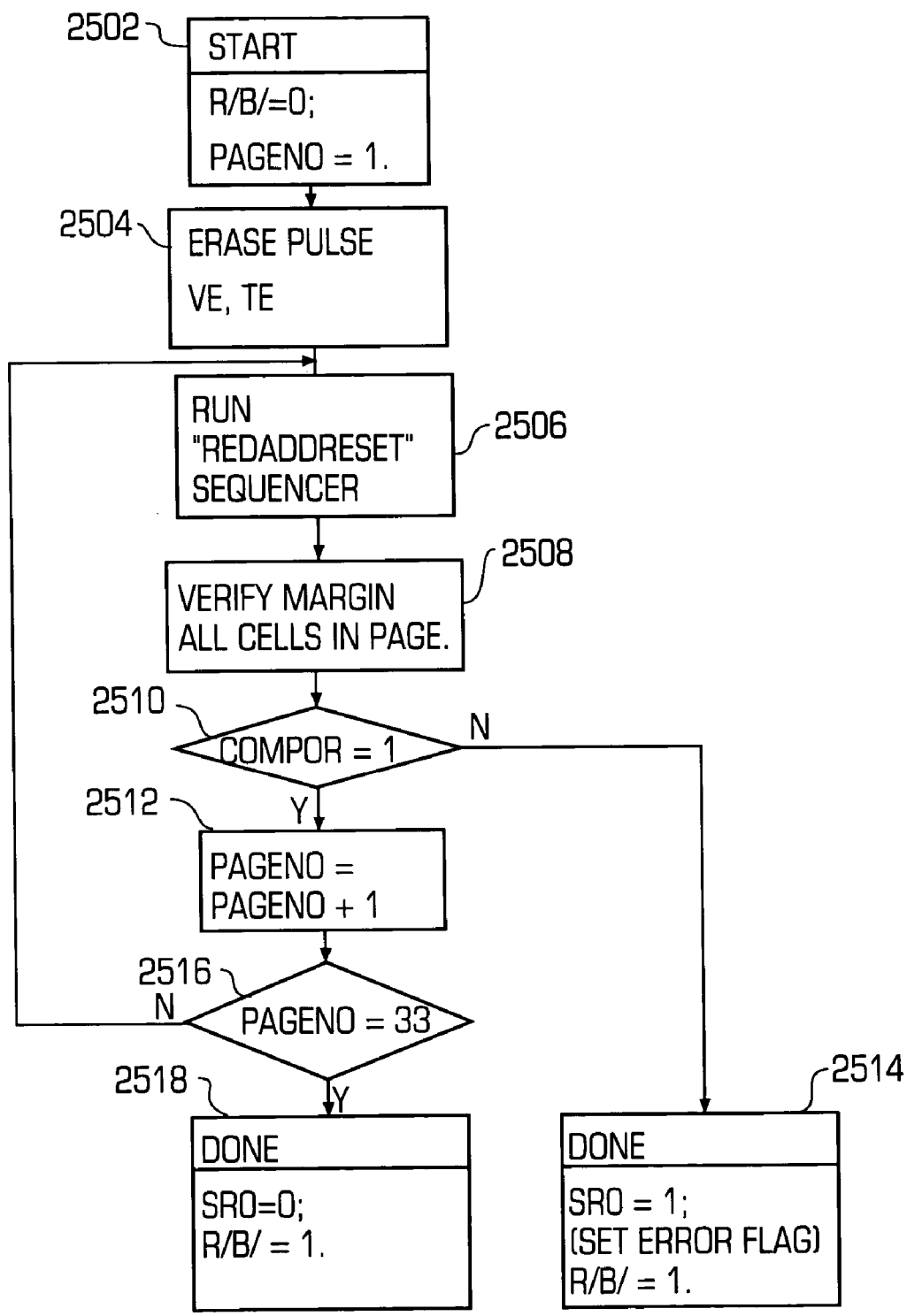
FIG. 25 is a flowchart illustrating erasing of memory cells of the memory array system of FIG. 1.

FIG. 25 is a flowchart illustrating erasing of memory cells with redundancy after an erase command and a block address have been input to the memory system 100. In one embodiment, four rows are erased at a time as the smallest erase kernel called a block. Recall, each row has eight pages. Thus, a block comprises 32 pages total. At the start of erasing, several variables are initialized (block 2502). In one embodiment, the inverted ready busy signal is set to zero (R/B/=0), and a page number is set to an initial page (e.g., PAGENO=1) of the selected block.

An erase pulse is applied to the selected block (block 2504). In one embodiment, the erase pulse has an erase voltage value (VE) and an erase time duration (TE) applied to the selected block.

The compare-OR function of the bad y-drivers 110 is disabled by a run redundancy address reset "REDADDRESET" sequencer step (block 2506). In one embodiment, as detailed above, the redundancy address sequencer 605 resets redundancy data latch 416 in the defective y-drivers 110 to disable the compare-OR function. In one embodiment, the redundancy address sequencer 605 sets the redundancy data latch 416 in the redundant y-drivers 112 to enable the compare-OR function.

The margin is verified in all cells in the page (block 2508). In one embodiment, the value "F" stored in the data latches 402 determines the reference voltage (VR15) 318. The erase margin is verified. In one embodiment, if all cells in a page have the voltage of the cell greater than the reference voltage 318 (VCELL>VR15), the margin is sufficient and the compare-OR (COMPOR) signal 131 is set (e.g., COMPOR=1). If any cell in a page has the voltage of the cell less than the reference voltage 318 (VCELL<VR15), the erase margin is insufficient and the compare-OR (COMPOR) signal 131 is not set (e.g., COMPOR=0). In one embodiment, the reference voltage is offset higher by a fixed bias value, e.g., 30 millivolts. In another embodiment, the reference voltage is offset by a ratio to a reference voltage, e.g., 5% of the reference voltage (VR15) 318.

If the compare-OR signal 131 is not set (e.g., COMPOR≠1) (step 2510), which indicates some erased cells are verified unsuccessfully, the erase is completed and the status bit and the inverted busy signal are set (step 2514). In one embodiment, the erase status bit is set to one (e.g. SR0=1 to indicate an error in erase) and the inverted ready busy signal is set to one (e.g., R/B/=1).

On the other hand, if the compare-OR signal 131 is set (e.g., COMPOR=1) (block 2510), the page number counter is incremented (PAGENO=PAGENO+1) (block 2512). Next, the page number is compared to a predetermined page number which corresponds to the number of pages in the block plus one (e.g., PAGENO=33) (block 2516), and if there is not a match, the system 100 continues the run redundancy address reset "REDADDRESET" sequencer step (block 2506). On the other hand, if there is a match, the erase is completed, and the status bit and the inverted ready busy signal are set (block 2518). In one embodiment, the status bit is set to zero (e.g. SR0=0 to indicate successful erase) and the inverted ready busy signal is set to one (e.g., R/B/=1).

In one embodiment, the system 100 may repeat for more than one pass through the flow. In another embodiment, the system 100 may repeat a flow with variable erase time or variable erase value or both until all cells are verified or until a boundary condition is reached, e.g., maximum erase voltage VE or maximum erase time TE.

Figure 26:
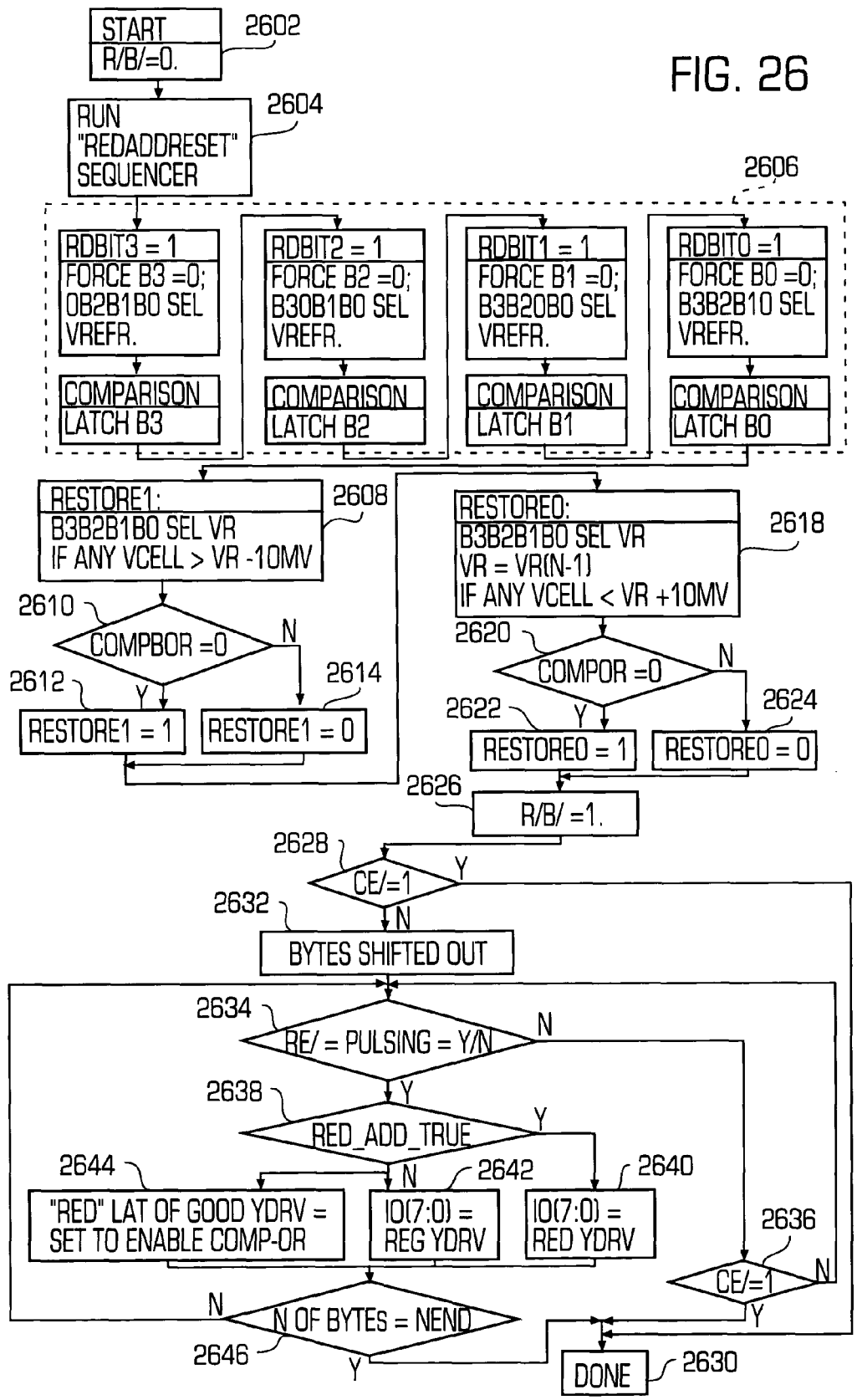
FIG. 26 is a flowchart illustrating read verification of memory cells of the memory array system of FIG. 1.

FIG. 26 is a flow chart illustrating read verification of the memory array system 100 after read command and read addresses have been input. At the start of read verification, several variables are initialized (block 2602). In one embodiment, the inverted ready busy signal is set to zero (R/B/=0). The data latches 402 also are reset, e.g., B3B2B1B0=1111. In another embodiment, a configuration (fuse) bit initialization is executed to load in data from fuse non-volatile memory cells to the volatile latches 9102 located in the fuse circuit 182 at block 2602.

The compare-OR function of the bad y-drivers 110 or 114 is disabled and enabled for redundant y-drivers 112 as needed by a run redundancy address reset "REDADDRESET" sequencer step (block 2604). In one embodiment, the redundancy address sequencer 605 resets the redundancy data latch 416 in the defective y-driver 110 or 114 to disable the compare-OR function.

The information, herein described as voltage, stored in the memory cell is then converted to digital bits with an implementation shown herein with 4 bits per cell (block 2606). In one embodiment described herein, a binary search is performed to find the digital bit one bit at a time. In another embodiment, a multibit binary search may be performed to find more than one digital bit at a time such as 1.5 or 3 bits. In one embodiment, the third read bit 312-3 is associated with a data latch 402-3 is set to a predetermined logic state (e.g., RDBIT3=1). The output data 446-3 is forced to a low state (B3=0). The data latches 402 are set for selecting a predetermined reference voltage VR(15-0) 318 (e.g., 0B2B1B0 to select VR7). A comparison is made between the selected reference voltage VR(15-0) 318 and the memory cell output VCELL on the bitline 319 (FIG. 4). The data latch 402-3 is latched by the read bit 312-3 (B3) signal from the algorithm controller 164 based upon the result of the comparison indicated by the comparator latch output signal 321. The second read bit 312-2 associated with the data latch 402-2 is set equal to a certain logic state (e.g., RDBIT2=1). The output data 446-3 is forced equal to a low state (e.g., B2=0). The data latches are set for selecting another reference voltage VR(15-0) 318 based on the previous search (e.g., B30B1B0 with B3 latched from a previous search). The comparison is made between the selected reference voltage 318 and the memory cell output VCELL on the bitline 319, and the data latch 402-2 is then latched with B2 with the result from the comparison indicated on the comparison latch signal 321. Similar forcing of the first data bit 312-1 (e.g., RDBIT1=1) and the zero data bit 312-0 (e.g., RDBIT0=1) is performed resulting in the data latches 402-1 and 402-0 latched with B1 and B0.

In one embodiment, a margin read verification can be performed. In a first mode, RESTORE1, the cell output VCELL is checked if it inadvertently increases too close to a reference value above it (VR(15-0)) 318. Thus, the RESTORE1 margin read verification mode checks a "look-up" cell read margin condition and generates a flag called (RESTORE1) as described below. In this case, the voltage of the cell is compared to a selected reference voltage (VRN) 318 less than a predetermined read margin voltage, vrmargin (e.g., 10 millivolts generated by a circuit which is not shown) (block 2608). In one embodiment, the data latch 402 selects the reference voltage VR(15-0) 318 (e.g., B3B2B1B0 to select VR(15-0)). If any cell voltage VCELL is greater than the reference voltage VR(15-0) 318 minus a predetermined read margin voltage, e.g., VCELL>(VR(15-0)-vrmargin), the look-up margin of the cell is considered bad, and the inverted compare-OR signal 132 is set equal to zero (COMPBOR=0). In this embodiment vrmargin (block 2608)<vmargin (block 2404) to allow some acceptable amount of inadvertent VCELL drift.

The inverted compare-OR signal 132 is analyzed (block 2610). If the inverted compare-OR signal 132 is equal to zero (COMPBOR=0), the state of the cell is determined to be a bad look-up cell and (RESTORE1) is set equal to 1 or true (RESTORE=1) (block 2612). Otherwise, if the inverted compare-OR signal 132 is not equal to zero (COMPBOR≠0), the state is determined to be a good look-up cell and (RESTORE1) is set equal to 0 or false (RESTORE1=0) (block 2614). If a cell is considered a bad lookup cell, a corrective operation may be then performed, for example by rewriting the cell and redoing the margin read verification.

In a second mode (RESTORE0, serving as a flag for a look-down cell condition) of the margin read verification, the cell output VCELL is checked if it inadvertently goes down too close to a reference voltage below it (VR(15-0) -1). In this case, the voltage of the cell VCELL is compared to a selected reference voltage 318 (VR(15-0)-1) plus a predetermined read margin voltage, vrmargin (e.g., 10 millivolts generated by a circuit which is not shown) (block 2618). In one embodiment, the data latches 402 (e.g., the B3B2B1B0) select a reference voltage (VR(15-0)-1) 318. If any cell voltage VCELL is less than the selected reference voltage VR(15-0)-1 318 plus a predetermined read margin voltage, e.g., VCELL<((VR(15-0)-1)+vrmargin), the look-down read margin of the cell is considered bad and the compare-OR signal 131 is set equal to zero (COMPOR=0). The compare-OR signal 131 is analyzed (block 2620). If the compare-OR signal 131 is equal to zero (COMPOR=0), the state of the cell is determined to be a bad look-down cell, and RESTORE0 is set equal to 1 or true (RESTORE0=1) (block 2622). Otherwise, if the compare-OR signal 131 is not equal to zero (COMPOR≠0), the state is determined to be a good look-down cell, and RESTORE0 is set equal to 0 or false (RESTORE0=0) (block 2624). If a cell is considered a bad lookdown cell, a corrective operation may be taken, for example, by rewriting the cell and redoing the margin read verification.

A byte read sequence is then initiated for reading any number of desired bytes of data (block 2626). In one embodiment, the inverted ready busy signal is set to one (R/B/=1). The chip enable signal is evaluated (block 2628). If the chip enable is set (CE/=1), the reading is done (block 2630). The user may, after a fixed time out after R/B/=1, read the system status to check the flag for the read margin (RESTORE1, RESTORE0) flags.

On the other hand, if the chip enable signal is not set (CE/=0), shifting out of bytes (data out) can then begin (block 2632). For each byte read, the real time redundancy address comparison, as provided by the redundancy decoders 601 through 604, disconnects the data output from the bad y-drivers 110 or 114 and connects the data output from the redundant y-drivers 112, as done by disabling the byte select circuits 140 or 144 and enabling the byte select circuit 142 respectively, with the redundancy address comparison occurring in real time as the byte is shifted out. In one embodiment, the read enable is analyzed (block 2634). If the read enable (RE/) signal is not pulsing, the chip enable is analyzed (block 2636). If the chip enable (CE/) is not set (CE/≠1), the process continues of analyzing the read enable (block 2634). On the other hand, if the chip enable signal is set (CE/=1) (block 2636), the read verification is completed (block 2630). In another embodiment, instead of multiplexing the data out from a bad and redundant y-driver, the data out is multiplexed at an input/output circuit or I/O buffer.

On the other hand, if the read enable is pulsing (block 2634), the redundancy address signal 138 is analyzed (block 2638). If the redundancy address signal 138 equals 1 (RED_ADD_TRUE=1), the input output data bus 133 is coupled to the redundancy y-driver 112 (block 2640). On the other hand, if the redundancy address signal 138 is not set (RED_ADD_TRUE≠1), the input output data bus 133 is coupled to the regular y-drivers 110 or 114 (block 2642). Also in this case, the redundancy data latch 416 of the good y-driver 110 or 114 is reset to enable the compare-OR function (block 2644). If the number of bytes being read is complete (number of bytes=NEND) (block 2646), the verification is done (block 2630). Otherwise, if the number of bytes read is not complete (block 2646), the process returns to determining if the read enable is pulsing (block 2634).

As described above, the column redundancy functions by replacing a regular column with a redundant column. A fractional multilevel redundancy functions by replacing a regular column by combining a part of a regular column with a part of a redundant column or by combining a part of a redundant column with a part of another redundant column. As an illustrative example, the description relates to a 4-bit memory cell (B3B2B1B0). Also in this example, the bad regular column has a defect that causes the least significant bits to fail, for example, B1 and B0. The fractional multi-level redundancy detects this partial bad regular column and enables a redundant column to be used. The most significant bits B3 and B2 of the bad regular column are used. The redundant column is used to provide bits B1 and B0 to replace the defective regular bad column bits. Accordingly, the bad and redundant columns are only 2 bits instead of 4 bits per cell.

In this disclosure, there is shown and described only the preferred embodiments of the invention, but, as aforementioned, it is to be understood that the invention is capable of use in various other combinations and environments, is capable of changes or modifications within the scope of the inventive concept as expressed herein.

What is claimed is:

1. A memory device comprising:
    a first memory array including a plurality of memory cells arranged in columns;
    a plurality of first y-drivers, each first y-driver coupled to a corresponding one of a plurality of said columns of memory cells to read contents of memory cells in said column and including a first circuit for testing a level of stored digital data in the memory cells;
    a redundant memory array including a plurality of redundant memory cells arranged in columns;
    a plurality of redundant y-drivers, each redundant y-driver coupled to a corresponding one of a plurality of said columns of redundant memory cells to read contents of redundant memory cells in said column and including a second circuit to test a level of stored digital data in the redundant memory cells; and
    a controller to generate a selection signal to enable said redundant y-drivers and to generate a disable signal to disable said first y-drivers in response to a failure of said testing of said level by said first circuit of said corresponding first y-driver.

2. A memory device comprising:
    a first memory array including a plurality of memory cells arranged in columns;
    a plurality of first y-drivers, each first y-driver coupled to a corresponding one of a plurality of said columns of memory cells to read contents of memory cells in said column and including a first circuit for testing a level of stored data in the memory cells;
    a redundant memory array including a plurality of redundant memory cells arranged in columns;
    a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and
    a controller to generate a selection signal to enable said redundant y-drivers and to generate a disable signal to disable said first y-drivers in response to a failure of said testing of said level by said first circuit of said corresponding first y-driver,
    wherein the first circuit tests a voltage level of the stored data on a bitline coupled to one of said columns of memory cells.

3. The memory device of claim 2 wherein each of the memory cells comprises a transistor having a source, gate, and drain terminals, a first bias voltage is applied to a gate, a second bias voltage is applied to a source of said transistor, and a bias current flowing between the source and drain terminals of said transistor being independent of the data stored in said memory cell.

4. The memory device of claim 2, wherein the first circuit tests a current on a bitline coupled to one of said columns of memory cells, the current being indicative of and dependent on data stored in said memory cell.

5. The memory device of claim 4, wherein each of the memory cells comprises a transistor having a source, gate, and drain terminals, a low voltage is applied to the source, a bias voltage is applied to a gate, and a load is coupled to the drain, the current level is determined from the voltage on said load.

6. The memory device of claim 1 wherein said first and redundant y-drivers each comprise a pattern indicator circuit that comprises a NAND gate to generate an input data pattern indicator in response to input data applied thereto.

7. The memory device of claim 1 wherein each of said first and redundant y-drivers further comprise a pattern indicator circuit to generate an input data pattern indicator in response to received input data.

8. The memory device of claim 7 wherein the input data received substitutes a predetermined data value and said substitution prevented by said disable signal generated by said controller.

9. The memory device of claim 7 wherein the input data pattern indicator inhibits the first y-driver from programming the memory cell in response to a predetermined data value.

10. A memory device comprising:
    a first memory array including a plurality of memory cells arranged in columns;
    a plurality of first y-drivers, each first y-driver coupled to a corresponding one of a plurality of said columns of memory cells to read contents of memory cells in said column and including a first circuit for testing a level of stored data in the memory cells;
    a redundant memory array including a plurality of redundant memory cells arranged in columns;
    a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and
    a controller to generate a selection signal to enable said redundant y-drivers and to generate a disable signal to disable said first y-drivers in response to a failure of said testing of said level by said first circuit of said corresponding first y-driver,
    wherein each of said first and redundant y-drivers further comprise a pattern indicator circuit to generate an input data pattern indicator in response to receive input data,
    the memory device further comprising a status latch responsive both to said pattern indicator circuit and to said controller.

11. The memory device of claim 10 wherein said status latch controls inhibiting the first and redundant y-drivers from programming the memory cell in response to a predetermined data value.

12. The memory device of claim 10 further comprising a status flag circuit indicative of the outcome of data read or program operations, said status flag circuit being coupled to said controller.

13. The memory device of claim 12 wherein said status flag circuit is enabled by said status latch and disabled in response to a predetermined data value or disabled in response to said disable signal generated by said controller.

14. A memory device comprising:
    a first memory array including a plurality of memory cells arranged in columns;
    a plurality of first y-drivers, each first y-driver coupled to a corresponding one of a plurality of said columns of memory cells to read contents of memory cells in said column and including a first circuit for testing a level of stored data in the memory cells;

a redundant memory array including a plurality of redundant memory cells arranged in columns;

a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and a controller to generate a selection signal to enable said redundant y-drivers and to generate a disable signal to disable said first y-drivers in response to a failure of said testing of said level by said first circuit of said corresponding first y-driver, wherein the first circuit includes a comparator having a first input coupled to a reference line for receiving a reference level, having a second input coupled to a data bit line for detecting stored data level, the comparator autozeroing any offset of said comparator before comparison of the reference level and the stored data level.

15. The memory device of claim 1 further comprising a storage circuit for storing addresses of memory cells failing said testing of voltage level of stored data, and wherein said controller generates said selection and disable signals in response to a match between one of the said stored addresses and an applied address signal.

16. The memory device of claim 15 wherein the storage circuit includes a fuse circuit.

17. The memory device of claim 15 further comprising an address sequencer to address the storage circuit to read stored addresses of failing memory cells.

18. The memory device of claim 17 further comprising an address sequencer to read all storage locations of the storage circuit for stored addresses of said failing memory cells.

19. The memory device of claim 15 further comprising an address sequencer to read the locations of the storage circuit having stored addresses of said failing memory cells.

20. The memory device of claim 1 further comprising:

an address sequencer coupled to the controller, the plurality of first y-drivers, and the plurality of redundant y-drivers for generating address signals to address said first y-drivers or redundant y-drivers.

21. A memory device comprising:

a first memory array including a plurality of memory cells arranged in columns;

a plurality of first y-drivers, each first y-driver coupled to a corresponding one of a plurality of said columns of memory cells to read contents of memory cells in said column and including a first circuit for testing a level of stored data in the memory cells;

a redundant memory array including a plurality of redundant memory cells arranged in columns;

a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and a controller to generate a selection signal to enable said redundant y-drivers and to generate a disable signal to disable said first y-drivers in response to a failure of said testing of said level by said first circuit of said corresponding first y-driver, a storage circuit for storing addresses of memory cells failing said testing of voltage level of stored data, and wherein said controller generates said selection and disable signals in response to a match between one of the said stored addresses and an applied address signal; and an address sequencer to address the storage circuit to read stored addresses of failing memory cells, wherein the address sequencer further generates address signals for said defective columns and does not generate address signals for other ones of said columns.

22. A memory device comprising:

a first memory array including a plurality of memory cells arranged in columns;

a plurality of first y-drivers, each first y-driver coupled to a corresponding one of a plurality of said columns of memory cells to read contents of memory cells in said column and including a first circuit for testing a level of stored data in the memory cells;

a redundant memory array including a plurality of redundant memory cells arranged in columns;

a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and a controller to generate a selection signal to enable said redundant y-drivers and to generate a disable signal to disable said first y-drivers in response to a failure of said testing of said level by said first circuit of said corresponding first y-driver, a storage circuit for storing addresses of memory cells failing said testing of voltage level of stored data, and wherein said controller generates said selection and disable signals in response to a match between one of the said stored addresses and an applied address signal; and an address sequencer to address the storage circuit to read stored addresses of failing memory cells, wherein the address sequencer generates said address signals in a predetermined timing relationship with the generation of the selection signal and the disable signal.

23. The memory device of claim 22 wherein the predetermined timing relationship is a real time relationship.

24. A memory device comprising:

a first memory array including a plurality of memory cells arranged in columns;

a plurality of first y-drivers, each first y-driver coupled to a corresponding one of a plurality of said columns of memory cells to read contents of memory cells in said column and including a first circuit for testing a level of stored data in the memory cells;

a redundant memory array including a plurality of redundant memory cells arranged in columns;

a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and a controller to generate a selection signal to enable said redundant y-drivers and to generate a disable signal to disable said first y-drivers in response to a failure of said testing of said level by said first circuit of said corresponding first y-driver, a storage circuit for storing addresses of memory cells failing said testing of voltage level of stored data, and wherein said controller generates said selection and disable signals in response to a match between one of the said stored addresses and an applied address signal; and an address sequencer to address the storage circuit to read stored addresses of failing memory cells, wherein the address sequencer generates the address and the first y-drivers and the redundant y-drivers decode in the address in a time less than the reading of the memory cells.

25. A memory device comprising:
a first memory array including a plurality of memory cells arranged in columns;
a plurality of first y-drivers, each first y-driver coupled to a corresponding one of a plurality of said columns of memory cells to read contents of memory cells in said column and including a first circuit for testing a level of stored data in the memory cells;
a redundant memory array including a plurality of redundant memory cells arranged in columns;
a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and
a controller to generate a selection signal to enable said redundant y-drivers and to generate a disable signal to disable said first y-drivers in response to a failure of said testing of said level by said first circuit of said corresponding first y-driver,
a storage circuit for storing addresses of memory cells failing said testing of voltage level of stored data, and wherein said controller generates said selection and disable signals in response to a match between one of the said stored addresses and an applied address signal; and
an address sequencer to address the storage circuit to read stored addresses of failing memory cells,
wherein the address sequencer generates addresses associated with an address of each column of redundant memory cells.

26. A memory device comprising:
a first memory array including a plurality of memory cells arranged in columns;
a plurality of first y-drivers, each first y-driver coupled to a corresponding one of a plurality of said columns of memory cells to read contents of memory cells in said column and including a first circuit for testing a level of stored data in the memory cells;
a redundant memory array including a plurality of redundant memory cells arranged in columns;
a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and
a controller to generate a selection signal to enable said redundant y-drivers and to generate a disable signal to disable said first y-drivers in response to a failure of said testing of said level by said first circuit of said corresponding first y-driver,
a storage circuit for storing addresses of memory cells failing sub testing of voltage levels of stored data, and wherein said controller generates said selection disable signals in response to a match between one of the said stored addresses and an applied address signals; and an address sequence to address storage circuit to read stored addresses of failing memory cells, wherein the address sequencer generates addresses associated with an address for each column of redundant memory cells that is enabled and does not generate an address for said columns of redundant memory cells that are not enabled.

27. The memory device of claim 1 wherein the plurality of redundant y-drivers are substantially the same as the first y-drivers and are controlled by an enable signal.

28. A memory device comprising:
a first memory array including a plurality of memory cells arranged in columns;
a plurality of first y-drivers, each first y-driver coupled to a corresponding one of a plurality of said columns of memory cells to read contents of memory cells in said column and including a first circuit for testing a level of stored data in the memory cells;
a redundant memory array including a plurality of redundant memory cells arranged in columns;
a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and
a controller to generate a selection signal to enable said redundant y-drivers and to generate a disable signal to disable said first y-drivers in response to a failure of said testing of said level by said first circuit of said corresponding first y-driver,
wherein the plurality of redundant y-drivers are substantially the same as the first y-drivers and are controlled by an enable signal,
wherein the enable signal is responsive to said controller.

29. A memory device comprising:
a first memory array including a plurality of memory cells arranged in columns;
a plurality of first y-drivers, each first y-driver coupled to a corresponding one of a plurality of said columns of memory cells to read contents of memory cells in said column and including a first circuit for testing a level of stored data in the memory cells;
a redundant memory array including a plurality of redundant memory cells arranged in columns;
a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and
a controller to generate a selection signal to enable said redundant y-drivers and to generate a disable signal to disable said first y-drivers in response to a failure of said testing of said level by said first circuit of said corresponding first y-driver,
wherein the plurality of memory cells of said first memory array and said redundant memory array are further arranged in a plurality of pages, each column of said plurality of columns being associated with a corresponding page.

30. A memory device comprising:
a first memory array including a plurality of memory cells arranged in columns;
a plurality of first y-drivers, each first y-driver coupled to a corresponding one of a plurality of said columns of memory cells to read contents of memory cells in said column and including a first circuit for testing a level of stored data in the memory cells;

a redundant memory array including a plurality of redundant memory cells arranged in columns;

a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and a controller to generate a selection signal to enable said redundant y-drivers and to generate a disable signal to disable said first y-drivers in response to a failure of said testing of said level by said first circuit of said corresponding first y-driver, wherein said selection and disable signals from said controller are operable upon a group of said redundant and first y-drivers respectively, said group addressed by the smallest address operable by said memory device.

31. A memory device comprising:

a first memory array including a plurality of memory cells arranged in columns;

a plurality of first y-drivers, each first y-driver coupled to a corresponding one of a plurality of said columns of memory cells to read contents of memory cells in said column and including a first circuit for testing a level of stored data in the memory cells;

a redundant memory array including a plurality of redundant memory cells arranged in columns;

a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and a controller to generate a selection signal to enable said redundant y-drivers and to generate a disable signal to disable said first y-drivers in response to a failure of said testing of said level by said first circuit of said corresponding first y-driver, wherein the first memory array is arranged in segments of memory cells, and the controller generates a selection signal for said redundant memory array and generates a disable signal to disable a segment corresponding to a memory cell failing said testing.

32. A memory device comprising:

a first memory array including a plurality of memory cells arranged in columns;

a plurality of first y-drivers, each first y-driver coupled to a corresponding one of a plurality of said columns of memory cells to read contents of memory cells in said column and including a first circuit for testing a level of stored data in the memory cells;

a redundant memory array including a plurality of redundant memory cells arranged in columns;

a plurality of redundant y-drivers, each redundant y-driver coupled to a corresponding one of a plurality of said columns of redundant memory cells to read contents of redundant memory cells in said column and including a second circuit to test a level of stored data in the redundant memory cells;

a controller to generate a selection signal to enable said redundant y-drivers and to generate a disable signal to disable said first y-drivers in response to a failure of said testing of said level by said first circuit of said corresponding first y-driver, and a storage circuit for storing addresses of memory cells failing said testing of voltage level of stored data, and wherein said controller generates said selection and disable signals in response to a match between one of the said stored addresses and an applied address signal, wherein the storage circuit comprises a plurality of fuse sets associated with the redundant memory cells, a number of said fuse set is less than the number of columns of redundant memory cells.

33. A memory device comprising:

a first memory array including a plurality of memory cells arranged in columns;

a plurality of first y-drivers, each first y-driver coupled to a corresponding one of a plurality of said columns of memory cells to read contents of memory cells in said column and including a first circuit for testing a level of stored data in the memory cells;

a redundant memory array including a plurality of redundant memory cells arranged in columns;

a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and a controller to generate a selection signal to enable said redundant y-drivers and to generate a disable signal to disable said first y-drivers in response to a failure of said testing of said level by said first circuit of said corresponding first y-driver;

a plurality of fuse sets storing addresses of some memory cells and wherein said fuse set comprises first and second fuse elements, and a latch coupled to the first and second fuse elements for storing the contents of the first and second fuse elements, the first and second fuse elements and the latch being arranged as a differential amplifier.

34. The memory device of claim 33 wherein the memory cells comprise flash transistors, the columns of memory cells arranged in rows and columns, so that a predetermined number of memory cells form a fuse element, and the memory device further comprises at least one dummy row and at least one dummy column of memory cells.

35. The memory device of claim 34 wherein the two cells of each fuse element are disposed on a top portion and a bottom portion, respectively.

36. The memory device of claim 35 wherein one of said at least one dummy rows is disposed on said top portion, another one of said at least one dummy rows is disposed on said bottom portion, one of said at least one dummy column is disposed on a first side portion, and another one of said at least one dummy column is disposed on a second side portion opposite said first side portion.

37. The memory device of claim 36 wherein others of the dummy rows comprise floating connections.

38. The memory device of claim 35 wherein the column coupled to the bit line does not contact said memory cells except where the memory cells in said column coupled to the bit line are coupled to one of said plurality of fuse sets.

39. The memory device of claim 33 further wherein said fuse set couples to said controller, said controller being responsive to data stored in said fuse set.

40. The memory device of claim 34 wherein the predetermined number of memory cells forming said fuse element is two.

41. The memory device of claim 34 wherein the predetermined number of memory cells forming said fuse element is greater than two.

42. The memory device of claim 34 wherein the predetermined number of memory cells forming said fuse element is three, four or five.

43. A memory device comprising:
a first memory array including a plurality of memory cells arranged in columns;
a plurality of first y-drivers, each first y-driver coupled to a corresponding one of a plurality of said columns of memory cells to read contents of memory cells in said column and including a first circuit for testing a level of stored data in the memory cells;
a redundant memory array including a plurality of redundant memory cells arranged in columns;
a plurality of redundant y-drivers, each redundant y-driver coupled to a corresponding one of a plurality of said colunms of redundant memory cells to read contents of redundant memory cells in said column and including a second circuit to test a level of stored data in the redundant memory cells; and
a controller to generate a selection signal to enable said redundant y-drivers and to generate a disable signal to disable said first y-drivers in response to a failure of said testing of said level by said first circuit of said corresponding first y-driver; and
a second memory array including a plurality of second memory cells arranged in columns and for storing an extension and further including an extension y-driver coupled to a corresponding one of a plurality of said columns of second memory cells to read contents of second memory cells in said columns, and including a third circuit for testing a level of stored data in the second memory cells,
wherein said controller generates said selection signal to enable use of said redundant memory arrays and to generate a second disable signal to disable a portion of the second memory array of said data.

44. A memory device comprising:
a first memory array including a plurality of memory cells arranged in columns;
a plurality of first y-drivers, each first y-driver coupled to a corresponding one of a plurality of said columns of memory cells to read contents of memory cells in said column and including a first circuit for testing a level of stored data in the memory cells;
a redundant memory array including a plurality of redundant memory cells arranged in columns;
a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and
a controller to generate a selection signal to enable said redundant y-drivers and to generate a disable signal to disable said first y-drivers in response to a failure of said testing of said level by said first circuit of said corresponding first y-driver,
wherein data output is multiplexed at the output of the first y-drivers and the redundant y-drivers.

45. A memory device comprising:
a first memory array including a plurality of memory cells arranged in columns;
a plurality of first y-drivers, each first y-driver coupled to a corresponding one of a plurality of said columns of memory cells to read contents of memory cells in said column and including a first circuit for testing a level of stored data in the memory cells;
a redundant memory array including a plurality of redundant memory cells arranged in columns;
a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and
a controller to generate a selection signal to enable said redundant y-drivers and to generate a disable signal to disable said first y-drivers in response to a failure of said testing of said level by said first circuit of said corresponding first y-driver,
wherein output data is multiplexed at an input/output buffer.

46. A memory device comprising:
a first memory array including a plurality of memory cells arranged in columns;
a plurality of first y-drivers, each first y-driver coupled to a corresponding one of a plurality of said columns of memory cells to read contents of memory cells in said column and including a first circuit for testing a level of stored data in the memory cells;
a redundant memory array including a plurality of redundant memory cells arranged in columns;
a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and
a controller to generate a selection signal to enable said redundant y-drivers and to generate a disable signal to disable said first y-drivers in response to a failure of said testing of said level by said first circuit of said corresponding first y-driver,
wherein the first and redundant y-drivers comprise an inhibit circuit coupled to a bit line connecting a corresponding one of said plurality of columns of said memory cells to provide an inhibit voltage on said bit line.

47. The memory device of claim 46 wherein the inhibit circuit is a PMOS device.

48. The memory device of claim 46 wherein the inhibit circuit to provide said inhibit voltage on said bit line in response to the first circuit detecting a failure of the level of stored data in the memory cells.

49. The memory device of claim 46 wherein the voltage inhibit circuit provides said inhibit voltage on said bit line in response to a predetermined data value.

50. A memory device comprising:
a first memory array including a plurality of memory cells arranged in columns;
a plurality of first y-drivers, each first y-driver coupled to a corresponding one of a plurality of said columns of memory cells to read contents of memory cells in said column and including a first circuit for testing a level of stored data in the memory cells;
a redundant memory array including a plurality of redundant memory cells arranged in columns;
a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and a controller to generate a selection signal to enable said redundant y-drivers and to generate a disable signal to disable said first y-drivers in response to a failure of said testing of said level by said first circuit of said corresponding first y-driver, wherein the plurality of memory cells in the first memory array are further arranged in a plurality of pages, each page comprising groups of said columns, the controller generating said disable signal to prevent programming of a portion of one page of said first memory array in response to a predetermined data signal and enable another portion of said page to allow programming of said another portion.

51. A memory device comprising:

a first memory array including a plurality of memory cells arranged in columns;

a plurality of first y-drivers, each first y-driver coupled to a corresponding one of a plurality of said columns of memory cells to read contents of memory cells in said column and including a first circuit for testing a level of stored data in the memory cells;

a redundant memory array including a plurality of redundant memory cells arranged in columns;

a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and a controller to generate a selection signal to enable said redundant y-drivers and to generate a disable signal to disable said first y-drivers in response to a failure of said testing of said level by said first circuit of said corresponding first y-driver; and a monitoring circuit coupled to a bit line coupling a column of memory cells.

52. A memory device comprising:

a first memory array including a plurality of memory cells arranged in columns;

a plurality of first y-drivers, each first y-driver coupled to a corresponding one of a plurality of said columns of memory cells to read contents of memory cells in said column and including a first circuit for testing a level of stored data in the memory cells;

a redundant memory array including a plurality of redundant memory cells arranged in columns;

a plurality of redundant y-drivers, each redundant y-driver coupled to a corresponding one of a plurality of said columns of redundant memory cells to read contents of redundant memory cells in said column and including a second circuit to test a level of stored data in the redundant memory cells; and a controller to generate a selection signal to enable said redundant y-drivers and to generate a disable signal to disable said first y-drivers in response to a failure of said testing of said level by said first circuit of said corresponding first y-driver, wherein the memory device and cells are capable of storing N bits of multilevel data per memory cell.

53. The memory device of claim 52 wherein the controller generates the selection signal to enable selected redundant memory cells of one of said columns of said redundant memory array and generates the disable signal to disable corresponding memory cells of one of said columns of said first memory array in response to the failure of said testing of said voltage level, N being an optional number of bits capable of being stored per memory cell when there is no failure of said testing.

* * * * *